(12) United States Patent
Rudyk et al.

(10) Patent No.: US 11,493,482 B2
(45) Date of Patent: Nov. 8, 2022

(54) SYSTEMS AND METHODS FOR ACOUSTIC EMISSION MONITORING OF SEMICONDUCTOR DEVICES

(71) Applicant: AUGURY SYSTEMS LTD., Haifa (IL)

(72) Inventors: Eduard Rudyk, Haifa (IL); Ori Negri, Haifa (IL); Gal Shaul, Haifa (IL); Saar Yoskovitz, New Jersey, IL (US)

(73) Assignee: AUGURY SYSTEMS LTD., Haifa (IL)

(*) Notice: Subject to any disclaimer, the term of this patent is extended or adjusted under 35 U.S.C. 154(b) by 537 days.

(21) Appl. No.: 16/337,712

(22) PCT Filed: Oct. 3, 2017

(86) PCT No.: PCT/IL2017/051123
§ 371 (c)(1),
(2) Date: Mar. 28, 2019

(87) PCT Pub. No.: WO2018/069922
PCT Pub. Date: Apr. 19, 2018

(65) Prior Publication Data
US 2020/0033297 A1    Jan. 30, 2020

Related U.S. Application Data

(60) Provisional application No. 62/406,138, filed on Oct. 10, 2016.

(51) Int. Cl.
*G01N 29/14* (2006.01)
*G01H 1/00* (2006.01)
*G01N 29/44* (2006.01)

(52) U.S. Cl.
CPC ............ *G01N 29/14* (2013.01); *G01H 1/00* (2013.01); *G01N 29/4427* (2013.01); *G01N 29/4436* (2013.01); *G01N 2291/2697* (2013.01)

(58) Field of Classification Search
CPC ............ G01N 29/14; G01N 29/4427; G01N 29/4436; G01N 29/4409; G01N 2291/2697; G01H 3/00–14
See application file for complete search history.

(56) References Cited

U.S. PATENT DOCUMENTS

| 5,336,062 A | 8/1994 | Richter |
|---|---|---|
| 6,685,638 B1 | 2/2004 | Taylor et al. |

(Continued)

FOREIGN PATENT DOCUMENTS

| JP | S55-117255 | 9/1980 |
|---|---|---|
| WO | 2018/069922 | 4/2018 |

OTHER PUBLICATIONS

European Search Report dated Aug. 20, 2019, which issued during the prosecution of Applicant's European App No. 17860999.6.

(Continued)

*Primary Examiner* — Nathaniel J Kolb

(57) ABSTRACT

A system for monitoring and identifying states of a semiconductor device, the system including at least one acoustic sensor for sensing acoustic emission emitted by at least one semiconductor device operating at a voltage of less than or equal to 220 V, the at least one acoustic sensor outputting at least one acoustic emission signal and a signal processing unit for receiving the at least one acoustic emission signal from the at least one acoustic sensor and for analyzing the at least one acoustic emission signal, the signal processing unit providing an output based on the analyzing, the output being indicative at least of whether the at least one semiconductor device is in an abnormal operating state with respect to a normal operating state of the semiconductor device.

24 Claims, 47 Drawing Sheets

(56) References Cited

U.S. PATENT DOCUMENTS

| | | | |
|---|---|---|---|
| 2002/0194915 A1* | 12/2002 | Abdel-Malek | G01N 29/14 73/587 |
| 2006/0135094 A1 | 6/2006 | Dor et al. | |
| 2006/0229837 A1* | 10/2006 | Dwyer | G01H 1/003 702/108 |
| 2010/0049343 A1 | 2/2010 | Jaiswal et al. | |
| 2010/0300683 A1 | 12/2010 | Looper et al. | |
| 2014/0208850 A1* | 7/2014 | Kim | H01L 21/67288 73/587 |
| 2014/0260624 A1 | 9/2014 | Subrahmanyam et al. | |
| 2014/0283068 A1 | 9/2014 | Call et al. | |
| 2014/0324739 A1* | 10/2014 | Claussen | G06K 9/6284 706/12 |
| 2016/0256978 A1 | 9/2016 | Tang et al. | |
| 2017/0293862 A1* | 10/2017 | Kamiya | G01N 29/4481 |
| 2018/0188309 A1* | 7/2018 | Degrenne | G01N 29/14 |

OTHER PUBLICATIONS

An International Search Report and a Written Opinion both dated Apr. 4, 2018, which issued during the prosecution of Applicant's PCT/IL2017/051123.

An International Preliminary Report on Patentability dated Apr. 16, 2019, which issued during the prosecution of Applicant's PCT/IL2017/051123.

U.S. Appl. No. 62/406,138, filed Oct. 10, 2016.

An Invitation to pay additional fees dated Jan. 17, 2018, which issued during the prosecution of Applicant's PCT/IL2017/051123.

Blake, Carl, and Chris Bull. "IGBTs or MOSFETs: Which Is Better for Your Design?." Electronic design 47.20 (1999).

Kärkkäinen, Tommi J., et al. "Acoustic emission caused by the failure of a power transistor." 2015 IEEE Applied Power Electronics Conference and Exposition (APEC). IEEE, 2015.

* cited by examiner

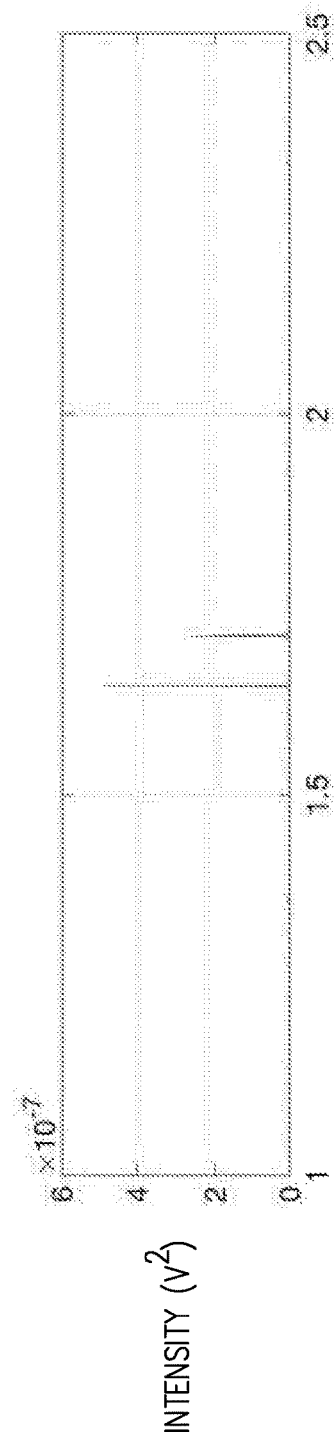
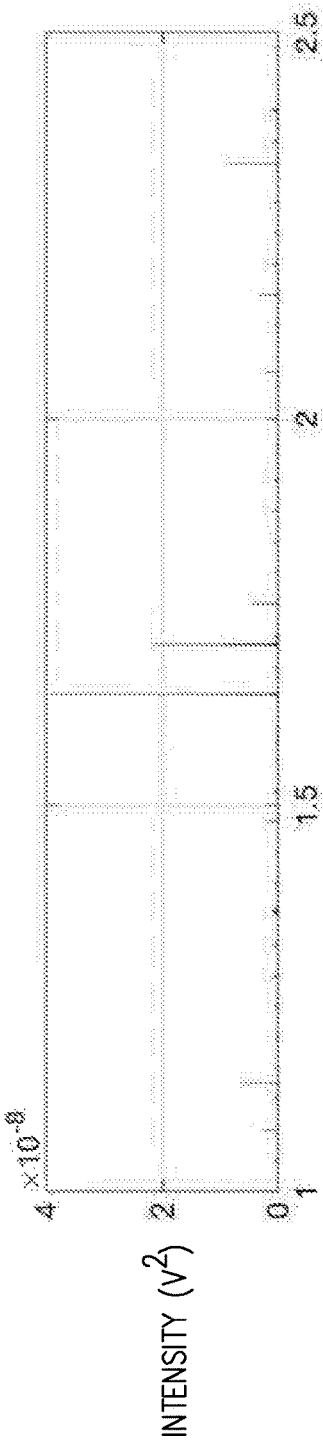
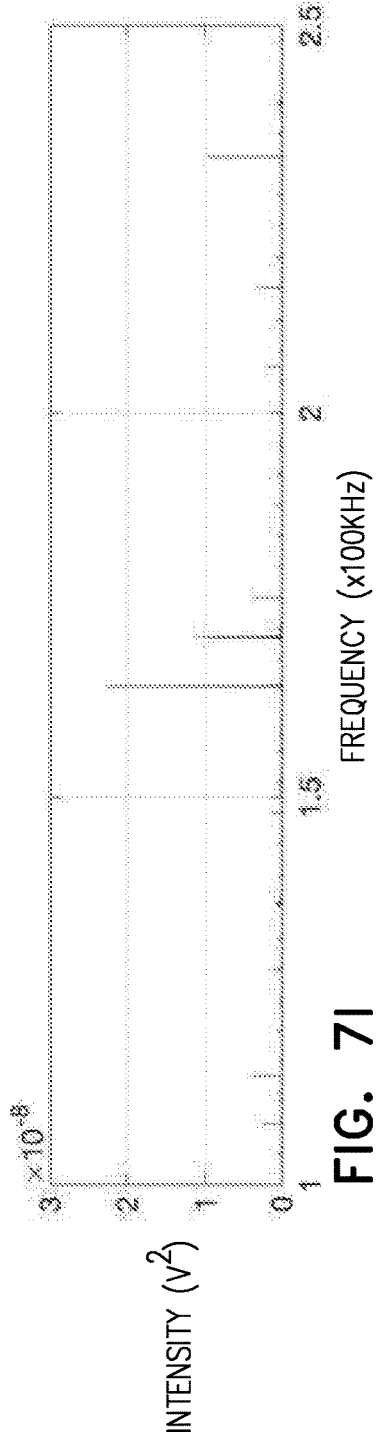
FIG. 7G
FIG. 7H
FIG. 7I

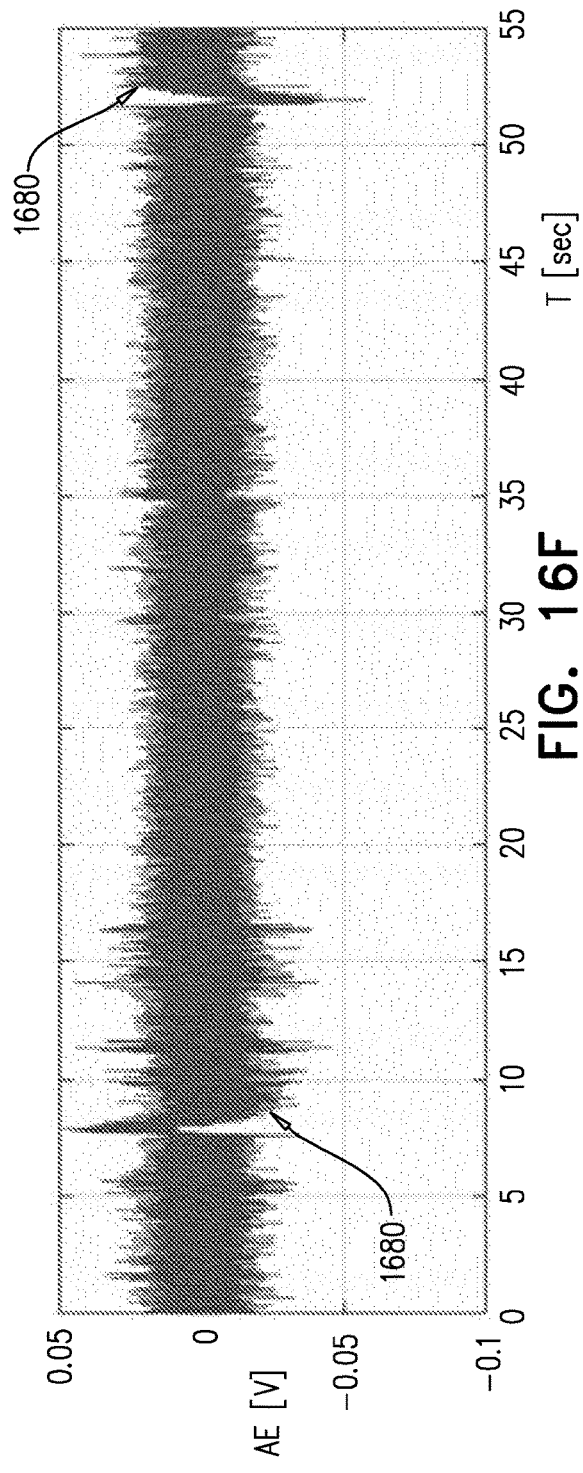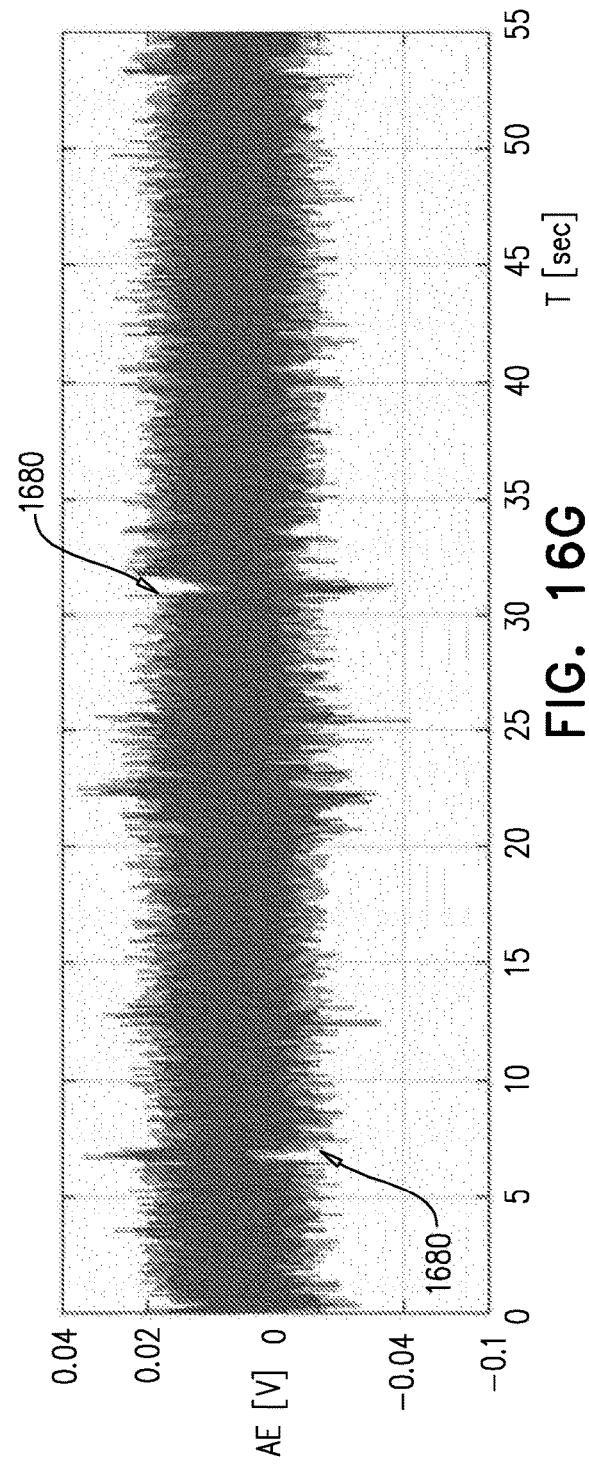

SYSTEMS AND METHODS FOR ACOUSTIC EMISSION MONITORING OF SEMICONDUCTOR DEVICES

REFERENCE TO RELATED APPLICATIONS

Reference is hereby made to U.S. Provisional Patent Application 62/406,138 entitled SYSTEMS AND METHODS FOR ACOUSTIC EMISSION MONITORING OF LOW-POWER ELECTRONIC DEVICES AND DETECTION OF POTENTIAL MALFUNCTION BASED THEREON, filed Oct. 10, 2016, the disclosure of which is hereby incorporated by reference and priority of which is hereby claimed pursuant to 37 CFR 1.78(a)(4) and (5)(i).

FIELD OF THE INVENTION

The present invention relates generally to acoustic emission monitoring and more particularly to semiconductor device state classification based thereon.

BACKGROUND OF THE INVENTION

Various types of acoustic emission monitoring systems are known in the art.

SUMMARY OF THE INVENTION

The present invention seeks to provide novel systems and methods relating to the monitoring of acoustic emission generated by semiconductor devices and to the classification of operational states of semiconductor devices based on such monitoring.

There is thus provided in accordance with a preferred embodiment of the present invention a system for monitoring and identifying states of a semiconductor device, the system including at least one acoustic sensor for sensing acoustic emission emitted by at least one semiconductor device operating at a voltage of less than or equal to 220 V, the at least one acoustic sensor outputting at least one acoustic emission signal and a signal processing unit for receiving the at least one acoustic emission signal from the at least one acoustic sensor and for analyzing the at least one acoustic emission signal, the signal processing unit providing an output based on the analyzing, the output being indicative at least of whether the at least one semiconductor device is in an abnormal operating state with respect to a normal operating state of the semiconductor device.

In accordance with a preferred embodiment of the present invention, the normal operating state includes a healthy state and the abnormal operating state includes a defective state.

In accordance with another preferred embodiment of the present invention, the normal operating state includes a legitimate state and the abnormal operating state includes an illegitimate state due to malicious interference in at least one of the at least one semiconductor device and at least one additional device cooperating therewith.

Preferably, the analyzing at least includes comparing the acoustic emission signal to at least one predetermined acoustic emission signal.

Preferably, the analyzing at least includes comparing the acoustic emission signal to at least one predetermined acoustic emission threshold.

Preferably, the at least one predetermined acoustic emission signal includes at least one historical acoustic emission signal corresponding to at least one historical operating state of the semiconductor device.

Additionally or alternatively, the at least one predetermined acoustic emission signal includes a collection of historical acoustic emission signals from a plurality of electronic devices having at least one shared electrical characteristic with the semiconductor device, the collection of historical acoustic emission signals corresponding to a collection of historical operating states of the plurality of electronic devices.

Preferably, the comparing includes statistical analysis of correlations between features of the acoustic emission signal and features of the at least one predetermined acoustic emission signal.

Preferably, the analyzing includes machine learning functionality.

Preferably, the machine learning functionality is operative at least to extract features from a training set of historical acoustic emission signals from at least one additional electronic device having at least one shared electrical characteristic with the semiconductor device, the features extracted from the training set being associated with corresponding operational states of the at least one additional electronic device, and to identify the operating state of the semiconductor device based on correlations between the features extracted from the training set and features of the acoustic emission signal.

Preferably, the training set of historical acoustic emission signals does not include historical acoustic emission signals from the semiconductor device.

Preferably, the system also includes at least one additional sensor measuring at least one additional parameter associated with the at least one semiconductor device. the analyzing including comparing the at least one additional parameter to the acoustic emission signal.

Preferably, the at least one additional sensor includes an antenna and the at least one additional parameter includes electromagnetic radiation.

Preferably, the system also includes an alert module, the alert module being operative to provide the output to a user in at least near real time.

Preferably, the system also includes a control unit communicatively coupled to the signal processing unit, the control unit providing automatic feedback control to the at least one semiconductor device, based on the output.

Preferably, the control unit includes functionality for scheduling at least one repair related operation on the semiconductor device based on the output to the user.

Preferably, the least one semiconductor device includes a field effect transistor.

Preferably, the least one semiconductor device operates at a power of less than or equal to 1 kW.

Preferably, the at least one semiconductor device operates with a current of less than or equal to 1 A.

Preferably, the at least one semiconductor device includes an integrated circuit.

There is also provided in accordance with another preferred embodiment of the present invention a method for monitoring and identifying states of a semiconductor device, the method including sensing acoustic emission emitted by at least one semiconductor device operating at a voltage of less than or equal to 220 V, analyzing the acoustic emission and providing an output based on the analyzing, the output being indicative at least of whether the at least one semiconductor device is in an abnormal operating state with respect to a normal operating state of the semiconductor device.

In accordance with a preferred embodiment of the present invention, the normal operating state includes a healthy state and the abnormal operating state includes a defective state.

In accordance with another preferred embodiment of the present invention, the normal operating state includes a legitimate state and the abnormal operating state includes an illegitimate state due to malicious interference in at least one of the at least one semiconductor device and at least one additional device cooperating therewith.

Preferably, the analyzing at least includes comparing the acoustic emission to at least one predetermined acoustic emission signal.

Preferably, the analyzing at least includes comparing the acoustic emission to at least one predetermined acoustic emission threshold.

Preferably, the at least one predetermined acoustic emission signal includes at least one historical acoustic emission signal corresponding to at least one historical operating state of the semiconductor device.

Preferably, the at least one predetermined acoustic emission signal includes a collection of historical acoustic emission signals from a plurality of electronic devices having at least one shared electrical characteristic with the semiconductor device, the collection of historical acoustic emission signals corresponding to a collection of historical operating states of the plurality of electronic devices.

Preferably, the comparing includes statistical analysis of correlations between features of the acoustic emission and features of the at least one predetermined acoustic emission signal.

Preferably, the analyzing includes machine learning functionality.

Preferably, the machine learning functionality is operative at least to extract features from a training set of historical acoustic emission signals from at least one additional electronic device having at least one shared electrical characteristic with the semiconductor device, the features extracted from the training set being associated with corresponding operational states of the at least one additional electronic device, and to identify the operating state based on correlations between the extracted features and features of the acoustic emission.

Preferably, the training set of historical acoustic emission signals does not include historical acoustic emission signals from the semiconductor device.

Preferably, the method also includes measuring at least one additional parameter associated with the at least one semiconductor device, the analyzing including comparing measurements of the at least one additional parameter to the acoustic emission.

Preferably, the at least one additional parameter includes electromagnetic radiation.

Preferably, the method also includes providing the output to a user in at least near real time.

Preferably, the method also includes providing automatic feedback control to the at least one semiconductor device, based on the output.

Preferably, the method also includes scheduling at least one repair related operation on the semiconductor device based on the output to the user.

Preferably, the at least one semiconductor device includes a field effect transistor.

Preferably, the at least one semiconductor device operates at a power of less than or equal to 1 kW.

Preferably, the at least one semiconductor device operates with a current of less than or equal to 1 A.

Preferably, the at least one semiconductor device includes an integrated circuit.

There is additionally provided in accordance with another preferred embodiment of the present invention a system for monitoring and identifying states of a semiconductor device including at least one acoustic sensor for directly sensing acoustic emission from at least one semiconductor device operating at a voltage of less than or equal to 220 V, the acoustic emission being generated by the at least one semiconductor device, the at least one acoustic sensor outputting at least one acoustic emission signal and a signal processing unit for receiving the at least one acoustic emission signal from the at least one acoustic sensor and for analyzing the at least one acoustic emission signal, the signal processing unit providing an output based on the analyzing, the output being indicative at least of an operational state of the at least one semiconductor device.

In accordance with a preferred embodiment of the present invention, the operational state includes at least one of a healthy state and a defective state.

In accordance with another preferred embodiment of the present invention, the operational state includes at least one of a legitimate state and an illegitimate state due to malicious interference in at least one of the at least one semiconductor device and at least one additional device cooperating therewith.

Preferably, the analyzing at least includes comparing the acoustic emission signal to at least one predetermined acoustic emission signal.

Preferably, the analyzing at least includes comparing the acoustic emission signal to at least one predetermined acoustic emission threshold.

Preferably, the at least one predetermined acoustic emission signal includes at least one historical acoustic emission signal corresponding to at least one historical operating state of the semiconductor device.

Preferably, the at least one predetermined acoustic emission signal includes a collection of historical acoustic emission signals from a plurality of electronic devices having at least one shared electrical characteristic with the semiconductor device, the collection of historical acoustic emission signals corresponding to a collection of historical operating states of the plurality of electronic devices.

Preferably, the comparing includes statistical analysis of correlations between features of the acoustic emission signal and features of the at least one predetermined acoustic emission signal.

Preferably, the analyzing includes machine learning functionality.

Preferably, the machine learning functionality is operative at least to extract features from a training set of historical acoustic emission signals from at least one additional electronic device having at least one shared electrical characteristic with the semiconductor device, the features extracted from the training set being associated with corresponding operational states of the at least one additional electronic device, and to identify the operating state of the semiconductor device based on correlations between the extracted features and features of the acoustic emission signal.

Preferably, the training set of historical acoustic emission signals does not include historical acoustic emission signals from the semiconductor device.

Preferably, the system also includes at least one additional sensor measuring at least one additional parameter associated with the at least one semiconductor device, the analyzing including comparing the at least one additional parameter to the acoustic emission signal.

Preferably, the at least one additional sensor includes an antenna and the at least one additional parameter includes electromagnetic radiation.

Preferably, the system also includes an alert module, the alert module being operative to provide the output to a user in at least near real time.

Preferably, the system also includes a control unit communicatively coupled to the signal processing unit, the control unit providing automatic feedback control to the at least one semiconductor device, based on the output.

Preferably, the control unit includes functionality for scheduling at least one repair related operation on the semiconductor device based on the output to the user.

Preferably, the at least one semiconductor device includes a field effect. transistor.

Preferably, the at least one semiconductor device operates at a power of less than or equal to 1 kW.

Preferably, the at least one semiconductor device operates with a current of less than or equal to 1 A.

Preferably, the at least one semiconductor device includes an integrated circuit.

There is further provided in accordance with yet another preferred embodiment of the present invention a method for monitoring and identifying states of a semiconductor device including directly sensing acoustic emission generated by at least one semiconductor device operating at a voltage of less than or equal to 220 V, analyzing the acoustic emission and providing an output based on the analyzing, the output being indicative at least of an operational state of the at least one semiconductor device.

In accordance with a preferred embodiment of the present invention, the operational state includes at least one of a healthy state and a defective state.

In accordance with another preferred embodiment of the present invention, the operational state includes at least one of a legitimate state and an illegitimate state due to malicious interference in at least one of the at least one semiconductor device and at least one additional device cooperating therewith.

Preferably, the analyzing at least includes comparing the acoustic emission to at least one predetermined acoustic emission signal.

Preferably, the analyzing at least includes comparing the acoustic emission to at least one predetermined acoustic emission threshold.

Preferably, the at least one predetermined acoustic emission signal includes at least one historical acoustic emission signal corresponding to at least one historical operating state of the semiconductor device.

Preferably, the at least one predetermined acoustic emission signal includes a collection of historical acoustic emission signals from a plurality of electronic devices having at least one shared electrical characteristic with the semiconductor device, the collection of historical acoustic emission signals corresponding to a collection of historical operating states of the plurality of electronic devices.

Preferably, the comparing includes statistical analysis of correlations between features of the acoustic emission and features of the at least one predetermined acoustic emission signal.

Preferably, the analyzing includes machine learning functionality.

Preferably, the machine learning functionality is operative at least to extract features from a training set of historical acoustic emission signals from at least one additional electronic device having at least one shared electrical characteristic with the semiconductor device, the features extracted from the training set being associated with corresponding operational states of the at least one additional electronic device, and to identify the operational state of the semiconductor device based on correlations between the extracted features and features of the acoustic emission.

Preferably, the training set of historical acoustic emission signals does not include historical acoustic emission signals from the semiconductor device.

Preferably, the method also includes measuring at least one additional parameter associated with the at least one semiconductor device, the analyzing including comparing measurements of the at least one additional parameter to the acoustic emission.

Preferably, the at least one additional parameter includes electromagnetic radiation.

Preferably, the method also includes providing the output to a user in at east near real time.

Preferably, the method also includes providing automatic feedback control to the at least one semiconductor device, based on the output.

Preferably, the method also includes scheduling at least one repair related operation on the semiconductor device based on the output to the user.

Preferably, the at least one semiconductor device includes a field effect transistor.

Preferably, the at least one semiconductor device operates at a power of less than or equal to 1 kW.

Preferably, the at least one semiconductor device operates with a current of less than or equal to 1 A.

Preferably, the at least one semiconductor device includes an integrated circuit.

There is yet further provided in accordance with a still further preferred embodiment of the present invention a system for monitoring and identifying defects in a semiconductor device including at least one acoustic sensor for sensing acoustic emission emitted by at least one semiconductor device operating at a voltage of less than or equal to 220 V, the at least one acoustic sensor outputting at least one acoustic emission signal and a signal processing unit for receiving the at least one acoustic emission signal from the at least one acoustic sensor and for analyzing the at least one acoustic emission signal, the analyzing taking into account a baseline acoustic emission signal corresponding to normal operation of the at least one semiconductor device, the signal processing unit providing an output based on the analyzing, the output being indicative of at least one defect in the at least one semiconductor device when the at least one acoustic emission signal deviates from the baseline acoustic emission signal.

In accordance with a preferred embodiment of the present invention, the analyzing at least includes comparing the acoustic emission signal to the baseline acoustic emission signal.

In accordance with another preferred embodiment of the present invention, the analyzing at least includes comparing the acoustic emission signal to at least one baseline acoustic emission signal threshold.

Preferably, the baseline acoustic emission signal includes at least one historical acoustic emission signal corresponding to at least one historical operating state of the semiconductor device.

Preferably, the baseline acoustic emission signal includes a collection of historical acoustic emission signals from a plurality of electronic devices having at least one shared electrical characteristic with the semiconductor device, the collection of historical acoustic emission signals corresponding to a collection of historical operating states of the plurality of electronic devices.

Preferably, the comparing includes statistical analysis of correlations between features of the acoustic emission signal and features of the baseline acoustic emission signal.

Preferably, the analyzing includes machine learning functionality.

Preferably, the machine learning functionality is operative at least to extract features from a training set of historical acoustic emission signals from at least one additional electronic device having at least one shared electrical characteristic with the semiconductor device, the features extracted from the training set being associated with corresponding operational states of the at least one additional electronic device, and to identify the at least one defect based on deviation of features of the acoustic emission signal from the extracted features.

Preferably, the training set of historical acoustic emission signals does not include historical acoustic emission signals from the semiconductor device.

Preferably, the system also includes at least one additional sensor measuring at least one additional parameter associated with the at least one semiconductor device, the analyzing including comparing the at least one additional parameter to the acoustic emission signal.

Preferably, the at least one additional sensor includes an antenna and the at least one additional parameter includes electromagnetic radiation.

Preferably, the system also includes an alert module, the alert module being operative to provide the output to a user in at least near real time.

Preferably, the system also includes a control unit communicatively coupled to the signal processing unit, the control unit providing automatic feedback control to the at least one semiconductor device, based on the output.

Preferably, the control unit includes functionality for scheduling at least one repair related operation on the semiconductor device based on the output to the user.

Preferably, the at least one semiconductor device includes a field effect transistor.

Preferably, the at least one semiconductor device operates at a power of less than or equal to 1 kW.

Preferably, the at least one semiconductor device operates with a current of less than or equal to 1 A.

Preferably, the at least one semiconductor device includes an integrated circuit.

Preferably, the analyzing further includes comparing patterns of change over time of the acoustic emission signal to patterns of change over time of historical acoustic emission signals associated with failure of the semiconductor device, the output including a prediction of impending failure of the semiconductor device based on similarities between the patterns of change over time of the acoustic emission signal and the patterns of change over time of the historical acoustic emission signals.

There is also provided in accordance with yet another preferred embodiment of the present invention a method for monitoring and identifying defects in a semiconductor device including sensing acoustic emission emitted by at least one semiconductor device operating at a voltage of less than or equal to 220 V, analyzing the acoustic emission, the analyzing taking into account a baseline acoustic emission signal corresponding to normal operation of the at least one semiconductor device and providing an output based on the analyzing, the output being indicative of at least one defect in the at least one semiconductor device when acoustic emission deviates from the baseline acoustic emission signal.

Preferably, the analyzing at least includes comparing the acoustic emission the baseline acoustic emission signal.

Preferably, the analyzing at least includes comparing the acoustic emission to at least one baseline acoustic emission signal threshold.

Preferably, the baseline acoustic emission signal includes at least one historical acoustic emission signal corresponding to at least one historical operating state of the semiconductor device.

Preferably, the baseline acoustic emission signal includes a collection of historical acoustic emission signals from a plurality of electronic devices having at least one shared electrical characteristic with the semiconductor device, the collection of historical acoustic emission signals corresponding to a collection of historical operating states of the plurality of electronic devices.

Preferably, the comparing includes statistical analysis of correlations between features of the acoustic emission and features of the baseline acoustic emission signal.

Preferably, the analyzing includes machine learning functionality.

Preferably, the machine learning functionality is operative at least to extract features from a training set of historical acoustic emission signals from at least one additional electronic device having at least one shared electrical characteristic with the semiconductor device, the features extracted from the training set being associated with corresponding operational states of the at least one additional electronic device, and to identify the at least one defect based on deviation of features of the acoustic emission from the extracted features.

Preferably, the training set of historical acoustic emission signals does not include historical acoustic emission signals from the semiconductor device.

Preferably, the method also includes measuring at least one additional parameter associated with the at least one semiconductor device, the analyzing including comparing the at least one additional parameter to the acoustic emission.

Preferably, the at least one additional parameter includes electromagnetic radiation.

Preferably, the method also includes providing the output to a user in at east near real time.

Preferably, the method also includes providing automatic feedback control to the at least one semiconductor device, based on the output.

Preferably, the method also includes scheduling at least one repair related operation on the semiconductor device based on the output to the user.

Preferably, the at least one semiconductor device includes a field effect transistor.

Preferably, the at least one semiconductor device operates at a power of less than or equal to 1 kW.

Preferably, the at least one semiconductor device operates with a current of less than or equal to 1 A.

Preferably, the at least one semiconductor device includes an integrated circuit.

Preferably, analyzing further includes comparing patterns of change over time of the at least one acoustic emission signal to patterns of change over time of historical acoustic emission signals associated with failure of the semiconductor device, the output including a prediction of impending failure of the semiconductor device based on similarities between the patterns of change over time of the acoustic emission signal and the patterns of change over time of the historical acoustic emission signals.

There is also provided in accordance with another preferred embodiment of the present invention a system for identifying anomalous operating states of a semiconductor device due to external intervention including at least one acoustic sensor sensing acoustic emission emitted by at least one semiconductor device operating at a voltage of less than or equal to 220 V, the at least one acoustic sensor outputting at least one acoustic emission signal and a signal processing unit for receiving the at least one acoustic emission signal from the at least one acoustic sensor and for analyzing the at least one acoustic emission signal, the signal processing unit identifying at least one operating state of the at least one semiconductor device based on the analyzing and comparing the at least one identified operating state to historical operating states of at least one reference semiconductor device having at least one shared electrical characteristic with the at least one semiconductor device, the signal processing unit providing an output based on the comparing, the output being indicative at least of whether the identified operating state is anomalous with respect to the historical operating states.

Preferably, the historical operating states include historical operating states of the at least semiconductor device.

Alternatively, the historical operating states do not include historical operating states of the at least one semiconductor device.

Preferably, the comparing includes statistical analysis.

Preferably, the analyzing includes machine learning functionality.

Preferably, the system also includes at least one additional sensor measuring at least one additional parameter associated with the at least one semiconductor device, the analyzing including comparing the at least one additional parameter to the acoustic emission signal.

Preferably, the at least one additional sensor includes an antenna and the at least one additional parameter includes electromagnetic radiation.

Preferably, the system also includes an alert module, the alert module being operative to provide the output to a user in at least near real time.

Preferably, the system also includes a control unit communicatively coupled to the signal processing unit, the control unit providing automatic feedback control to the at least one semiconductor device, based on the output.

Preferably, the control unit includes functionality for scheduling at least one repair related operation on at least one of the semiconductor device and the at least one device cooperating therewith, based on the output to the user.

Preferably, the at least one semiconductor device includes a field effect transistor.

Preferably, the at least one semiconductor device operates at a power of less than or equal to 1 kW.

Preferably, the at least one semiconductor device operates with a current of less than or equal to 1 A.

Preferably, the at least one semiconductor device includes an integrated circuit.

There is further provide in accordance with an additional preferred embodiment of the present invention a method for identifying anomalous operating states of a semiconductor device due to external intervention including sensing acoustic emission emitted by at least one semiconductor device operating at a voltage of less than or equal to 220 V, analyzing the acoustic emission, identifying at least one operating state of the at least one semiconductor device based on the analyzing, comparing the at least one operating state to historical operating states of at least one reference semiconductor device having at least one shared electrical characteristic with the at least one semiconductor device and providing an output based on the comparing, the output being indicative at least of whether the operating state identified is anomalous with respect to the historical operating states.

Preferably, the historical operating states include historical operating states of the at least one semiconductor device.

Alternatively, the historical operating states do not include historical operating states of the at least one semiconductor device.

Preferably, the comparing includes statistical analysis.

Preferably, the analyzing includes machine learning functionality.

Preferably, the method also includes sensing at least one additional parameter associated with the at least one semiconductor device, the analyzing including comparing the at least one additional parameter to the acoustic emission.

Preferably, the at least one additional parameter includes electromagnetic radiation.

Preferably, the method also includes providing the output to a user in at least near real time.

Preferably, the method also includes providing automatic feedback control to the at least one semiconductor device, based on the output.

Preferably, the method also includes scheduling at least one repair related operation on at least one of the semiconductor device and the at least one device cooperating therewith, based on the output to the user.

Preferably, the at least one semiconductor device includes a field effect transistor.

Preferably, the at least one semiconductor device operates at a power of less than or equal to 1 kW.

Preferably, the at least one semiconductor device operates with a current of less than or equal to 1 A.

Preferably, the at least one semiconductor device includes an integrated circuit.

BRIEF DESCRIPTION OF THE DRAWINGS

The present invention will be understood and appreciated more fully based on the following detailed description taken in conjunction with the drawings in which:

FIGS. 7A-7I are graphs respectively displaying time and frequency domain acoustic emission signals arising from a central processing unit on a printed circuit board, as measured by one physically and one non-physically contacting acoustic emission sensor in a system of the type illustrated in FIG. 5;

FIGS. 16F-16P are graphs displaying various features of acoustic emission spectra arising from a bare flash memory during read and write operations, as measured by one physically contacting and one non-physically contacting acoustic emission sensor in a system of the type illustrated in FIG. 15.

DETAILED DESCRIPTION OF PREFERRED EMBODIMENTS

Figure 1:
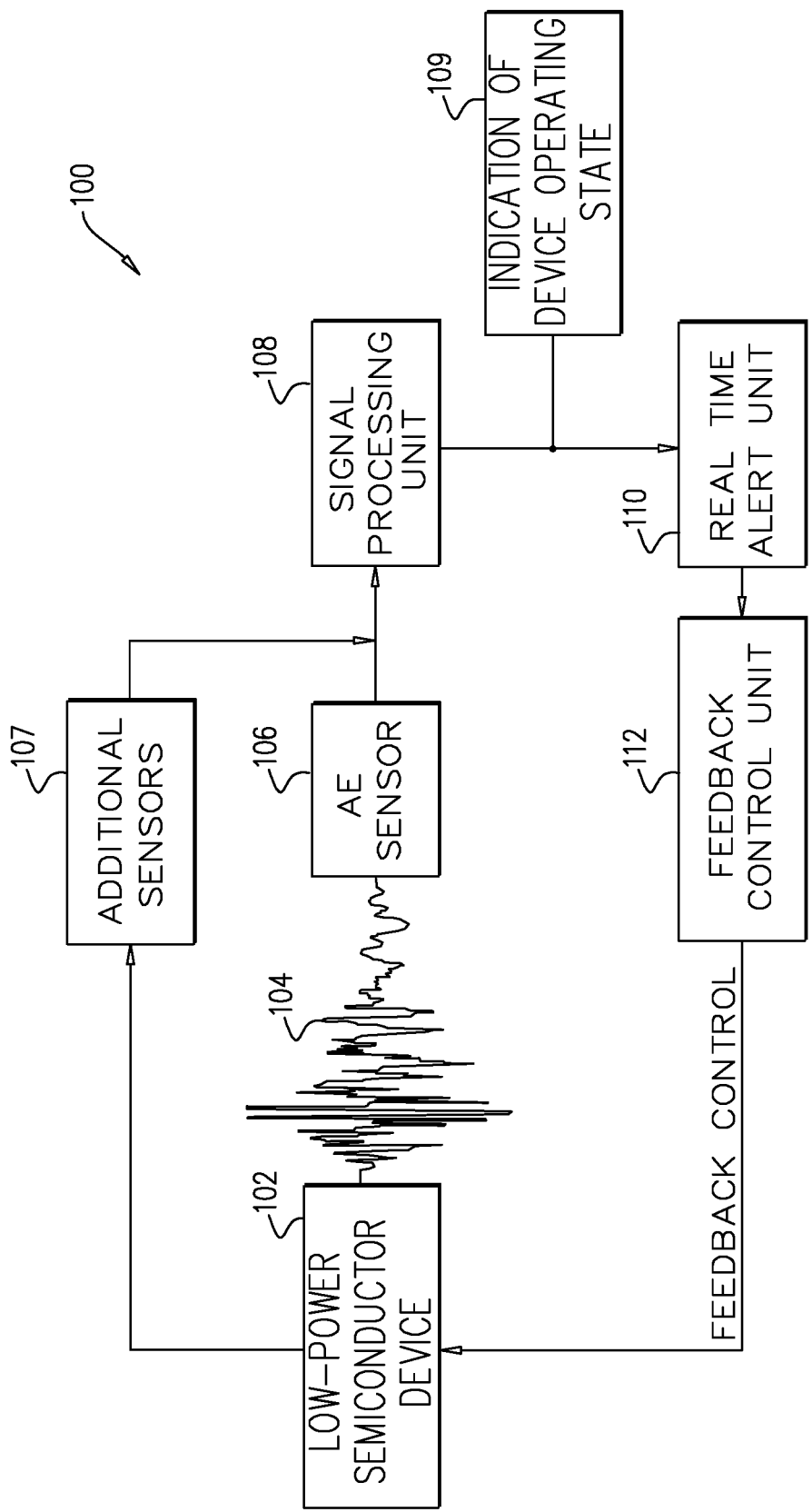
FIG. 1 is a simplified block-diagram illustration showing components of an acoustic emission monitoring system constructed and operative in accordance with a preferred embodiment of the present invention.

Reference is now made to FIG. 1 which is a simplified block-diagram illustration showing components of an acoustic emission monitoring system constructed and operative in accordance with a preferred embodiment of the present invention.

As seen in FIG. 1, there is provided an acoustic emission monitoring system 100 for measurement of acoustic emission signals emitted by semiconductor devices and for the identification of operational states of the monitored semiconductor devices, including identification of possible defects in the semiconductor device, based thereon.

Acoustic monitoring system 100 is preferably operative to monitor the acoustic emissions generated and emitted by at least one semiconductor device, here embodied, by way of example, as a single semiconductor device 102. It is appreciated, however, that the depiction of a single semiconductor device in FIG. 1 is for simplicity of representation only and that system 100 may be adapted to monitor multiple semiconductor devices. Semiconductor device 102 may be one or more semiconductor component typically but not necessarily mounted on a printed circuit board (PCB), including transistors, microprocessors, central control units, memory devices, field effect transistors and other semiconductor components as are well known in the art. Semiconductor device 102 may alternatively be any electronic component comprising an integrated circuit (IC), which IC may be mounted on a PCB or may be a bare chip.

Semiconductor device 102 preferably operates at a voltage of less than or equal to 220 V and a power of less than or equal to 1 kW. Semiconductor device 102 may operate at a current in the range of 1 mA-1 A. It is appreciated that semiconductor device 102 is thus preferably a relatively low power device. In some embodiments of the present invention, semiconductor device may be a microelectronic device. Semiconductor device 102 may also function in cooperation with, for example as controllers of, higher power electronics.

The use of a system such as acoustic monitoring system 100 to monitor semiconductor devices is based on the phenomenon of the generation of measurable acoustic emission signals 104 by such devices. These acoustic emission signals 104 have been found to arise from the semiconductor device itself, such that the semiconductor device is the source of the acoustic emission and the acoustic emission is originally created thereby.

In contrast to conventional acoustic monitoring systems, typically measuring acoustic emissions arising from mechanical faults in mechanical systems or acoustic emissions due to electrical breakdown of and/or electrical discharge by power electronics, the present invention utilizes the measurable acoustic emission signals found to be generated by relatively low-power semiconductor devices.

The creation of acoustic emission signals by the relatively low-power semiconductor devices in accordance with the present invention is believed by the present inventors to be due to electrical current causing charge-lattice interactions as a result of scattering of charges or due to electromagnetic forces, leading to atomic motion and hence the generation of measurable acoustic emission. For example, in the case of a floating gate MOSFET transistor, the tunneling of electrons into the floating gate is accompanied by charge-lattice interactions, which charge-lattice interactions are believed to be a source of acoustic emission.

These measurable acoustic emission signals have been found by the present inventors to be characterized by various characteristics in the time and/or frequency domain, depending on the operating state of the device.

Furthermore, the present inventors have found the acoustic emission signals to be influenced by electrical, thermal and/or mechanical stresses, including electrical failure, to which the semiconductor device may be subject. As a result, changes in the acoustic emission signals of the semiconductor device may be used to identify the presence of influential thermal, mechanical and or electrical stresses, which stresses may cause defects in the monitored device.

The measured acoustic emission signals thus may be used to identify a state of the monitored device, such as on or off, identify internal device processes, such as read or write operation in a flash memory or the working mode of a micro-CPU, and to predict and/or diagnose malfunctions and deterioration of the device, as is further detailed henceforth. Such diagnosis may be valuable for monitoring and defect detection in expensive and/or mission critical electronic equipment and/or computational semiconductor devices.

Additionally, changes in the acoustic emission signals generated by an semiconductor device may be used to identify possible security breaches in control of the device, due for example to hacking or other malicious activities directed against the device via computerized controls thereof.

The acoustic emission 104 emitted by semiconductor device 102 is preferably sensed by at least one acoustic measurement module, here embodied, by way of example, as an acoustic emission sensor 106. Acoustic emission sensor 106 preferably directly senses emission from device 102, which emission is generated by device 102 itself. Acoustic emission sensor 106 may be any type of acoustic emission sensor suitable for measuring acoustic emission, types of which are well known in the art and various examples of which are provided henceforth. Particularly, acoustic emission sensor 106 may be one or more physically contacting or non-contacting sensor. The use of multiple acoustic emission sensors may be advantageous by enabling cross-correlation between the measured signals to allow cancelling out of environmental noise. In one possible embodiment of the present invention, acoustic emission sensor 106 may be incorporated within semiconductor device 102, for example, as a component installed on the PCB of device 102.

At least one acoustic emission sensor 106 is preferably operative to sense acoustic emission emitted by at least one semiconductor device 102 and to output at least one acoustic emission signal corresponding thereto. Acoustic emission sensor 106 is preferably operative to sense acoustic emissions over at least one acoustic frequency range, which frequency range may comprise ultrasonic and/or sonic frequencies from several Hz to the GHz range.

System 100 may optionally also include at least one additional sensor 107 for sensing at least one other parameter associated with semiconductor device 102, in addition to the sensing of acoustic emission by acoustic emission sensor 106. By way of example, additional sensor 107 may sense one or more of electromagnetic emission, temperature, magnetic field strength and direction of device 102.

System 100 further preferably includes a signal processing unit 108 for receiving the at least one acoustic emission signal output by acoustic emission sensor 106 and analyzing the measured acoustic emission. Signal processing unit 108 preferably provides an output 109 based on results of the analyzing performed thereby, which output is indicative at least of an operational state of device 102.

Particularly preferably, signal processing unit provides an output indicative at least of whether at least one semiconductor device 102 is in an abnormal operating state with respect to a normal operating state of the semiconductor device 102. A normal operating state may correspond to a healthy operating state of semiconductor device 102 and an abnormal operating state may correspond to a defective state of semiconductor device 102. A normal operating state may additionally or alternatively correspond to a legitimate state of semiconductor device 102 and an abnormal operating state may correspond to an illegitimate state of semiconductor device 102, due to malicious interference in the controls of the semiconductor device 102 or in the controls of an additional device cooperating with semiconductor device 102. Further by way of example, the output 109 may be indicative of device 102 being in a properly functioning state or in a state of potential or impending malfunction. Additionally or alternatively, the output may be indicative of device 102 being powered or non-powered, active or idle, as is further detailed henceforth.

Detection of an abnormal operating state of the device may have a variety of practical applications, including, by way of example only, prediction of failure of the device based on the device defect, detection of performance degradation of the device, detection of security breaches in the control of the device or detection of errors in computer code controlling the device.

In accordance with one preferred embodiment of the present invention, the analyzing performed by signal processing unit 108 may include comparing the measured acoustic emission signal to at least one predetermined acoustic emission signal. Such comparing may be carried out in the time and/or frequency domain. Upon detection of deviation of the measured acoustic emission signal from the predetermined acoustic emission signal, signal processing unit 108 may provide an output indicative of such deviation.

The predetermined acoustic emission signal and corresponding deviation therefrom may be one or more of an experimentally determined threshold signal associated with a given device, exceedance of which is indicative of a defect or of potential malfunction of the device; a historical emission signal or set of signals associated with a given device, deviation from which by a given statistical measure is indicative of a defect or potential malfunction of the device; and a collection of historical emission signals or set of signals from corresponding although not necessarily identical electronic devices, which electronic devices may be semiconductor devices, deviation from which by a given statistical measure is indicative of a defect or potential malfunction of the device. Such corresponding devices may share at least one common electrical feature with monitored device 102.

Additionally or alternatively, signal processing unit 108 may include machine learning functionality. Machine learning functionality may be particularly useful in identifying when semiconductor device 102 or additional devices cooperating with semiconductor device 102 are affected by hacking or other malicious activities. In the case that semiconductor device 102 or additional devices cooperating with semiconductor device 102 is subject to a malicious attack, the acoustic emission may deviate with respect to baseline acoustic emission patterns established during regular non-interfered operation of semiconductor device 102 or of other similar corresponding semiconductor devices sharing at least one electrical characteristic with semiconductor device 102. Machine learning algorithms as described henceforth may be used to detect such deviations and identify security breaches based thereon.

Machine learning functionality included in signal processing unit 108 may be operative. by way of example, to perform machine learning on features of historical training data, the features being associated with corresponding operational states of devices from which the historical training data was obtained, and hence to classify an operating state of semiconductor device 102 based on correlations between features of the historical data and features of the measured acoustic emission signal of semiconductor device 102. The machine learning functionality of signal processing unit 108 may include any type of machine learning-based data mapping, processing and classification, including, by way of example only, statistic classifiers and self-learning neural networks. Further details concerning the various possible modes of operation of signal processing unit 108 are provided with reference to FIG. 2.

Irrespective of the particular type of signal processing implemented by signal processing unit 108, analysis of the measured acoustic emission may be used to classify an operating state of semiconductor device 102. Particularly, analyzed features of the measured acoustic emission may be indicative of the electronic device being subject to stresses and/or failures, including electrical, thermal, and mechanical stresses, and hence be useful in diagnosis of defects and prognosis of impending malfunction of the device.

In the case that additional sensors 107 are included in system 100, signal processing unit 108 preferably receives an output from additional sensors 107, which output is indicative of those parameters sensed by sensors 107. Signal processing unit 108 may compare the output from additional sensors 107 to the measured acoustic emission signal provided by acoustic emission sensor 106, in order to derive possible correlations therebetween.

The output 109 of signal processing unit 108 may be received by an alert unit 110, for alerting a user in at least near real time of the operating state of semiconductor device 102. By way of example, alert unit 110 may provide a human sensible output alarm indication including at least a prediction of failure or time to failure of device 102 where relevant.

Furthermore, alert unit 110 may be communicatively coupled to a feedback control unit 112, operative to provide automatic feedback control to semiconductor device 102, based on the nature of the operating state identified, including the potential malfunction or defect detected. By way of example, upon identification of potential malfunction, feedback control unit 112 may modify or switch off the power supply to device 102. Additionally or alternatively, feedback control unit 112 may incorporate functionality for scheduling at least one repair or maintenance related operation on the device 102 based on the human sensible output alarm indication provided by alert unit 110.

It is appreciated that whereas acoustic emission sensor 106 and additional optional sensors 107 are preferably included in a dedicated device package located. proximal to device 102 being monitored, this is not necessarily the case for other components of system 100. By way of example, one or more of signal processing unit 108, alert unit 110 and feedback control unit 112 may be included in a device package or may be part of a cloud service.

Furthermore, it is appreciated that the functionalities of signal processing unit 108, alert unit 110 and feedback control unit 112 may be merged or redistributed according to particular system requirements. For example, signal processing unit 108 may include the functionality of alert unit 110, alert unit 110 may include the functionality of feedback control unit 112 or acoustic emission sensor 106 may be combined with additional sensor modules 107. it is further appreciated that the inclusion of feedback control unit 112 in system 100 is optional only, and that feedback control unit 112 may be obviated, for example in the case of a user of device 102 making manual rather than using automatic adjustments thereto upon receiving an alert from alert unit 110.

Figure 2:
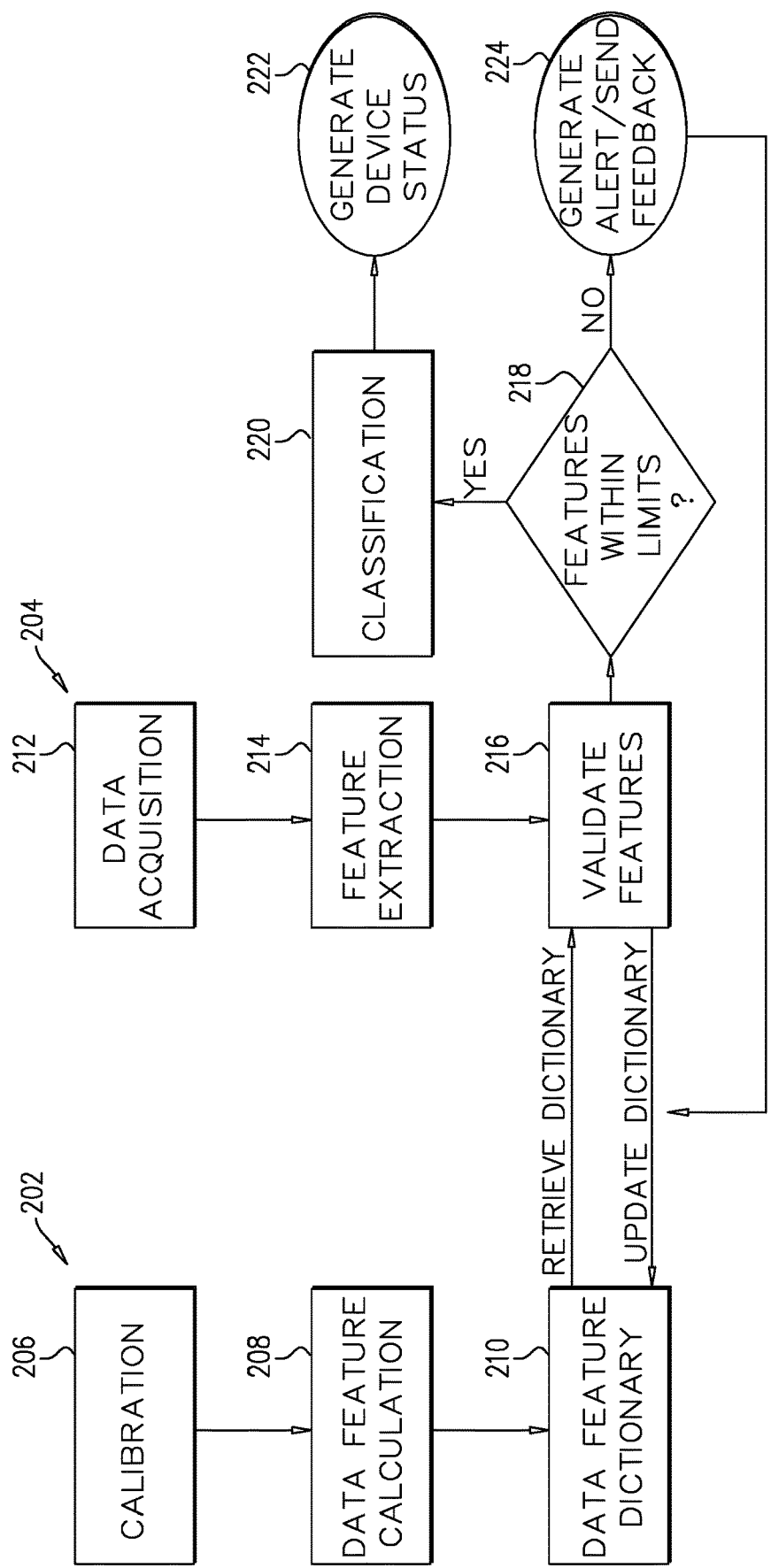
FIG. 2 is a simplified flow chart illustrating signal processing functionality of a system of the type shown in FIG. 1.

Reference is now made to FIG. 2, which is a simplified flow chart illustrating signal acquisition and processing functionality of a system of the type shown in FIG. 1. Particularly preferably, FIG. 2 illustrates signal processing functionality of a signal processing unit of system 100, such as signal processing unit 108.

As seen in FIG. 2, the signal processing functionality includes steps for calibration of a given semiconductor device under test (DUT), as illustrated in a first calibration column 202, as well as steps for actual measurement of the DUT, as illustrated in a second measurement column 204.

Turning now to first calibration column 202, the DUT is preferably calibrated at a first calibration step 206. First calibration step 206 preferably involves the measurement of acoustic emission and calibration thereof in a variety of operational states of the DUT, including, by way of example, one or more of a non-powered state, an idle state, an active state, an electrically stressed state, a mechanically stressed state and a heated or cooled state. Such calibration may be used to establish a baseline acoustic emission signal, corresponding to normal operation of the DUT, which normal operation may be healthy rather than faulty operation or legitimate rather than illegitimate operation.

First calibration step 206 may involve the measurement and calibration of acoustic emissions from the DUT itself, or from a population of similar electronic devices resembling but not necessarily identical to the DUT, using a crowd-sourcing approach. By way of example, members of a population of electronic devices used for calibration measurements may be selected based on having at least one electrical characteristic in common with the DUT such as, by way of example, semiconductor devices having similar power consumption in similar operational states. The population of electronic devices based on which a given DUT may be calibrated may or may not include the DUT itself.

The calibrated output for the various operational states of the DUT is preferably used to establish emission patterns or features associated with various DUT conditions, as seen at a second calculation step 208. Such emission features may be thresholds based on one or both of time domain and frequency domain spectral features of acoustic emission of the DUT in the various calibrated operational states thereof. Such emission features may additionally or alternatively be machine-learning based data trends or models. These emission features may be used to build up a dictionary of data features, as seen at third compilation step 210.

By way of example, the emission features derived at second calculation step 208 may be discrete acoustic signal thresholds corresponding to respective operational states of the DUT. These discrete thresholds may be unique to the particular DUT or may be standard thresholds found to be applicable to a range of similar semiconductor devices.

Alternatively, the emission features derived at second step 208 may correspond to models of acoustic emission signals statistically correlated to respective operational states of the DUT, which models may be based on historical measurements of the acoustic emission signal over time and between various operating conditions of the DUT.

Additionally or alternatively, the dictionary compiled at third step 210 may comprise or be augmented by data patterns identified based on statistical models of acoustic emission signals gleaned from historical measurements of acoustic emission signals of electronic devices sharing electrical characteristics with the DUT but not necessarily being identical thereto, based on a crowd-sourcing approach. The incorporation of data patterns based on related electronic devices in the emission patterns dictionary at third step 210 allows the compilation of a richer, more widely applicable dictionary having a higher confidence level associated therewith.

It is appreciated that first-third steps 206-210 shown in calibration column 202 are not necessarily carried out by signal processing unit 108. Depending on the particular thresholds applied, first-third steps 206-210 may be carried out by external, additional signal collection and processing modules and the emission pattern dictionary compiled at third step 210 stored at signal processing unit 108 or at a server.

Turning now to second measurement column 204, acoustic emission data generated by the DUT is received at a fourth step 212. By way of example, acoustic emission data may be acquired by acoustic emission sensor 106 and received therefrom by signal processing unit 108.

At a fifth step 214, data features are extracted from the received data. Feature extraction may include extraction of physical features of the acoustic emission, such as total acoustic emission energy, acoustic energy within defined time frames, acoustic energy within defined frequency bins and fluctuations in acoustic energy. Feature extraction may also include extraction of statistical features of the acoustic emission, including statistical moments and correlations and cumulants of acoustic signal, signal entropy and signal noise, as well as extraction of signal integrity features such as signal span and stationarity.

At a sixth step 216 and seventh step 218, features extracted at fifth step 214 are respectively validated by and compared to features of data patterns held in the dictionary built up at third step 210. Particularly, features extracted from the received data may be compared to features of the baseline acoustic emission signal, such that validation of the features takes into account the baseline acoustic emission associated with normal operation of the DUT. Validated features may be fed back to the dictionary, thereby further building up the DUT dictionary. As a result of such feedback, the reference data patterns held in the DUT dictionary may be dynamically changing patterns. Feature validation may include comparing patterns of change over time of the acoustic emission signal sensed from the DUT to patterns of change over time of historical acoustic emission signals associated with past failures of the DUT or of electronic devices similar to the DUT.

Extracted features may be within predefined or machine-learned limits, allowing classification of the state of the DUT, as seen at an eighth step 220, leading to generation of a device status at a ninth step 222. The status may indicate deterioration of the DUT and predict impending failure prior to the occurrence of operational failure. Furthermore, the status may indicate the particular nature of the operational failure likely to occur. Alternatively, extracted features may deviate from the pre-defined or machine-learned baseline signals, indicating anomalous operation of the DUT as seen at a tenth step 224. Identification of malfunction of the DUT may result in the generation of a malfunction alert and/or feedback to the DUT, for example by way of alert unit 110 and feedback control unit 112 respectively.

For example, in the case that patterns of change over time of the acoustic emission signal sensed from the DUT are found to be similar to patterns of change over time of historical acoustic emission signals associated with past failures of the DUT or of electronic devices similar to the DUT, an output may be generated by alert unit 110 comprising a prediction of impending failure of the DUT based on similarities between patterns of change over time of the present measured acoustic emission signal and patterns of change over time of historical acoustic emission signals.

Extracted features found to deviate from the pre-defined or machine-learned limits may also be fed back to the data feature dictionary in order to update the data feature dictionary.

By way of example, in the case that a system such as system 100 is used in detecting anomalous operating states as means of identifying undesirable malicious interference in the operation of a monitored electronic device, the signal processing unit may receive measured acoustic emission signals and extract features therefrom. The signal processing unit may furthermore identify at least one operating state of the semiconductor device 102 based on the extracted features and compare the least one identified operating state to historical operating states of at least one reference electronic device having at least one shared electrical characteristic with the monitored semiconductor device. It is appreciated that the historical operating states may or may not include historical operating states of the monitored semiconductor device itself.

Additionally, the signal processing unit may provide an output based on the comparing, the output being indicative at least of whether the identified operating state is anomalous with respect to the historical operating states. As detailed above, an anomalous operating state may be caused, for example, by security breaches in the operation of the device or errors in code operating the device.

In the case that feature extraction and validation involves machine learning, a possible input of machine learning algorithms is a normalized set of various feature parameters as described above and the desired output may be, for example, predicted time-to-failure of the DUT. Training of such machine learning algorithms is preferably performed by providing historical examples of data relating to failures and faults. During an evaluation stage, each time data is recorded from the acoustic emission sensors relevant parameters are calculated on the data, which parameters may be identified as p1, p2 etc, as indicated in equation (1) below.

$$p = \{p_1, p_2, \ldots, p_N\} \quad (1)$$

These parameters may include, for example, peak amplitude, peak frequency, time waveform and total energy. The data may then be normalized using Z-score transformation relative to a historical baseline, in accordance with equation (2) below.

$$z = \{z_1, z_2, \ldots z_N\} \qquad (2)$$

where $$z_i = (p_i - \mu_i)/\sigma_i$$

and $\mu_i$ is mean of parameter $p_i$ under similar operating conditions in the same or similar device. In a more general multivariate case:

$$z = (p - \mu)^T \Sigma^{-1} (p - \mu)$$

where $\mu$ is a mean of parameter vector p known from historical data, and $\Sigma$ is a covariance matrix calculated from historical data as well. The output of the system is expected time-to-failure ($T_{ttf}$).

During a training stage, various parameters are calculated using historical data as the input to the algorithm and time-to-failure provided as a target output. In this formulation the task is a simple regression:

$$T_{ttf} = f(z, C)$$

where C represents parameters of the learning system calculated from historical data on the same or similar devices. One of the simplest solutions is using linear or logistic regression. In a linear case:

$$T_{ttf} = z \cdot C = \sum z_i C_i$$

It is understood that the forgoing corresponds to one possible implementation of machine learning algorithms useful in the present invention, and that the use of any appropriate machine learning algorithm may be possible.

It is appreciated that the signal processing steps illustrated in FIG. 2 are not necessarily carried out in the order shown and described and that various steps may be interchanged with other steps. Furthermore, it is appreciated that the signal processing steps may include additional steps not described herein, as may be known in the art.

Figure 3:
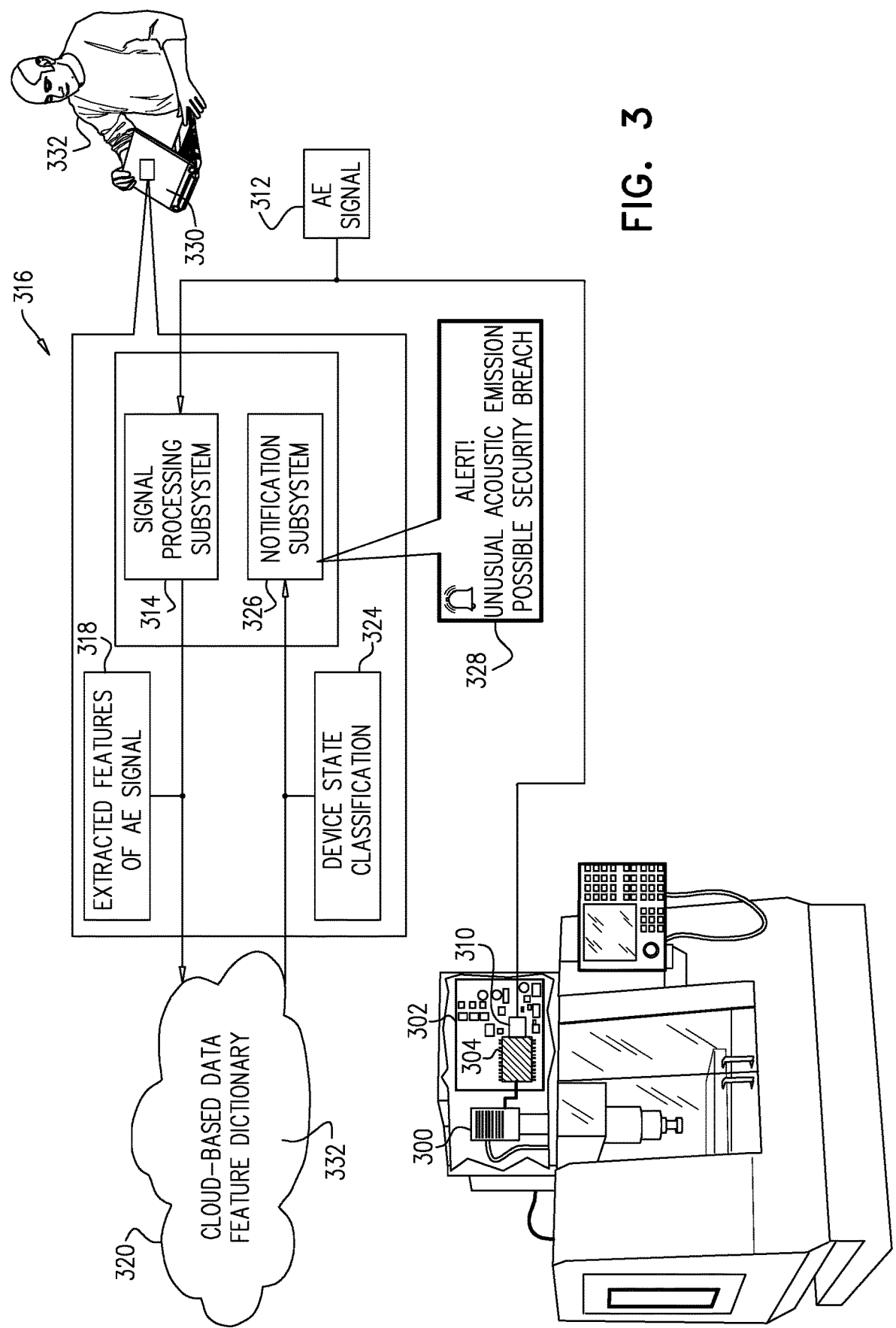
FIG. 3 is a partially pictorial, partially block-diagram illustration of an implementation of a system for monitoring acoustic emission, constructed and operative in accordance with a preferred embodiment of the present invention.

Reference is now made to FIG. 3, which is a partially pictorial, partially block-diagram illustration of an implementation of a system for monitoring acoustic emission, constructed and operative in accordance with a preferred embodiment of the present invention.

As seen in FIG. 3, an electrical motor 300 is controlled by a controller 302. Controller 302 may comprise a PCB having mounted thereon at least one semiconductor device 304 such as, by way of example only, a micro-CPU drawing a current of several mA. Acoustic emission generated by micro-CPU 304 may be monitored by an acoustic emission sensor module 310. Acoustic emission sensing module 310 preferably comprises at least one acoustic emission sensor for sensing acoustic emission generated by micro-CPU 304. Acoustic emission sensing module 310 may be directly mounted on micro-CPU 304, such that the at least one acoustic emission sensor is physically contacting the micro-CPU. Alternatively, acoustic emission sensing module 310 may be spatially separated from the micro-CPU 304, such that the acoustic emission sensor is not in physical contact therewith. It is appreciated that micro-CPU 304 and acoustic emission sensing module 310 correspond to a preferred embodiment of semiconductor device 102 and acoustic emission sensor 106 of FIG. 1.

Acoustic emission signals generated by micro-CPU 304 are preferably but not necessarily continuously sensed by acoustic emission sensing module 310. Acoustic emission sensing module 310 preferably outputs acoustic emission signals 312 corresponding to the acoustic emission spectra generated by micro-CPU 304. Acoustic emission signals 312 are preferably but not necessarily output by acoustic emission sensing module in real time or near real time.

Acoustic emission signals 312 output by acoustic emission sensing module 310 are preferably provided to a signal processing subsystem 314 forming a part of an acoustic emission monitoring system 316. The analyzing performed by signal processing subsystem 314 may include application of an algorithm for extracting features of acoustic emission signals 312, in accordance with the various functionalities described hereinabove with reference to FIG. 2.

A set of signal features 318 extracted by signal processing subsystem 314 may be provided by signal processing subsystem 314 to a server 320, typically on the cloud, for further processing. At the server 320, extracted features 318 may be compared to signal features stored in a cloud-based data feature dictionary 322. Particularly, extracted features 318 may be compared to features held in dictionary 322 and associated with normal operation of micro-CPU 304 in order to detect whether features associated with the present operation of micro-CPU 304 are within predefined or machine-learned limits corresponding to normal operation of micro-CPU 304.

Data feature dictionary 322 may include predefined thresholds or data patterns derived based on past operation of micro-CPU 304. Additionally or alternatively, data feature dictionary 322 may be dynamically compiled based on crowd-sourcing of acoustic emission data patterns from a population of electronic components sharing electronic characteristics with micro-CPU 304.

Based on a comparison of features 318 to features held in data feature dictionary 322, server 320 may output a classification 324 of a state of micro-CPU 304. Classification 324 of the state of micro-CPU 304 is preferably provided to a notification sub-system 326. Notification sub-system 326 preferably forms a part of acoustic emission monitoring system 316.

In the case that features 318 are found to deviate from features included in data feature dictionary 322 by machine-learned or predetermined statistical limits, notification sub-system 326 preferably outputs a human-sensible alert 328 indicating a state of micro-CPU 304. In the exemplary embodiment illustrated in FIG. 3, notification sub-system 326 preferably outputs a human-sensible alert 328 in the form of a message, stating that unusual acoustic emission spectra have been detected from micro-CPU 304. Acoustic emission monitoring system 316 may be executed by a computer 330 used by a user 332 to whom alert 328 is provided.

Such unusual acoustic emission spectra may indicate a possible security breach in the control and/or operation of motor 300 cooperating with and controlled by controller 302, of which controller 302 micro-CPU 304 forms a part. The acoustic emission signature of micro-CPU 304 thus may be used to evaluate whether micro-CPU 304 is operating in accordance with normal operating patterns or abnormal operating patterns, which abnormal operating patterns may be due to malicious interference in the operation of the motor 300 to which the micro-CPU 304 is connected.

Figure 4:
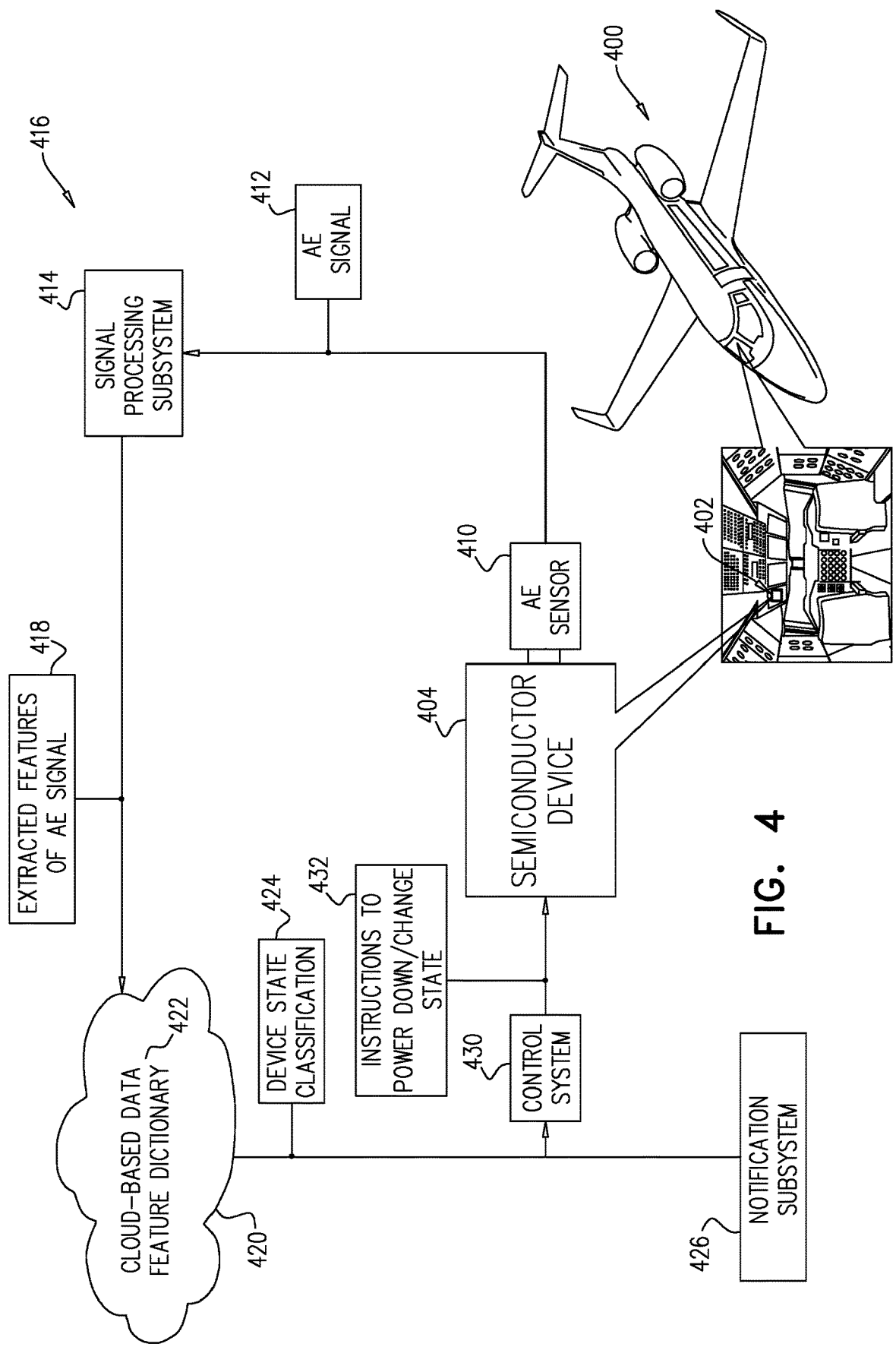
FIG. 4 is a partially pictorial, partially block-diagram illustration of another implementation of a system for monitoring acoustic emission, constructed and operative in accordance with a further preferred embodiment of the present invention.

Reference is now made to FIG. 4, which is a partially pictorial, partially block-diagram illustration of an implementation of a system for monitoring acoustic emission, constructed and operative in accordance with another preferred embodiment of the present invention.

As seen in FIG. 4, an aircraft 400 may include electronic circuitry 402. Electronic circuitry 402 may include a variety of semiconductor components 404, including low-power semiconductor components, integrated circuits and PCBs on which a plurality of semiconductor components are mounted. By way of example, semiconductor components 404 may be one or more of a CPU, microcontroller or memory chip or may be one or more PCBs on which one or more of such semiconductor components are mounted. It is appreciated that electronic circuitry 402 is illustrated herein in a highly simplified form and may include a far greater and more complex arrangement of electronic components and PCBs therefore, as is well known in the art. Semiconductor components 404 may be operative to provide power, control or other functionalities to aircraft 400.

An acoustic emission sensing module 410 is preferably coupled to at least one of semiconductor components 404. Acoustic emission sensing module 410 preferably comprises at least one acoustic emission sensor for sensing acoustic emission generated by at least one semiconductor component 404. Acoustic emission sensing module 410 may be directly mounted on semiconductor component 404, such that the at least one acoustic emission sensor is physically contacting the semiconductor component 404. Additionally or alternatively, acoustic emission sensing module 410 may be spatially separated from the semiconductor component 404, such that the acoustic emission sensor is not in physical contact therewith. It is appreciated that semiconductor component 404 and acoustic emission sensing module 410 correspond to a preferred embodiment of semiconductor device 102 and acoustic emission sensor 106 of FIG. 1.

Acoustic emission generated by semiconductor component 404 are preferably but not necessarily continuously sensed by acoustic emission sensing module 410. Acoustic emission sensing module 410 preferably outputs acoustic emission signals 412 corresponding to the acoustic emission spectra generated by electronic component 404. Acoustic emission signals 412 are preferably but not necessarily output by acoustic emission sensing module 410 in real time or near real time.

Acoustic emission signals 412 output by acoustic emission sensing module 410 are preferably provided to a signal processing subsystem 414 forming a part of an acoustic emission monitoring system 416. Signal processing subsystem 414 may comprise computing functionality for analyzing the acoustic emission signals 412. The analyzing performed by signal processing subsystem 414 may include application of an algorithm for extracting features of acoustic emission signals 412, in accordance with the various functionalities described hereinabove with reference to FIG. 2.

Acoustic emission monitoring system 416 may optionally include other sensors, in addition to acoustic emission sensing module 410, in order to sense other parameters associated with electronic circuitry 402. By way of example, other sensed parameters associated with electronic circuitry 402 may include temperature, electromagnetic radiation, magnetic field strength and humidity. In the case that such parameters are sensed by acoustic emission monitoring system 416, an additional signal output representative of such parameters is preferably provided to signal processing subsystem 414 in addition to acoustic emission signals 412. Signal processing subsystem 414 is preferably operative to extract features of such additional signals.

A set of signal features 418 preferably extracted by signal processing subsystem –may be provided by signal processing subsystem 414 to a server 420, typically on the cloud, for further processing. At the server 420, extracted features 418 may be compared to signal features stored in a cloud-based data feature dictionary 422. Extracted features 418 may be compared to features held in dictionary 422 and associated with regular, healthy operation of semiconductor component 404 in order to detect whether features associated with the present operation of semiconductor component 404 are within predefined or machine-learned limits corresponding to normal operation thereof. Furthermore, extracted features 418 may be compared to features held in dictionary 422 and associated with malfunction or impending failure of semiconductor component 404, in order to detect whether features associated with the present operation of semiconductor component 404 are indicative of incipient failure thereof.

In the case that system 416 includes additional parameter sensors for sensing additional parameters associated with electronic component 404, extracted features of such additional parameter signals may also be analyzed at server 420 in order to ascertain possible correlations between features of the acoustic emission signals 412 and features of the additional signals representing parameters other than acoustic emission.

Data feature dictionary 422 may include predefined thresholds or data patterns derived based on past operation of circuitry 402 and/or electronic component 404. Additionally or alternatively, data feature dictionary 422 may be dynamically compiled based on crowd-sourcing of acoustic emission data patterns from a population of electronic circuits or electronic components sharing at least one electronic characteristic with circuitry 402 and/or semiconductor component 404.

Based on a comparison of features 418 to data feature dictionary 422, server 420 may output a classification 424 of a state of electronic circuitry 402 and/or electronic component 404. Classification 424 is preferably provided to a notification sub-system 426. In the case that features 418 are found to deviate from features included in data feature dictionary 422 by machine-learned or predetermined statistical limits, notification sub-system 426 may output a human-sensible alert indicating such deviation.

Classification 424 may include a classification of the device status as healthy, malfunctioning or of incipient failure of the device. Furthermore, classification 424 may include an indication of a particular fault or nature of a particular impending failure of circuitry 402 and/or semiconductor component 404.

Classification 424 may be provided to a control subsystem 430, which control subsystem 430 is preferably in controlling communication with electronic circuitry 402 and/or semiconductor component 404. Control subsystem 430 is preferably operative to provide a feedback control 432 to electronic circuitry 402 and/or semiconductor component 404 responsive to the content of classification 424. Feedback control 432 is preferably, but not necessarily, automatic.

By way of example, in the case that classification 424 includes an indication of malfunction of semiconductor component 404, feedback control 432 may include control instructions to power down circuitry 402 and/or semiconductor component 404. Alternatively, in the case that classification 424 includes an indication of incipient failure of semiconductor component 404, feedback control 432 may include control instructions to change the operating state of circuitry 402 and/or semiconductor component 404. Such change of state may include, by way of example, putting the semiconductor component into an idle rather than active operating mode or modifying the power supply to the semiconductor component.

It is appreciated that acoustic emission monitoring system 416 thus provides advance identification of malfunction and detection of faults in monitored semiconductor components, thus allowing pre-emptive control changes to the monitored components. Such pre-emptive control changes may mitigate or obviate damage that would arise from the failure of such components, should no such control changes be made, including failure of critical electrical systems and consequent risk to human life.

It is understood that the use of an acoustic emission monitoring system such as system 416 is not limited to the acoustic emission monitoring and control of low power semiconductor circuits and ICs in aircraft, and may be implemented in any other application including low-power electronic components, such as car circuits and military equipment.

The creation and generation of measurable acoustic emission signals by semiconductor devices, classification of the semiconductor device state based on characteristics of the measured acoustic emission signals and detection of potential malfunction of the device due to the influence of electrical, mechanical, and/or thermal stresses on the measured acoustic emission has been experimentally investigated by the inventors of the present invention.

In the following section experimental data, obtained using various implementations of an acoustic monitoring system constructed and operative in accordance with preferred embodiments of the present invention, are presented. The experimental data relates to the monitoring of measurable acoustic emission generated by semiconductor devices on a PCB, the monitoring of measurable acoustic emission generated by a PCB hosting semiconductor devices and the monitoring of measurable acoustic emission generated by a bare IC chip, not mounted on a PCB. The experiments presented hereinbelow were repeated several times on different ones of identical devices.

It is appreciated that one or more of the semiconductor devices and ICs described hereinbelow are possible embodiments of semiconductor device 102 of FIG. 1. Furthermore, it is understood that similar ones of semiconductor devices described hereinbelow may collectively form a population of semiconductor devices providing historical or present acoustic emission measurements for use by signal processing unit 108 in analyzing acoustic emission signals from a semiconductor device. Additionally, it is understood that the experimental set-ups described hereinbelow may be combined with signal processing unit 108, real time alert unit 110 and feedback control unit 112 in order to allow identification and classification of operating states of the devices.

Experimental Results

1. Experimental Data Relating to Measurable Acoustic Emission Generated by Electronic Components on a PCB Reference is now made to FIG. 5, which is a simplified block-diagram illustration showing an acoustic emission monitoring system, constructed and operative in accordance with a preferred embodiment of the present invention and used by the present inventors for measuring acoustic emission generated by one or more semiconductor components on a PCB.

Figure 5:
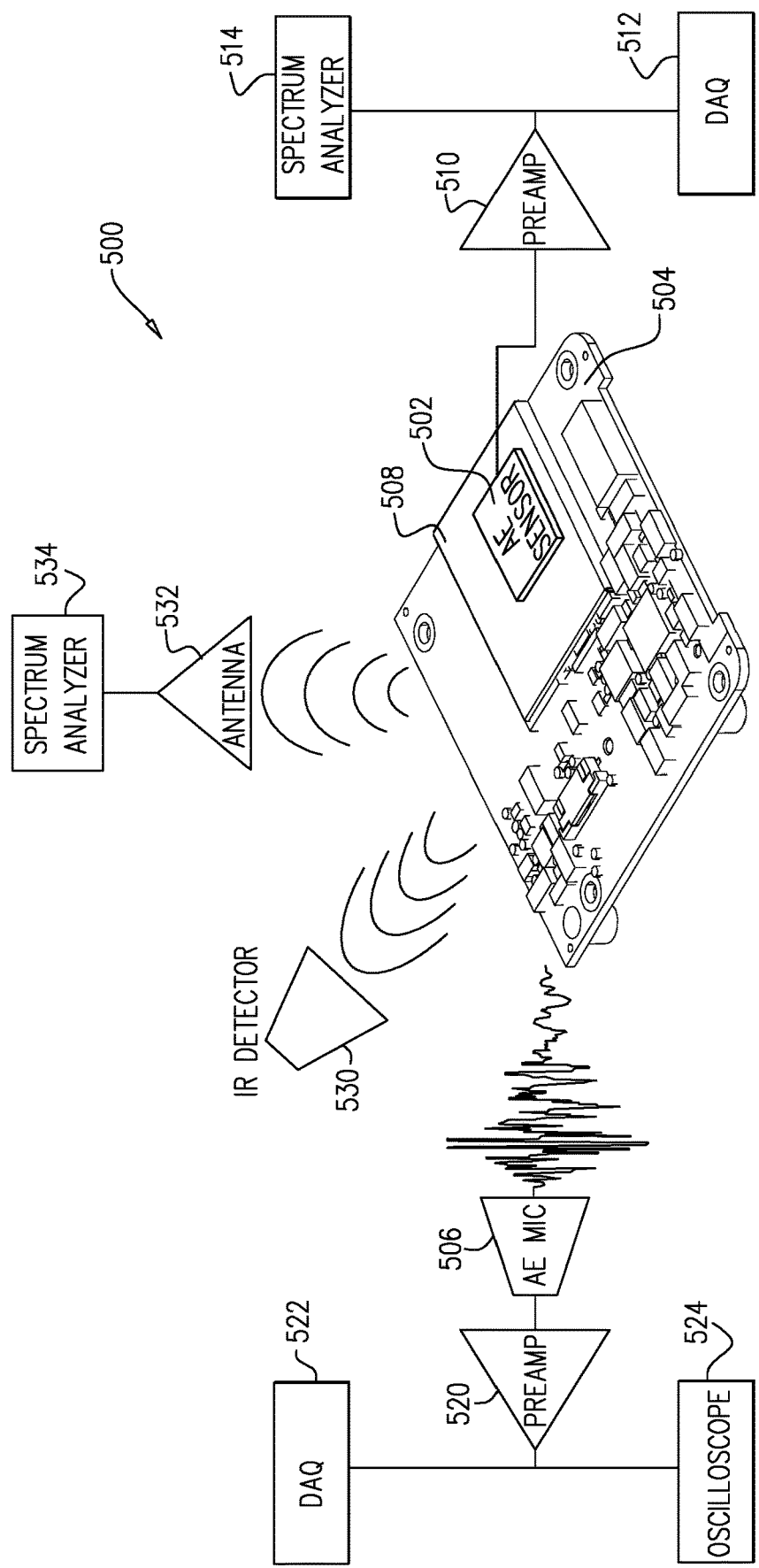
FIG. 5 is a simplified block-diagram illustration showing an acoustic emission monitoring system, constructed and operative in accordance with a preferred embodiment of the present invention.

As seen in FIG. 5, there is provided an acoustic emission monitoring system 500 preferably including at least one acoustic emission sensor, here embodied, by way of example, as a first acoustic emission sensor 502 preferably in physical contact with a DUT 504 and a second acoustic emission sensor 506, preferably not in physical contact with the DUT 504. In the experiments reported hereinbelow, first acoustic emission sensor 502 was a 150 kHz R15a ultrasonic sensor manufactured by MISTRAS of NJ, USA and second acoustic emission sensor 506 was an airborne ultrasonic microphone SPU410LR5H-QB manufactured by Knowles of IL, USA. First and second acoustic emission sensors 502 and 506 were each provided enclosed in a Faraday cage in order to shield them from EM radiation.

Here, DUT 504 is shown to be embodied as a PCB with at least one semiconductor component 508 mounted thereon, first acoustic emission sensor 502 preferably being in physical contact with semiconductor component 508. It is appreciated that first acoustic emission sensor 502 thus preferably directly senses acoustic emission generated by semiconductor component 508. Various examples of DUT 504 and/or semiconductor component 508 for which acoustic emission measurements were obtained by the present inventors using system 500 or variations thereof are described hereinbelow.

First acoustic emission sensor 502 is preferably connected to a first preamplifier 510, which first preamplifier 510 is preferably connected to a first data acquisition unit 512 and a spectrum analyzer 514. Second acoustic emission sensor 506 is preferably connected to a second preamplifier 520, which second preamplifier 520 is connected to a second data acquisition unit 522 and an oscilloscope 524. In the experiments reported hereinbelow, first and second data acquisition units 512 and 522 were NI-6351 data acquisition units, manufactured by National Instruments of Texas, USA. Spectrum analyzer 514 as an E4402B spectrum analyzer, manufactured by Keysight of California, USA. Oscilloscope 524 was an mso-x-2014a oscilloscope, manufactured by Agilent, of California, USA.

First and second preamplifiers 510 and 520 were each set to a gain of approximately 30-40 dB. The sampling frequency of first and second DAQs 512 and 522 was set to 500 kHz. Low pass filters were connected upstream of first and second preamplifiers 510 and 520 for signal integrity testing.

Acoustic emission monitoring system 500 may optionally additionally include an infra-red sensor 530 for measuring the temperature of DUT 504 as well as for thermal mapping, and one or more antennas, here illustrated as a single antenna 532, for measuring electromagnetic radiation generated by DUT 504 and/or electronic components thereon. One or more antennas 532 are preferably connected to a spectrum analyzer module 534. Spectrum analyzers 514 and 534 had a 1 kHz resolution bandwidth.

It is appreciated that the particular configuration of system 500 is illustrative only and may readily be modified by one skilled in the art to include a greater or fewer number of components, as exemplified hereinbelow. Furthermore, system 500 may include alternative components replacing the functionality of the illustrated components. For example, a single acoustic emission sensor rather than two acoustic emission sensors may be included in system 500, first and second preamplifiers 510, 520 may be obviated, the data acquisition units may be replaced by alternative sampling units, oscilloscope 524 and spectrum analyzer 514 may be obviated and so forth.

Additionally, although the acoustic emission sensors described as being employed in system 500 were ultrasound sensors, the monitored acoustic emission may additionally or alternatively be at frequencies lower than ultrasonic frequencies depending on the particular DUT, and appropriate acoustic emission sensors employed accordingly.

It is understood that an acoustic emission monitoring system such as system 500 may be incorporated within system 100, system 316 or system 416 described hereinabove. Particularly, system 500 may form a part of a preferred embodiment of at least one acoustic sensor 506 and signal processing unit 508 in system 100 of FIG. 1 or of acoustic emission sensing modules 310 and 410 of FIGS. 3 and 4 respectively.

1.1 Acoustic Emission Monitoring of a Flash Memory in Various States, on a PCB.

An experimental set-up generally resembling that shown in FIG. 5 was used to monitor acoustic emission generated by a flash memory mounted on a PCB sampling circuit. The PCB under test included thereon a 5V micro-CPU, consuming approximately 10 mA during operation, a 5V 16 MB flash memory comprising floating gate MOSFET transistors, as well as various other electronic components including filters and converters. The PCB was a sampling circuit, designed for sampling external sensors at a 20 KHz frequency, although no such sensors were connected to the PCB during the course of the experiment. First acoustic emission sensor 502 was directly mounted on the flash memory. Second microphone 506 was located at a distance of several cm and offset to the side of the flash memory.

Figure 6A:
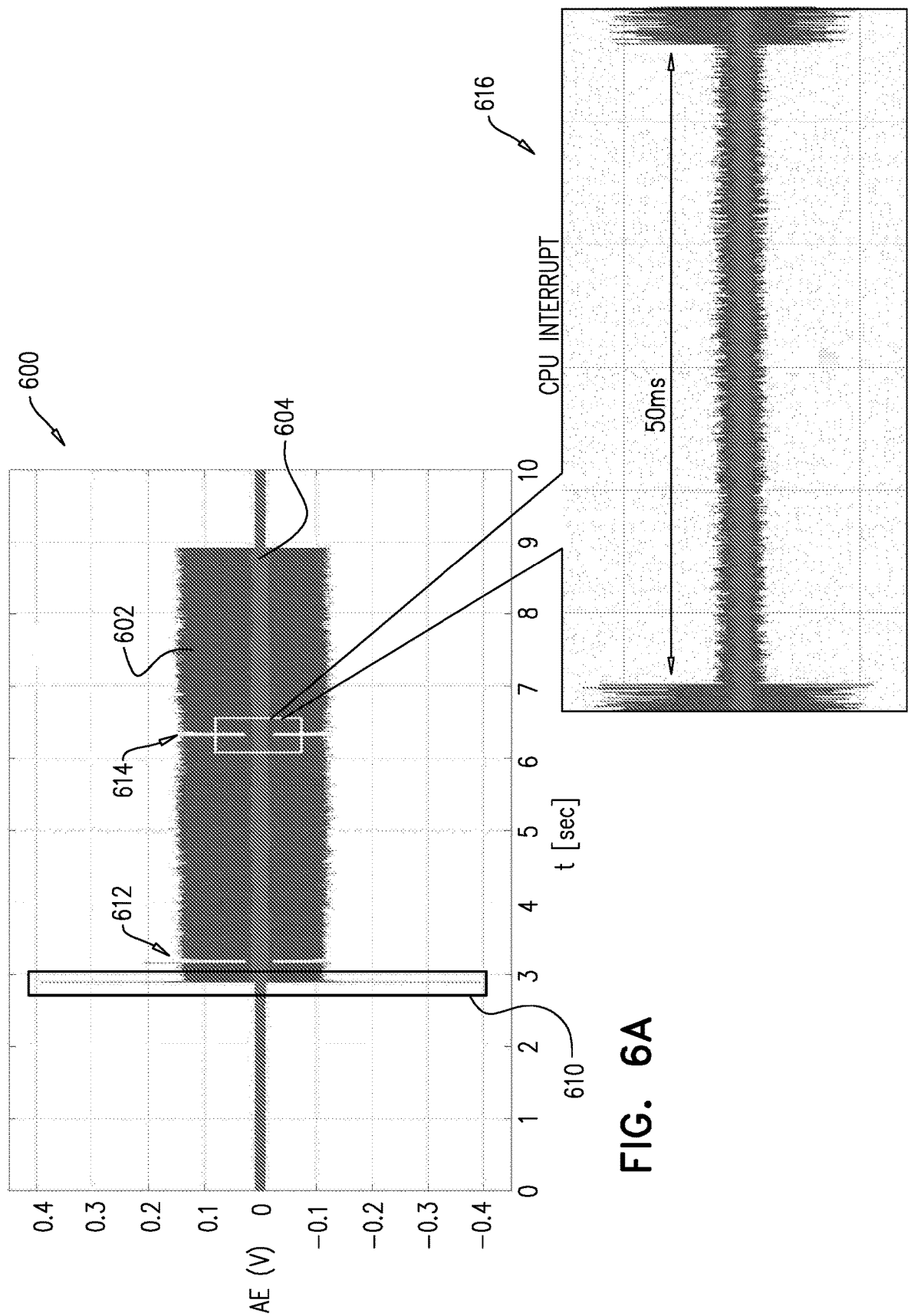
FIGS. 6A-6I are graphs displaying time and frequency domain acoustic emission signals arising from a flash memory on a printed circuit board, as measured by one physically and one non-physically contacting acoustic emission sensor in a system of the type illustrated in FIG. 5.

Measured acoustic emission intensity as a function of time is displayed in a graph 600 in FIG. 6A. The data displayed in graph 600 corresponds to the raw data obtained after filtering with a high pass filter of 30 KHz in order to reduce the environmental acoustic signal. It is noteworthy, however, that features of the signal identified hereinbelow were also visible after filtering of the raw data with only a 100 Hz filter, albeit less clearly. The acoustic emission measured by first physically contacting emission sensor 502 is represented by a first trace 602. and the acoustic emission measured by second non-contacting microphone 506 is represented by a second trace 604.

At the start of the experiment (t=0) the flash was in an idle state. The flash was put into operation at approximately t=3 and returned to an idle state just prior to t=9, as indicated on the graph 600. Enhanced acoustic emission is seen to be measured by both sensors 502, 506 when the flash memory is in an active operating state in comparison to the acoustic emission when the flash memory is in an idle state. Additionally, a large burst in acoustic emission is seen in region 610, corresponding to the wakeup state of the flash memory. This burst in acoustic emission is understood by the present inventors to be caused by bias settling. Furthermore, variations in acoustic emission in regions 612 and 614 are indicative of the CPU interrupt of the CPU to which the flash memory was connected.

As best seen at an enlargement 616 of region 614 showing the CPU interrupt, the variation in acoustic emission corresponding to the CPU interrupt spanned a time interval of approximately 50 ms, which time interval is consistent with the length of the CPU interrupt based on the specification of the CPU employed in this experiment. The CPU interrupt is exhibited in the acoustic emission spectra measured from the flash due to the connection of the CPU to the flash. As a result, the CPU influenced the flash acoustic emission.

The capability of detection of CPU interrupts by way of acoustic emission monitoring, in accordance with preferred embodiments of the present invention, is a highly advantageous feature of the present invention. Both the presence and duration of CPU interrupts are detectable based on the acoustic emission generated by the flash connected to the CPU. This allows classification and identification of CPU interrupts during flash memory operation and facilitates identification of developing faults leading to possible failure, as well as possible breaches in security of the flash memory, based on their influence on acoustic emission features associated with CPU interrupts.

Figure 6B:
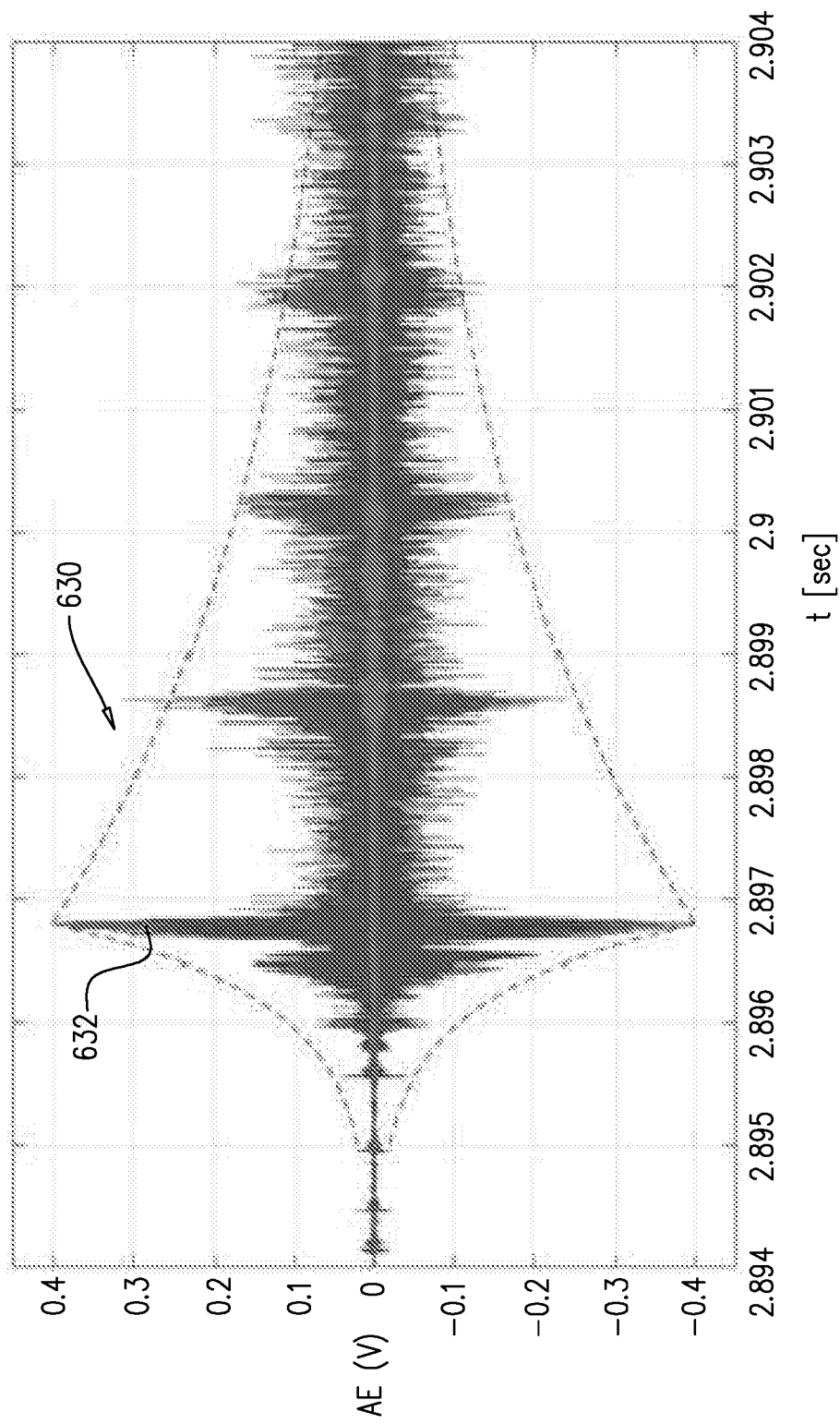

As seen in an enlargement 630 of wake-up region 610 in FIG. 6B, the wake-up acoustic emission intensity as measured by first physically contacting sensor 502 is characterized by an initial exponential rise in intensity over a time period of approximately 0.6 ms followed by a gradual exponential decrease in intensity over a time period of approximately 4 ms. Peaks of decreasing intensity are mutually separated by a time gap of approximately 2 ms.

Features of the wakeup state acoustic emission spectra may be used for investigating the mechanism responsible for the generation of acoustic emission by the various components on the PCB. Particularly, the rise and fall times of the acoustic emission during wakeup are significantly lower than the time taken for the components on the PCB to heat, according to calculations by the present inventors based on the thermal diffusivity of the flash memory. This suggests that the acoustic emission arises directly from charge-lattice interactions, such as electron-phonon scattering, leading to atomic motion of the host lattice rather than being due to indirect heating effects. This understanding is supported by the fact that infra-red measurements of the flash memory housing during the course of the experiment show a generally constant housing temperature over the idle, wakeup and active states.

Figure 6C:
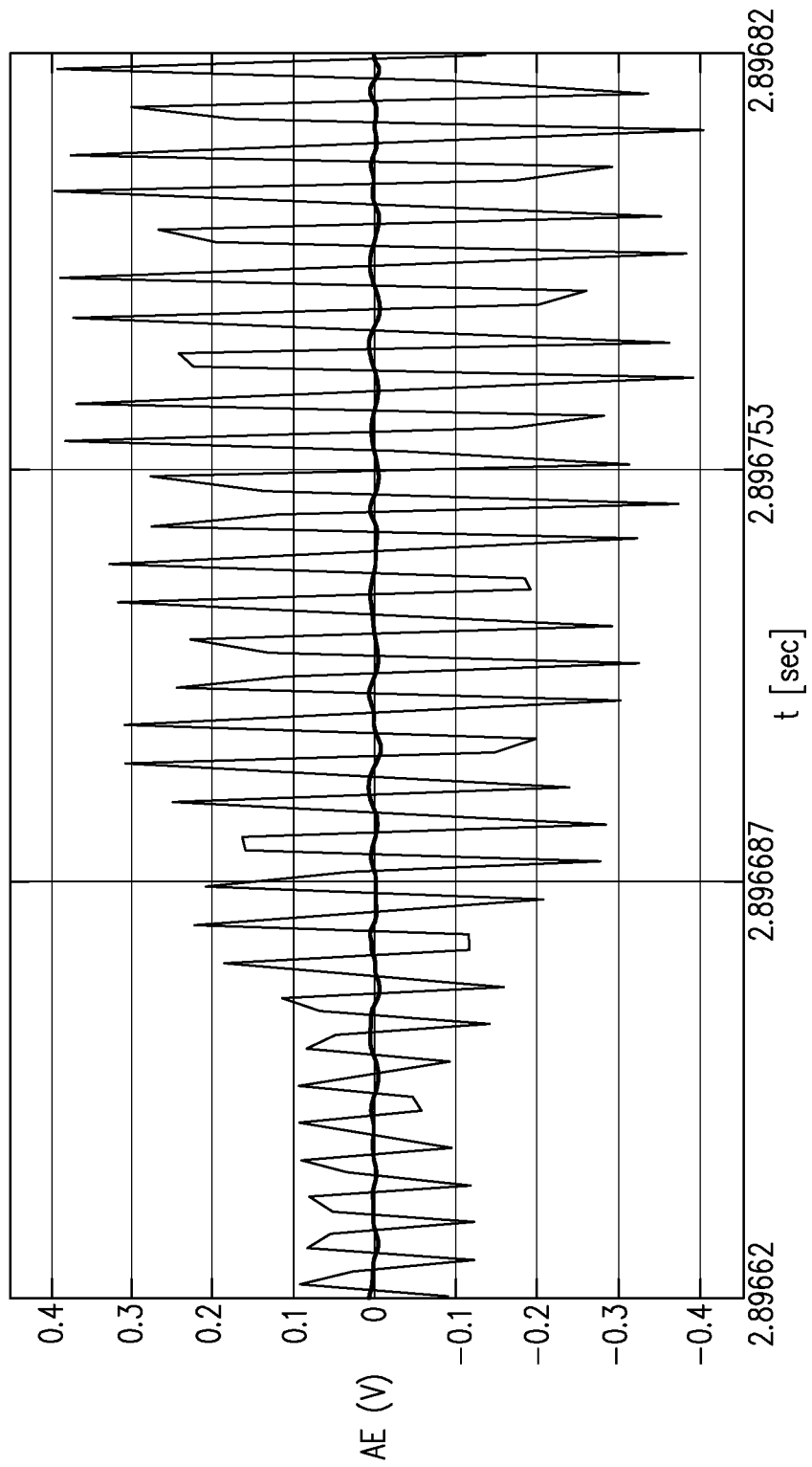

As seen in FIG. 6C, illustrating an enlargement of a region 632 of graph 630, peaks in the wakeup region 610 are characterized by a dominant frequency of approximately 166 KHz.

Figure 6D:
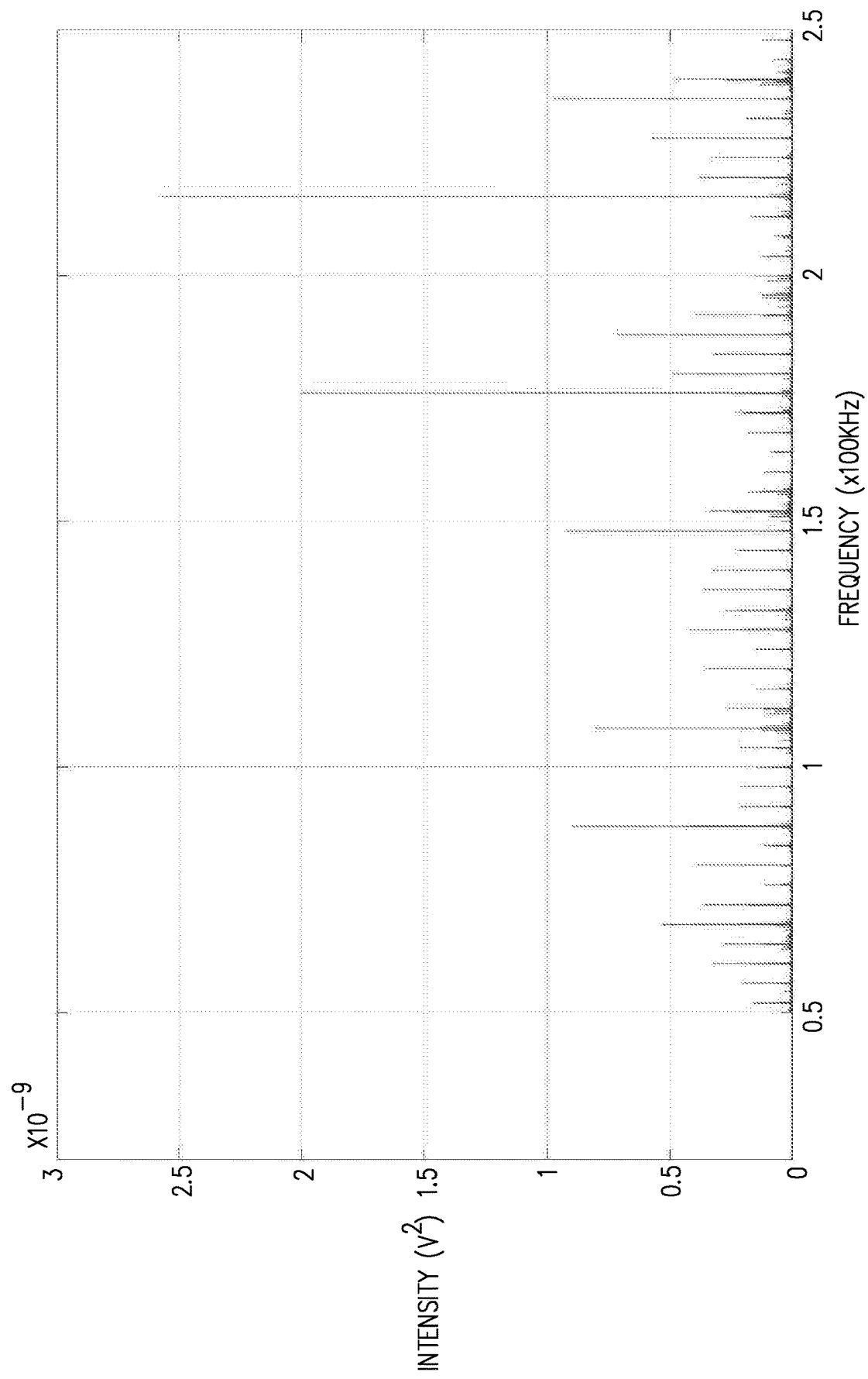
Figure 6E:
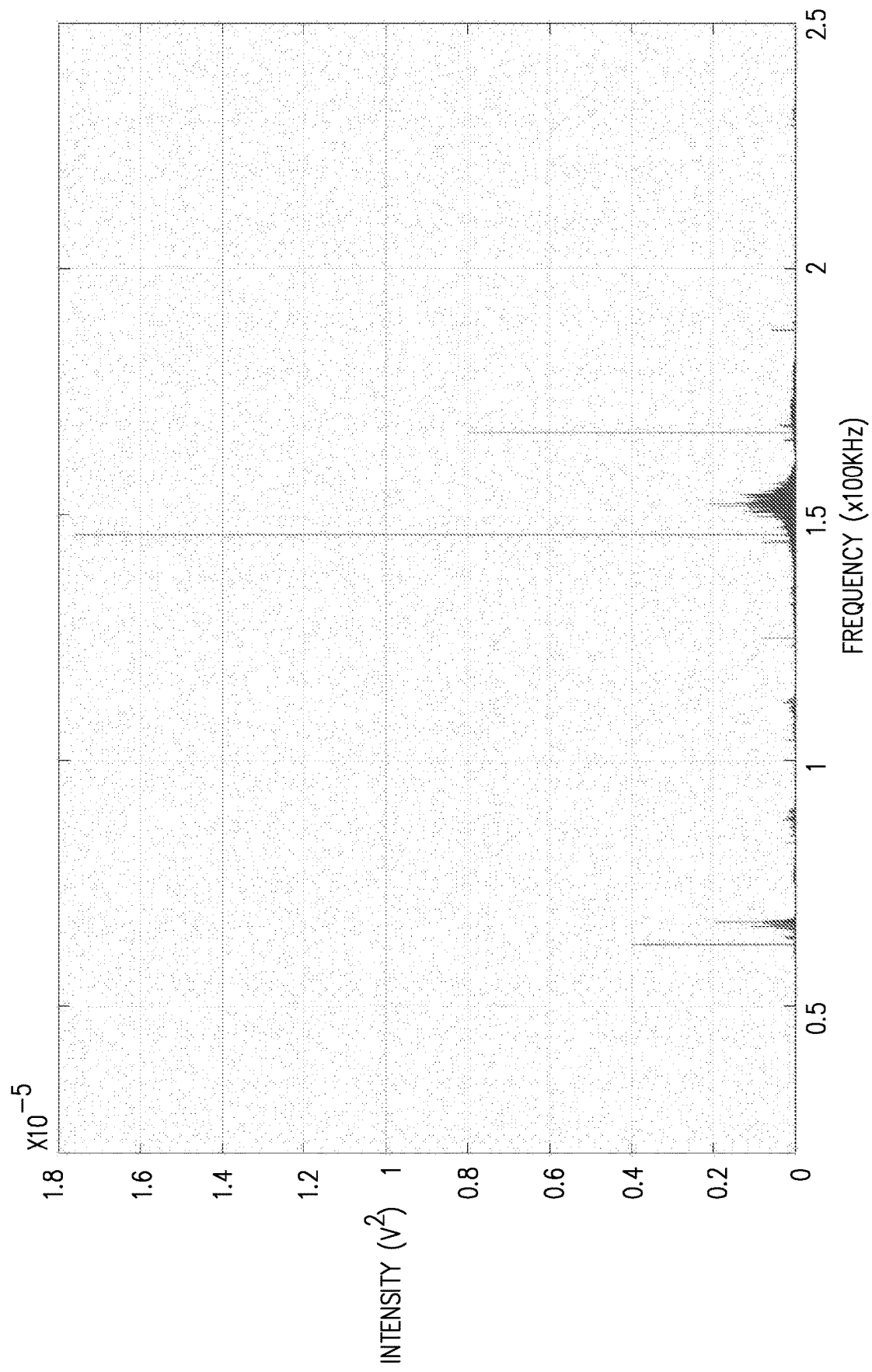
Figure 6F:
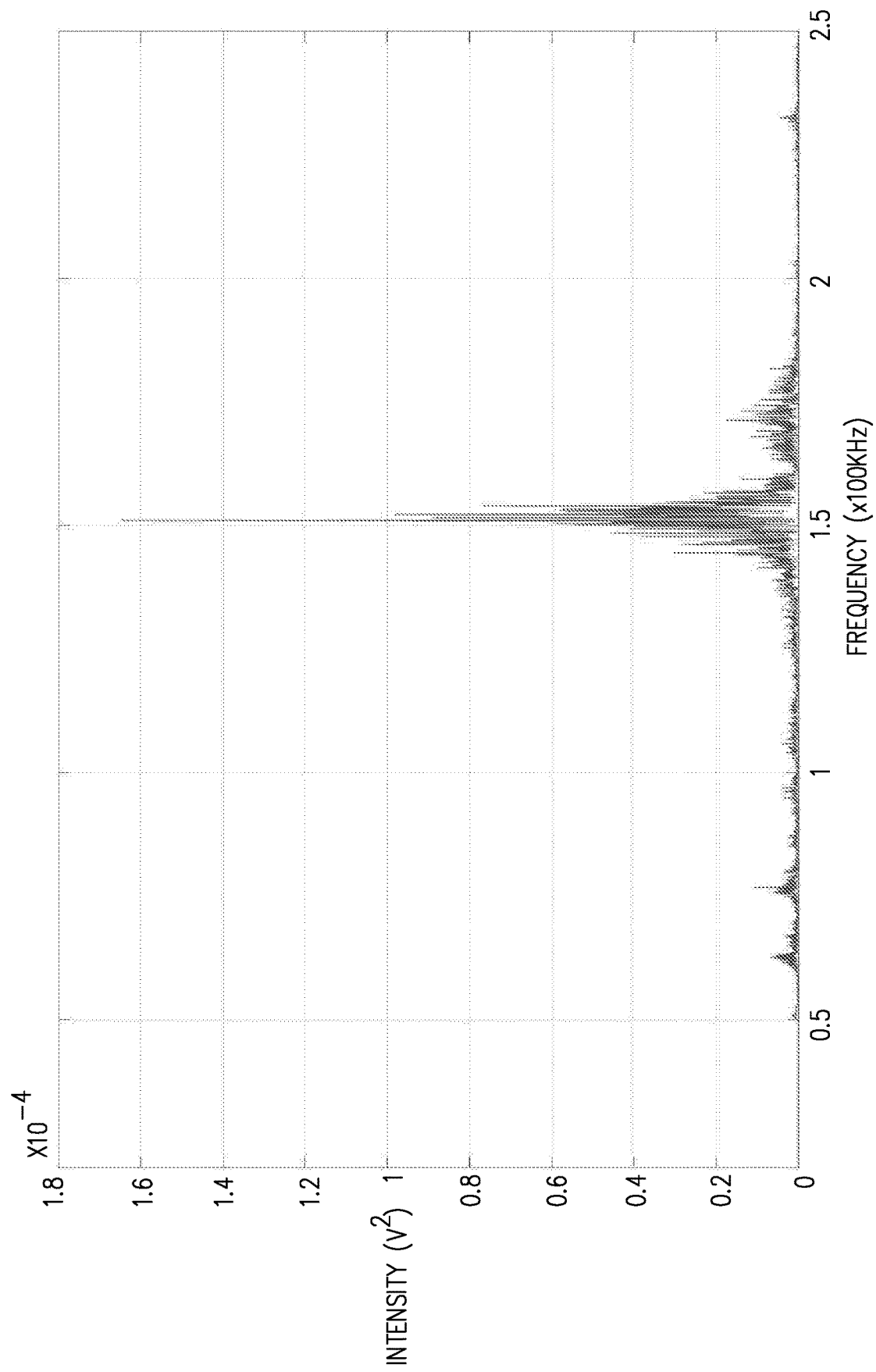

The frequency domain acoustic emission power spectra generated by the flash memory as measured by first physically contacting acoustic emission sensor 502 are displayed in FIGS. 6D, 6E and 6F, respectively displaying the acoustic emission intensity spectra for the flash memory in an idle, actively operating and wakeup state. The actively operating state of the flash corresponds to the storing of data in the flash. The data displayed corresponds to the raw data in the frequency domain following application of a 50 kHz high pass filter.

As clear from consideration of FIGS. 6D-6F, a significantly higher acoustic emission intensity was measured in the wakeup and operative states, in comparison to the idle state, with the wakeup and operative states having acoustic emission intensity of the order of $10^{-5}$ and $10^{-4}$ $V^2$ in contrast to the idle state having acoustic emission intensity of the order of $10^{-9}$ $V^2$. Furthermore, the acoustic emission intensity spectra in the wakeup and operative states exhibit mutually difference acoustic emission features and signatures, allowing the acoustic emission spectra corresponding to the various operating states of the DUT to be readily identified and classified. Additionally, with respect to the wakeup state intensity spectrum displayed in FIG. 6F, an intensity peak is seen at approximately 166 KHz, corresponding to the dominant frequency of 166 kHz visible in FIG. 6C. The dominant frequency associated with the wakeup state of the flash memory is an additional feature of the acoustic emission that may be used in order to identify the flash memory operating state and detect anomalies thereof.

Figure 6G:
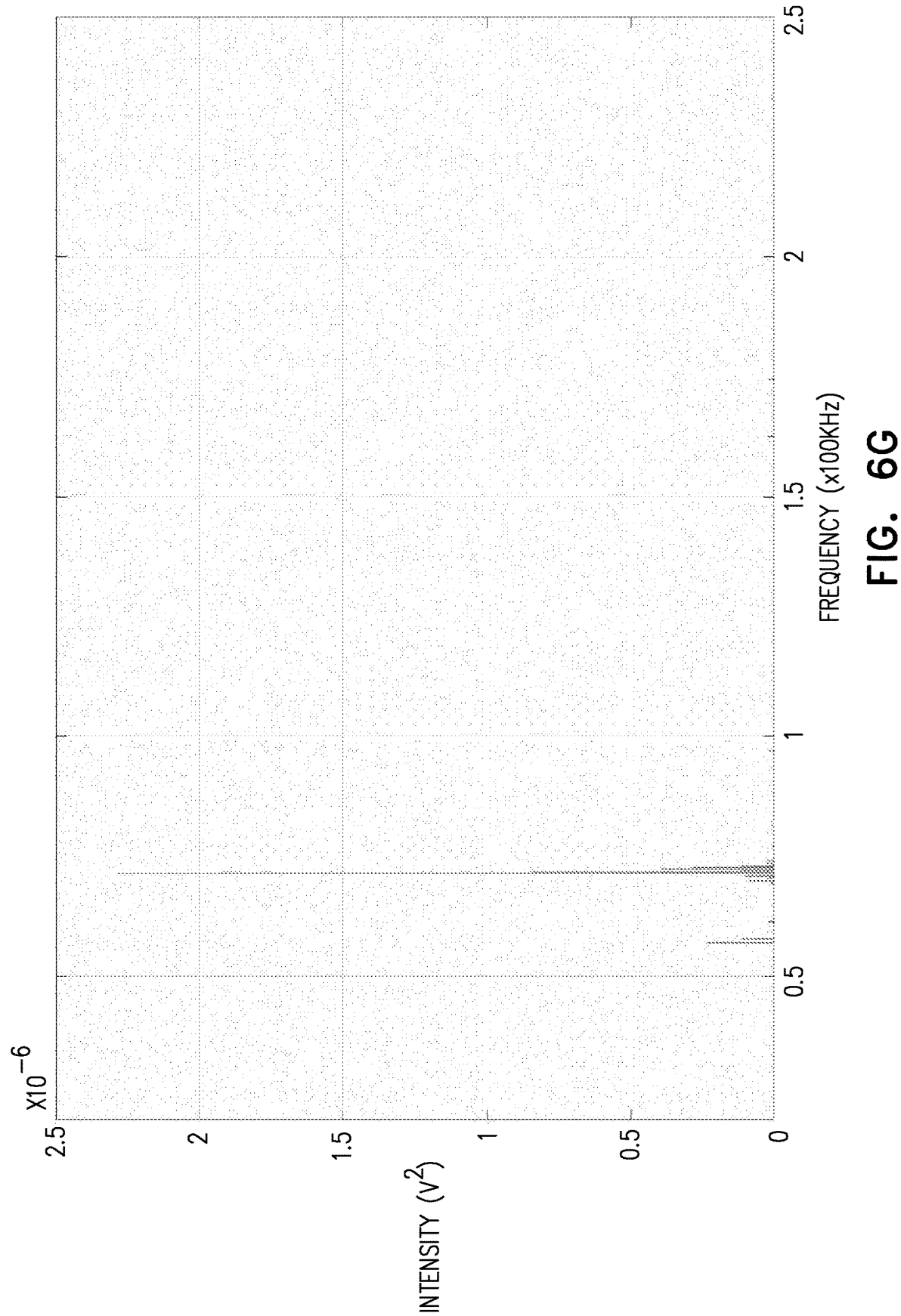
Figure 6H:
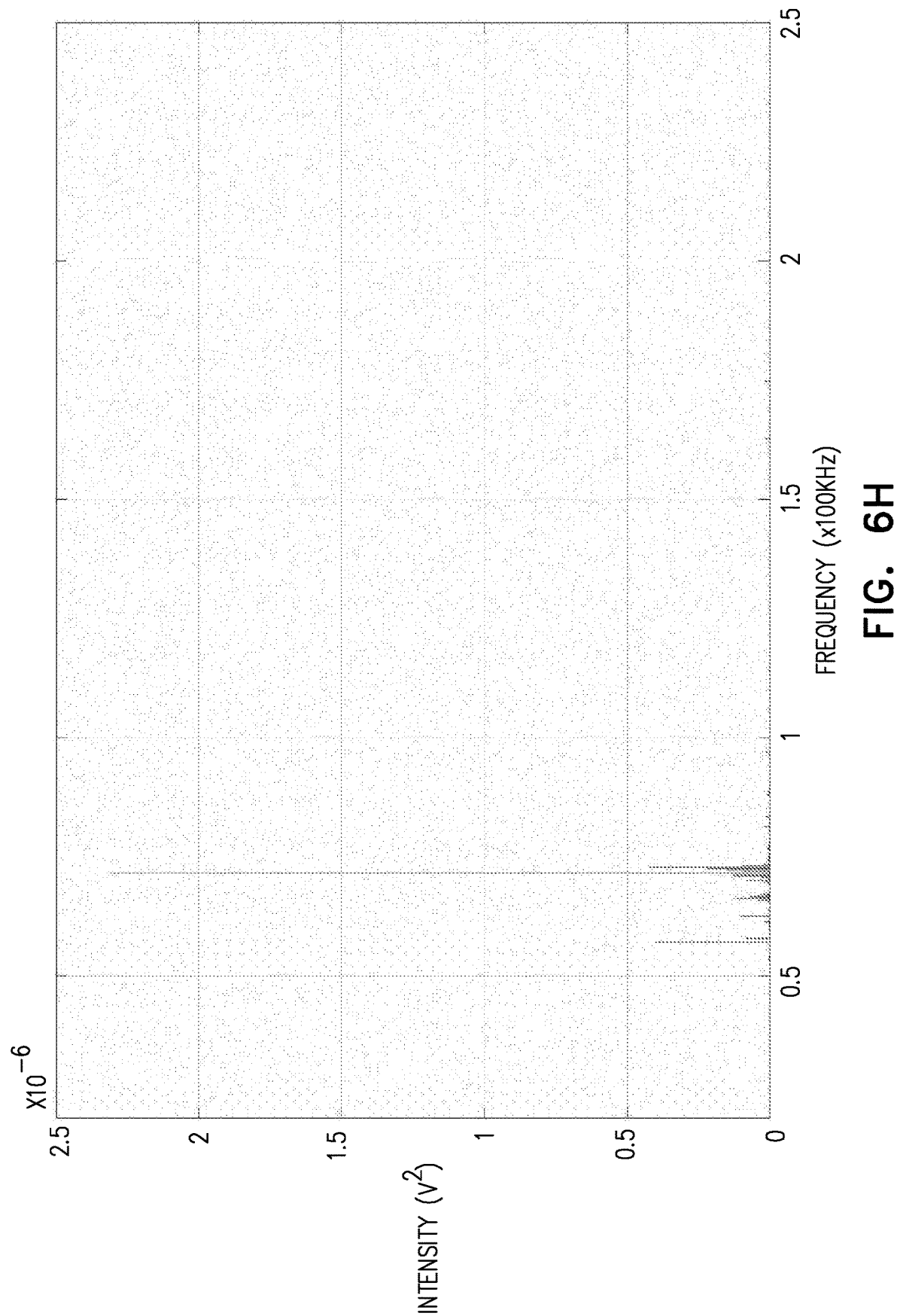
Figure 6I:
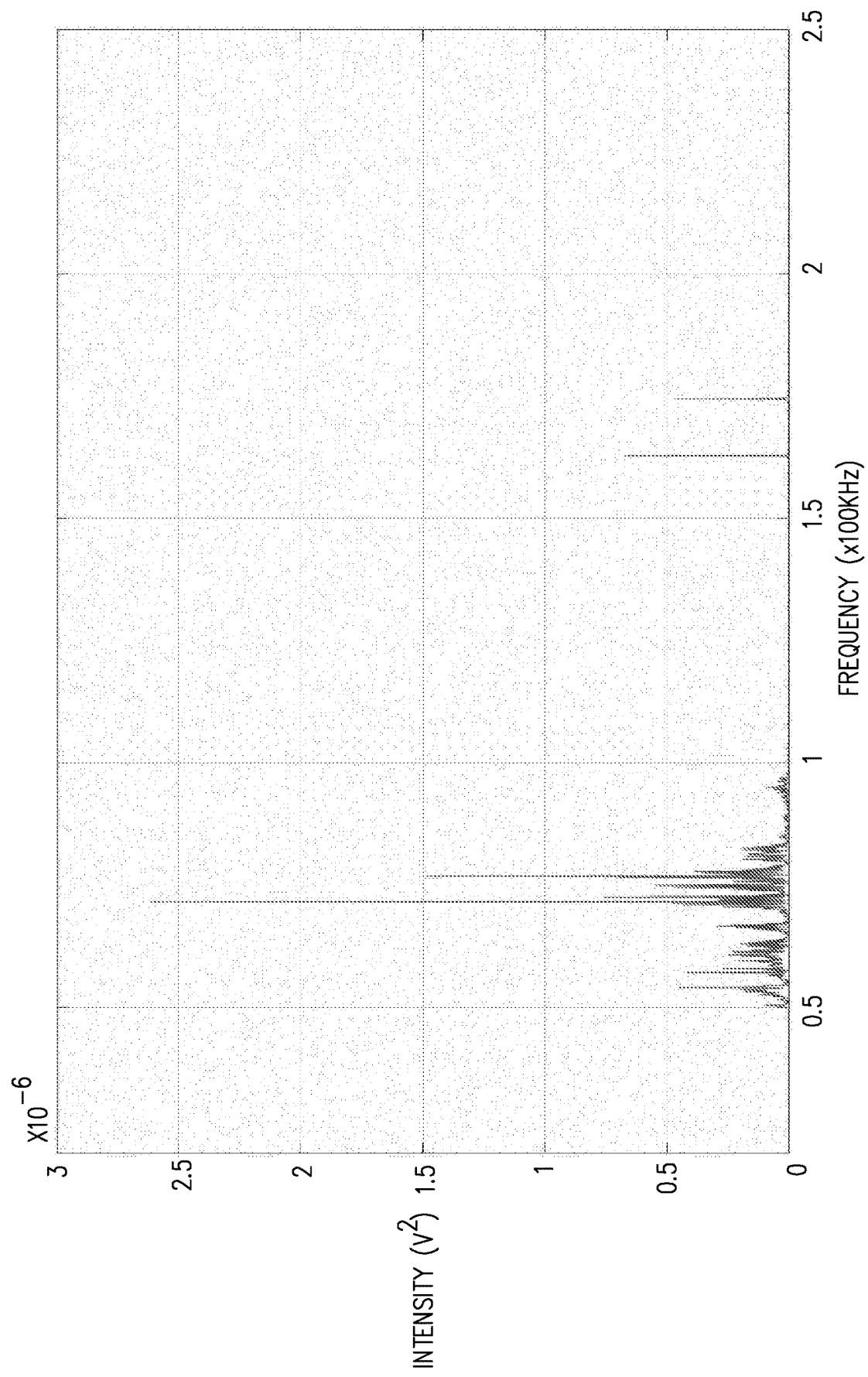

The frequency domain acoustic emission intensity spectra generated by the flash memory as measured by second non-physically contacting microphone 506 are displayed in FIGS. 6G, 6H and 6I, respectively displaying the acoustic emission intensity spectra for the flash memory in an idle, actively operating and wakeup state. The data displayed corresponds to the raw data in the frequency domain following application of a 50 kHz high pass filter.

As clear from consideration of FIGS. 6G-6I, a significantly higher acoustic emission intensity was measured by microphone 506 in the wakeup and operative states, in comparison to the idle state. Furthermore, the acoustic emission intensity spectra in the wakeup and operative states exhibit mutually difference acoustic emission features and signatures, allowing the acoustic emission spectra corresponding to the various operating states of the DUT to be readily identified and classified. Additionally, with respect to the wakeup state spectrum displayed in FIG. 6I, an intensity peak is seen at approximately 166 KHz, corresponding to the dominant frequency of 166 kHz visible in FIG. 6C. The dominant frequency associated with the wakeup state of the flash memory is an additional feature of the acoustic emission that may be used in order to identify the flash memory operating state and detect anomalies thereof.

As appreciated from a comparison of FIGS. 6D-6F to FIGS. 6G-6I, the acoustic emission intensity as measured by physically contacting sensor 502 is greater than and different to that measured by non-physically contacting microphone 506. This is attributable to attenuation of the signal over the distance between the microphone 506 and the flash memory, the acoustic transfer function that is orientation dependent with respect to the microphone and possible blocking of the acoustic emission by the sensor 502 due to sensor 502 resting on the surface of the flash memory.

Statistical features of the acoustic emission generated by the flash memory in various operating states thereof, as measured by the acoustic emission sensor 502 and non-contacting microphone 506, are tabulated in Tables 1 and 2 respectively.

TABLE 1

Statistical features of acoustic emission generated by flash memory in various operating states thereof, as measured by physically contacting acoustic emission sensor 502

| Feature | Idle state | Wake-up state | Active operating state |
|---|---|---|---|
| Root Mean Square | $4 \times 10^{-4}$ | 0.054 | 0.043 |
| Std. Deviation | $4 \times 10^{-4}$ | 0.054 | 0.043 |
| Skewness | $-6 \times 10^{-12}$ | $2 \times 10^{-5}$ | $1.3 \times 10^{-7}$ |
| Kurtosis | $4 \times 10^{-13}$ | $1 \times 10^{-4}$ | $1.1 \times 10^{-5}$ |

TABLE 2

Statistical features of acoustic emission generated by flash memory in various operating states thereof, as measured by non-physically contacting microphone 506

| Feature | Idle state | Wake-up state | Active operating state |
|---|---|---|---|
| Root Mean Square | 0.0025 | 0.0048 | 0.043 |
| Std. Deviation | 0.0025 | 0.0048 | 0.043 |
| Skewness | $-7.5 \times 10^{-10}$ | $2.5 \times 10^{-9}$ | $1.7 \times 10^{-11}$ |
| Kurtosis | $1.1 \times 10^{-10}$ | $3.2 \times 10^{-9}$ | $1 \times 10^{-9}$ |

As appreciated from consideration of the values presented in Tables 1 and 2, large variations are seen in statistical features of acoustic emission generated by the flash memory in various operating states thereof, as measured by both physically and non-physically contacting acoustic emission sensors. These large variations in statistical features associated with acoustic emission in the various operating states of the device, allow the use of statistical analysis and machine-learning algorithms for automatically classifying an operating state of the device as well as identifying possible anomalies in the acoustic emission features arising from faulty or malicious device operation.

As seen in Tables 1 and 2, the rms and standard deviation values in each case are generally equal, since the mean value of the measured acoustic emission is approximately zero.

Figure 6K:
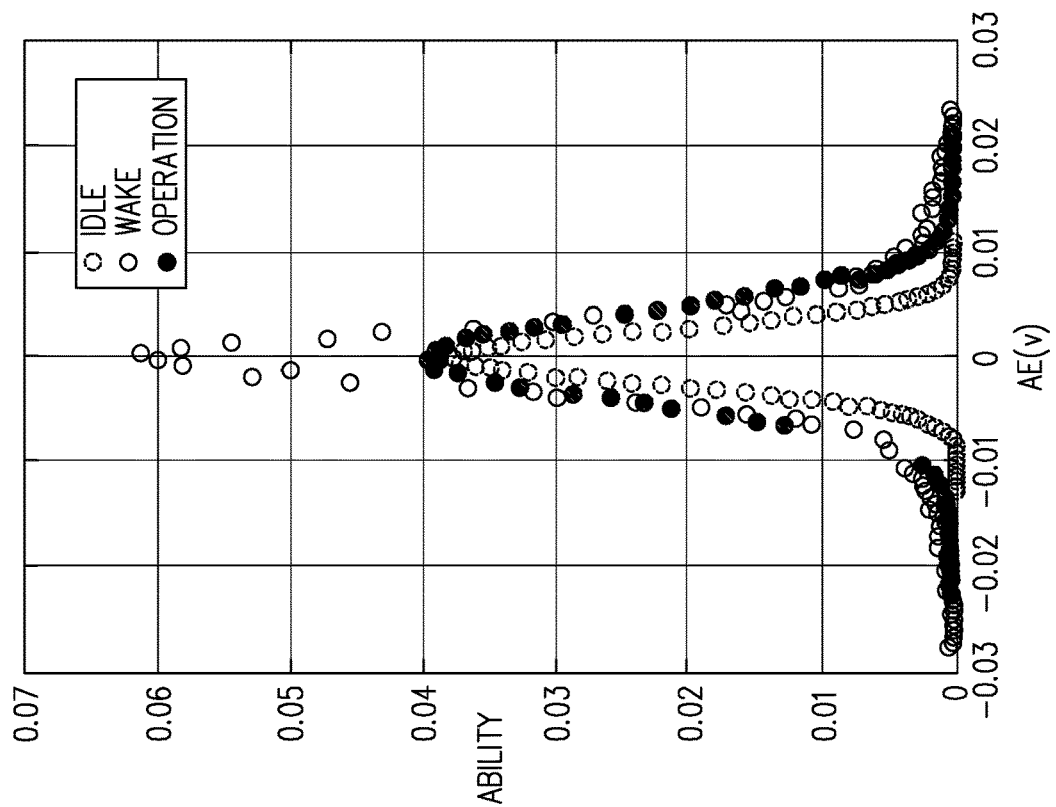
FIGS. 6J and 6K are graphical representations of statistical features of the data displayed in FIGS. 6A-6I.
Figure 6J:
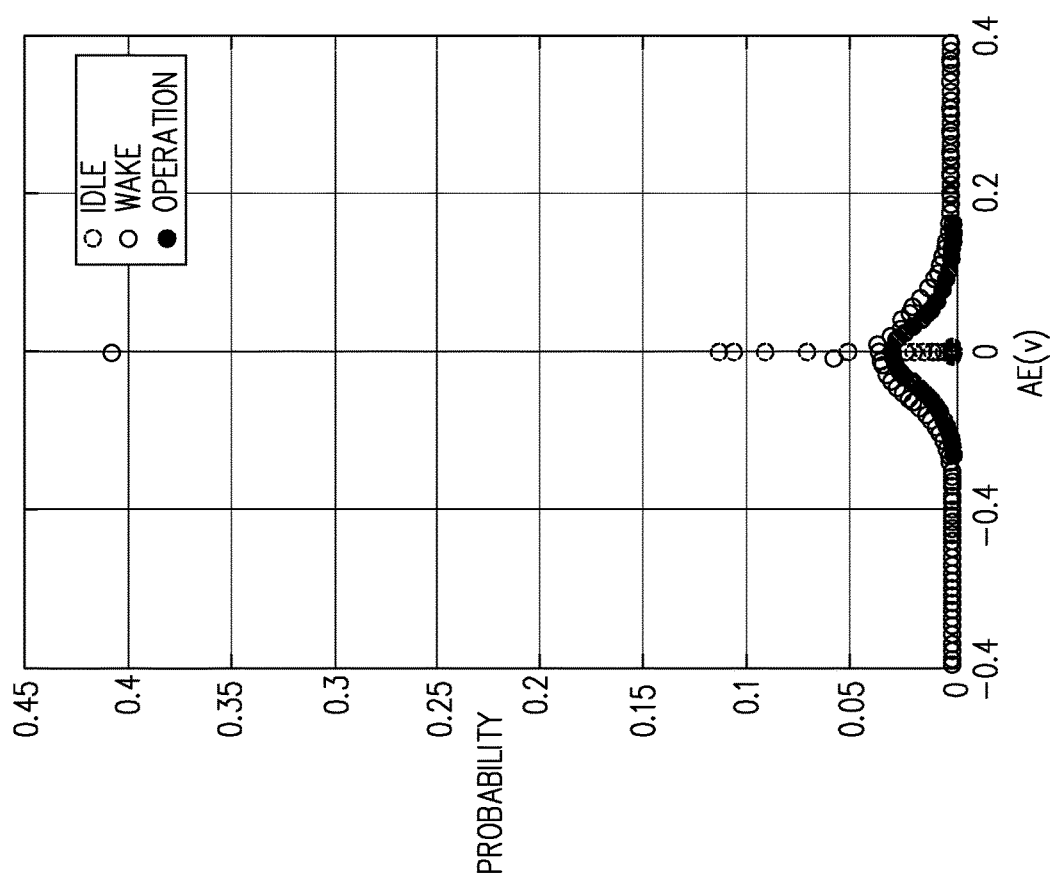

Probability distribution functions reflecting the statistical features of the various operating states of the flash memory, as measured by the sensor 502 and microphone 506, are displayed in FIGS. 6J and 6K respectively. The probability distribution functions illustrate variations in statistical features of the spectra associated with the various operating states, allowing the use of higher order statistical moments as well as cumulants and other statistical measures for differentiating between and identifying various operating states of the device under test.

Figure 6L:
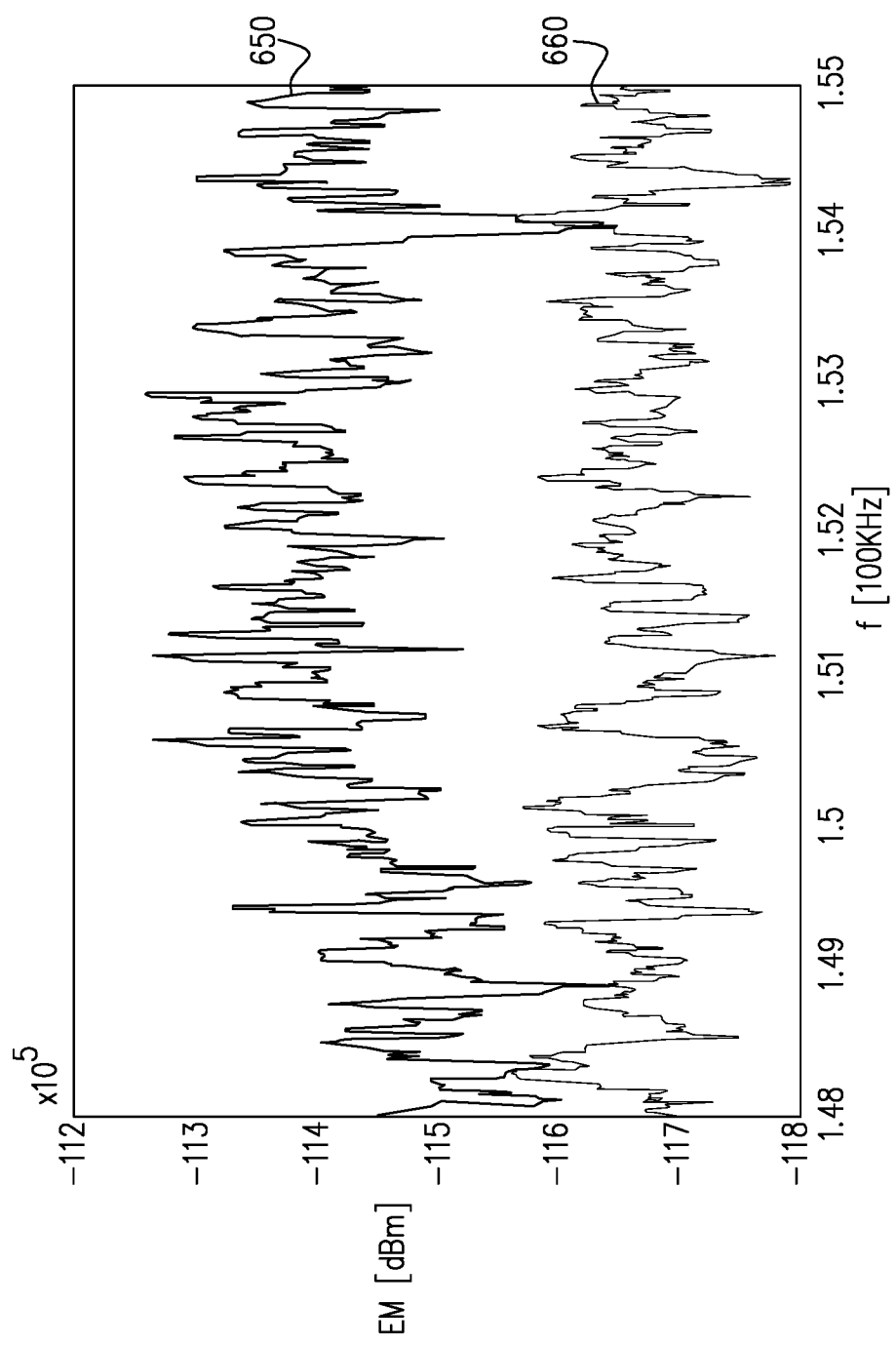
FIGS. 6L and 6M are graphs respectively displaying frequency and time domain electromagnetic signals corresponding to the acoustic emission signals displayed in FIGS. 6A-6I.
Figure 6M:
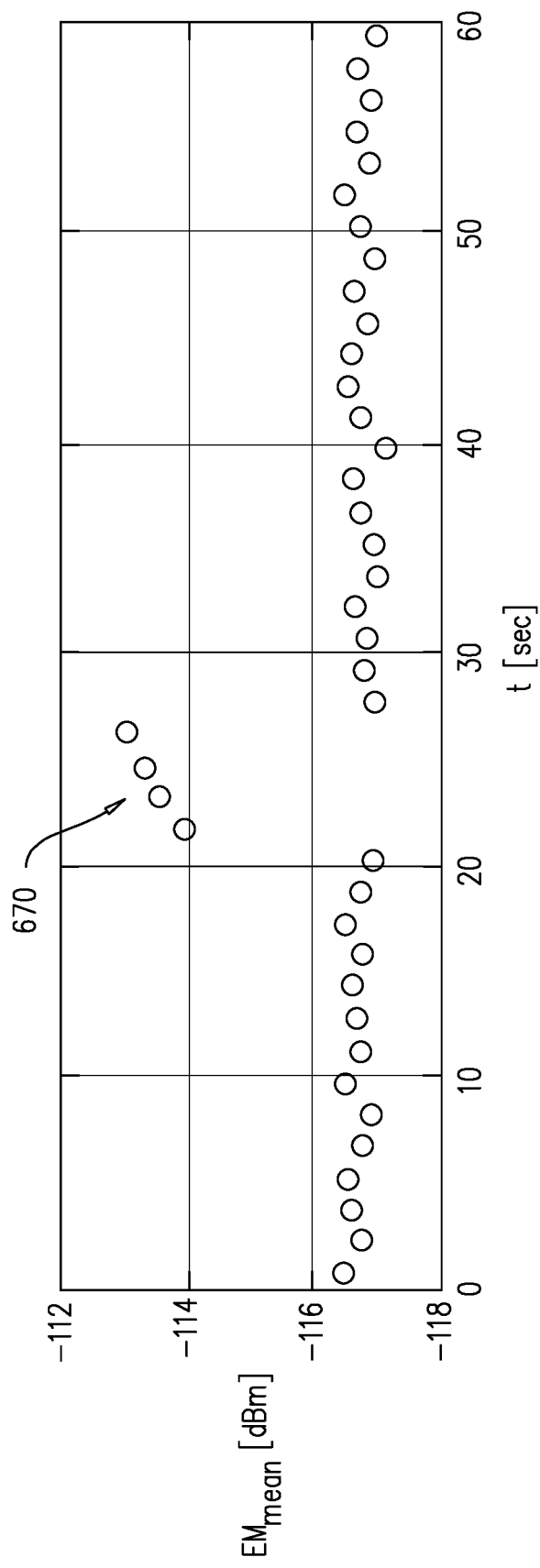

The electromagnetic power generated during various operating states of the circuit on the PCB, as measured by passive antenna 532, is displayed in FIGS. 6L and 6M, showing power in the frequency and time domain respectively. As seen in FIG. 6L, the electromagnetic power generated by the flash memory in an active operating state, as represented by a first trace 650, is significantly higher than the electromagnetic power generated by the flash memory in an idle state, as represented by a second trace 660. An increase in electromagnetic power of approximately 3 dBm is seen at a frequency range of about 150 kHz. This frequency range is consistent with the dominant frequency seen in the acoustic emission signature displayed in FIGS. 6A-6I, indicating a correlation between features of the electromagnetic emission and the acoustic emission. Furthermore, as seen in a region 670 of FIG. 6M, which region 670 corresponds to the active operating state of the flash memory, the electromagnetic power in the time domain is seen to be significantly enhanced during active operation in comparison to the idle state.

The enhancement in electromagnetic radiation in the active state of the flash memory is believed to be due to electric currents and acceleration of charges within the device, which electric currents and accelerating charges interact with the host lattice to produce both electromagnetic and acoustic emission. The correlation between acoustic emission and electromagnetic radiation generated by the circuit during operation thereof may be used to identify operating states of the flash memory as well as to detect developing faults or failure of the flash memory based on features of both the acoustic and electromagnetic emission.

1.2 Acoustic Emission Monitoring of a CPU in Various States, on a PCB.

An experimental set-up generally resembling that shown in FIG. 5 was used to monitor acoustic emission generated by a CPU mounted on a PCB sampling circuit.

The PCB under test included thereon a 5V micro-CPU, consuming approximately 10 mA during operation, a 5V 16 MB flash memory comprising floating gate MOSFET transistors, as well as various other electronic components including filters and converters. The PCB was a sampling circuit, designed for sampling external sensors at a 20 KHz frequency, although no such sensors were connected to the PCB during the course of the experiment. First acoustic emission sensor 502 was directly mounted on the CPU. It is appreciated that first acoustic emission sensor 502 thus senses acoustic emission directly from the CPU, which acoustic emission is generated by the CPU itself. Second microphone 506 was located at a distance of several cm and offset to the side with respect to the CPU.

Figure 7A:
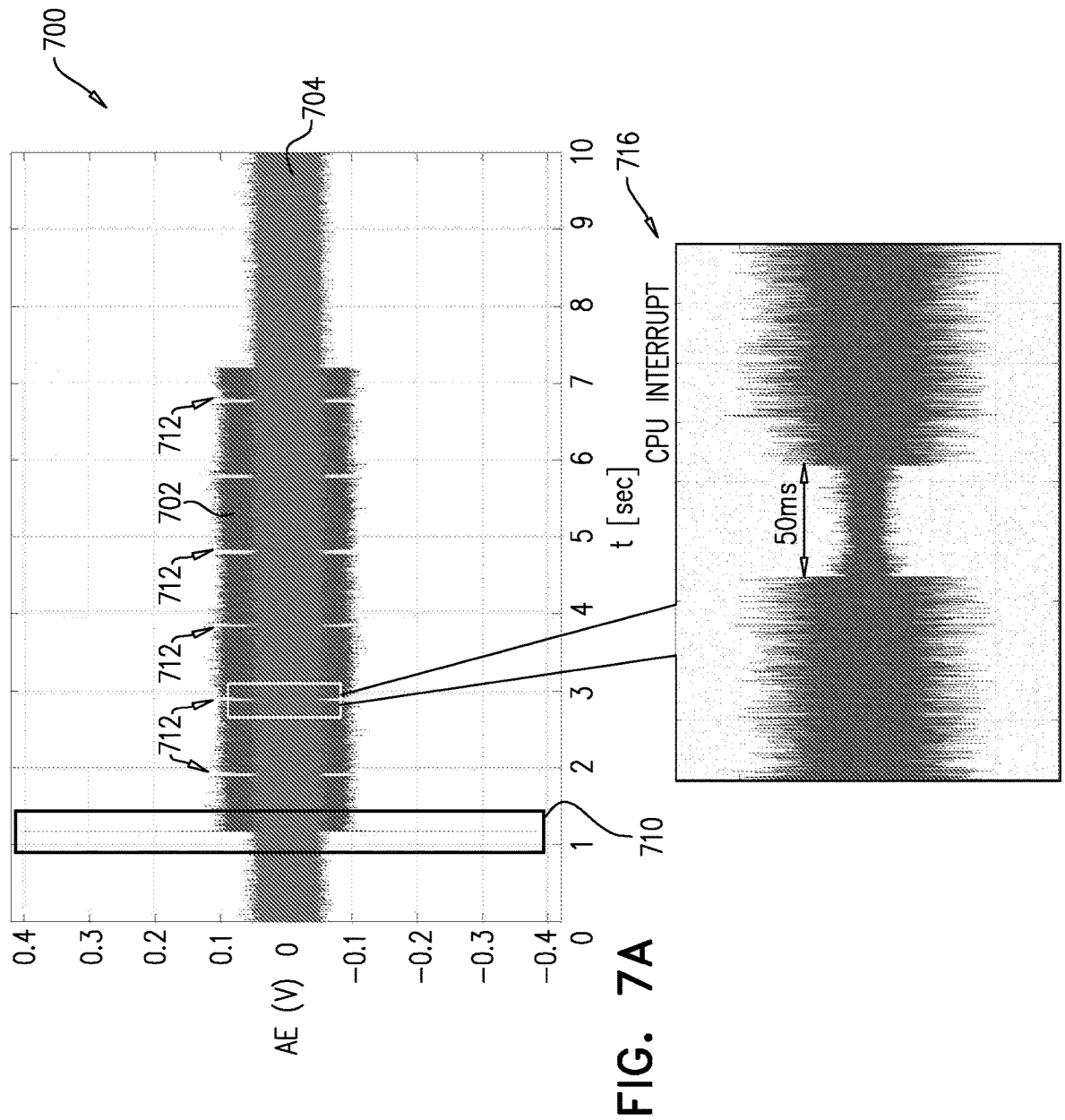

Measured acoustic emission intensity as a function of time is displayed in a. graph 700 in FIG. 7A. The data displayed in graph 700 corresponds to the raw data obtained after filtering with a high pass filter of 80 KHz, in order to reduce the environmental acoustic signal. It is noteworthy, however, that features of the signal identified hereinbelow were also visible after filtering of the raw data with only a 20 kHz filter, albeit less clearly. The acoustic emission measured by first physically contacting emission sensor 502 is represented by a first trace 702 and the acoustic emission measured by second non-contacting microphone 506 is represented by a second trace 704.

At the start of the experiment (t=0) the CPU was in an idle state. The CPU was put into operation shortly following t=1 and returned to an idle state shortly after t=7, as indicated on the graph 700. Enhanced acoustic emission is seen to be measured by both sensors 502, 506 when the CPU is in an active operating state in comparison to the acoustic emission when the CPU is in an idle state. Additionally, a large burst in acoustic emission is seen in region 710, corresponding to the wakeup state of the CPU. This burst in acoustic emission is understood by the present inventors to be caused by bias settling. Furthermore, variations in acoustic emission in regions 712 are indicative of the CPU interrupt. As best seen at an enlargement 716 of region 712 showing the CPU interrupt, the variation in acoustic emission corresponding to the CPU interrupt spanned a time interval of approximately 50 ms, which time interval is consistent with the length of the CPU interrupt based on the specification of the CPU employed in this experiment.

The capability of detection of CPU interrupts by way of acoustic emission monitoring, in accordance with preferred embodiments of the present invention, is a highly advantageous feature of the present invention. Both the presence and duration of CPU interrupts are detectable based on the acoustic emission generated thereby. This allows classification and identification of CPU interrupts during operation and facilitates identification of developing faults leading to possible failure, as well as possible breaches in security of the CPU, based on their influence on acoustic emission features associated with CPU interrupts.

Figure 7B:
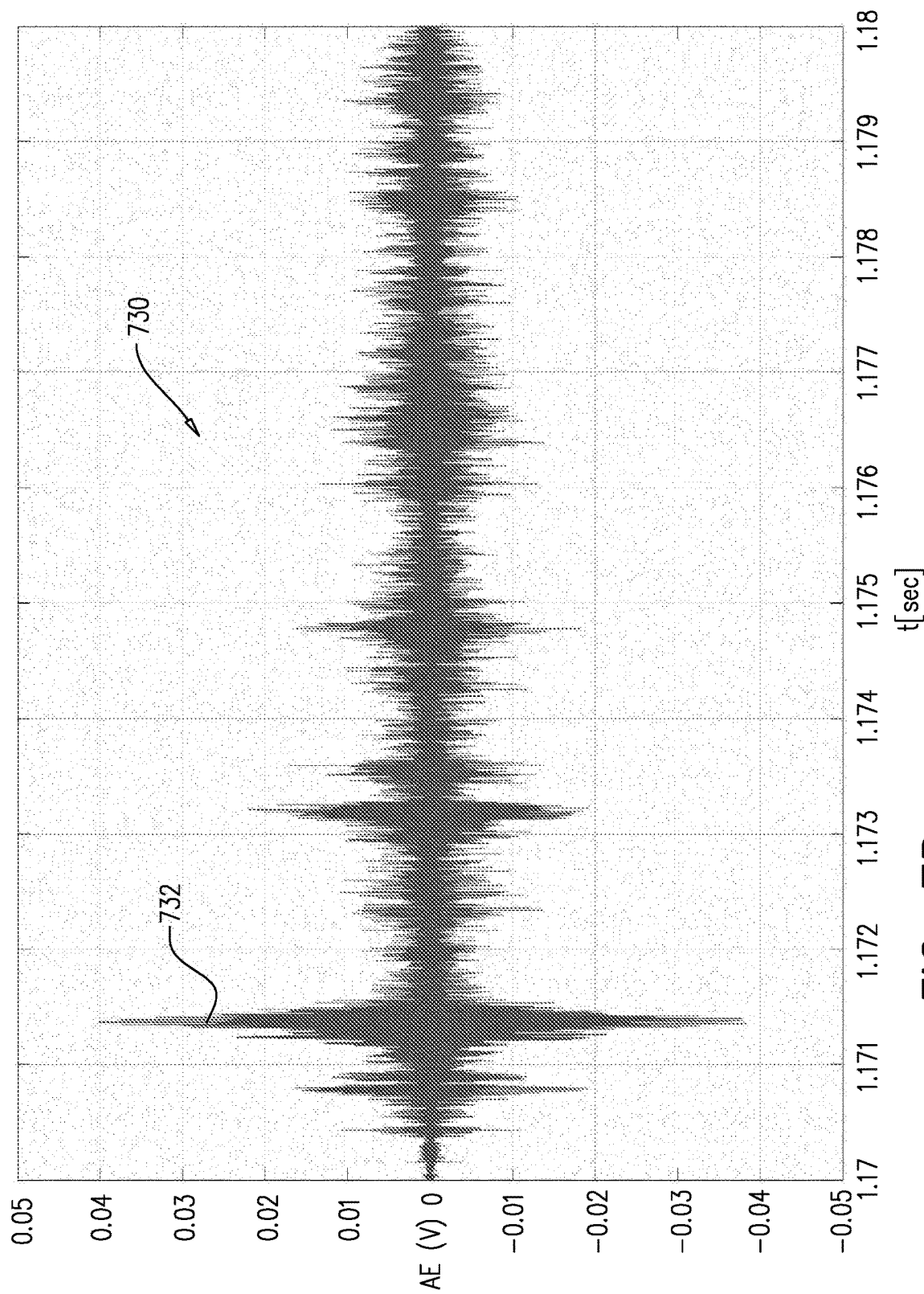

As seen in an enlargement 730 in FIG. 7B of wake-up region 710, the wake-up acoustic emission as measured by first physically contacting sensor 502 is characterized by an initial exponential rise in intensity over a time period of approximately 0.6 ms followed by a gradual exponential decrease in intensity over a time period of approximately 4 ms. Peaks of decreasing intensity are mutually separated by a time gap of approximately 2 ms.

Features of the wakeup state acoustic emission spectra may be used for investigating the mechanism responsible for the generation of acoustic emission by the CPU. Particularly, the rise and fall times of the acoustic emission during wakeup are significantly lower than the time taken for the PCB hosting the CPU to heat, according to calculations by the present inventors based on the thermal diffusivity of the CPU. This suggests that the acoustic emission arises directly from charge-lattice interactions, such as electron-phonon scattering, leading to atomic motion of the host lattice rather than being due to indirect heating effects.

Figure 7C:
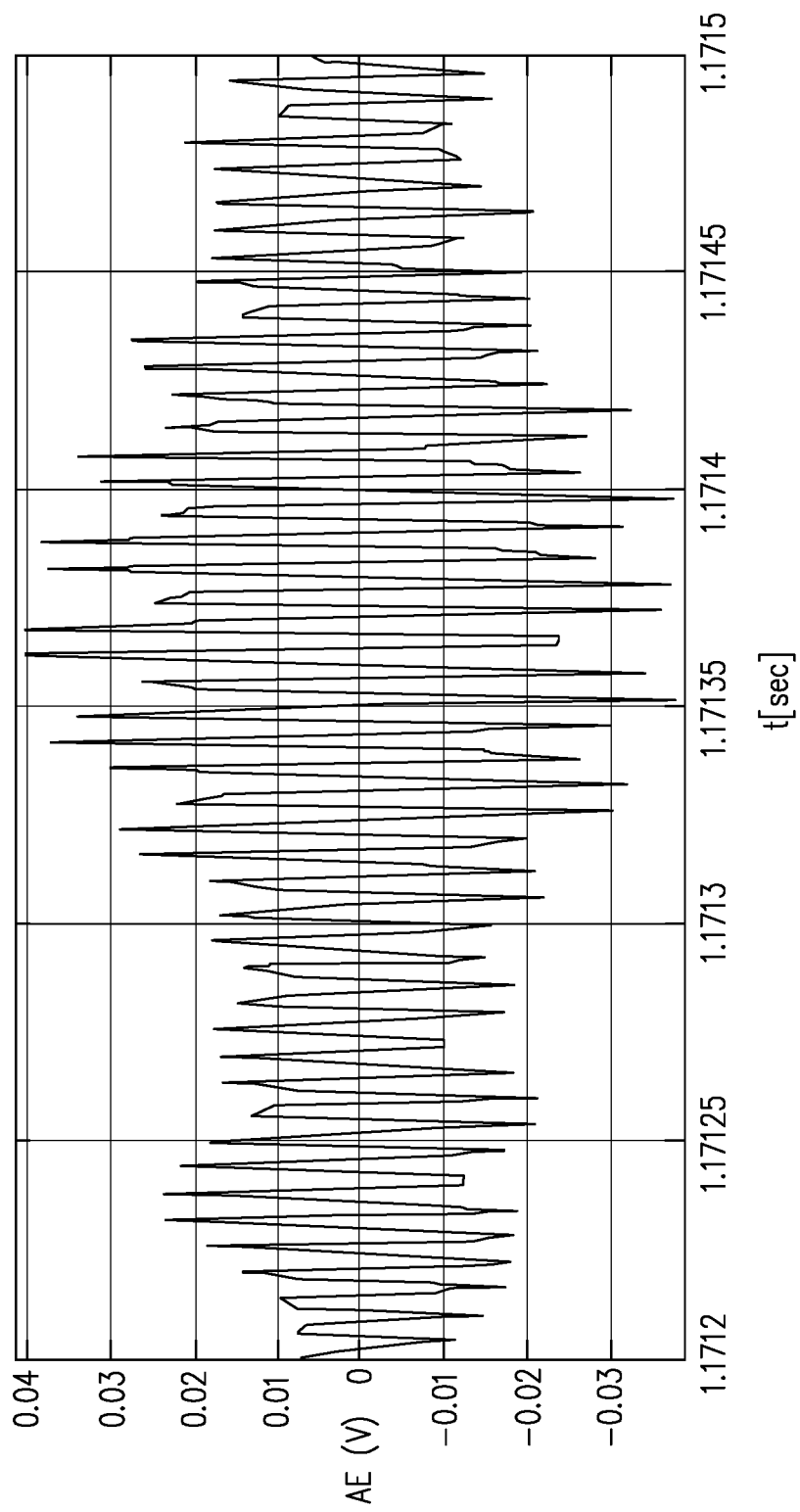

As seen in FIG. 7C, illustrating an enlargement of a region 732 of graph 730, peaks in the wakeup region 710 are characterized by a dominant frequency of approximately 166 KHz.

Figure 7D:
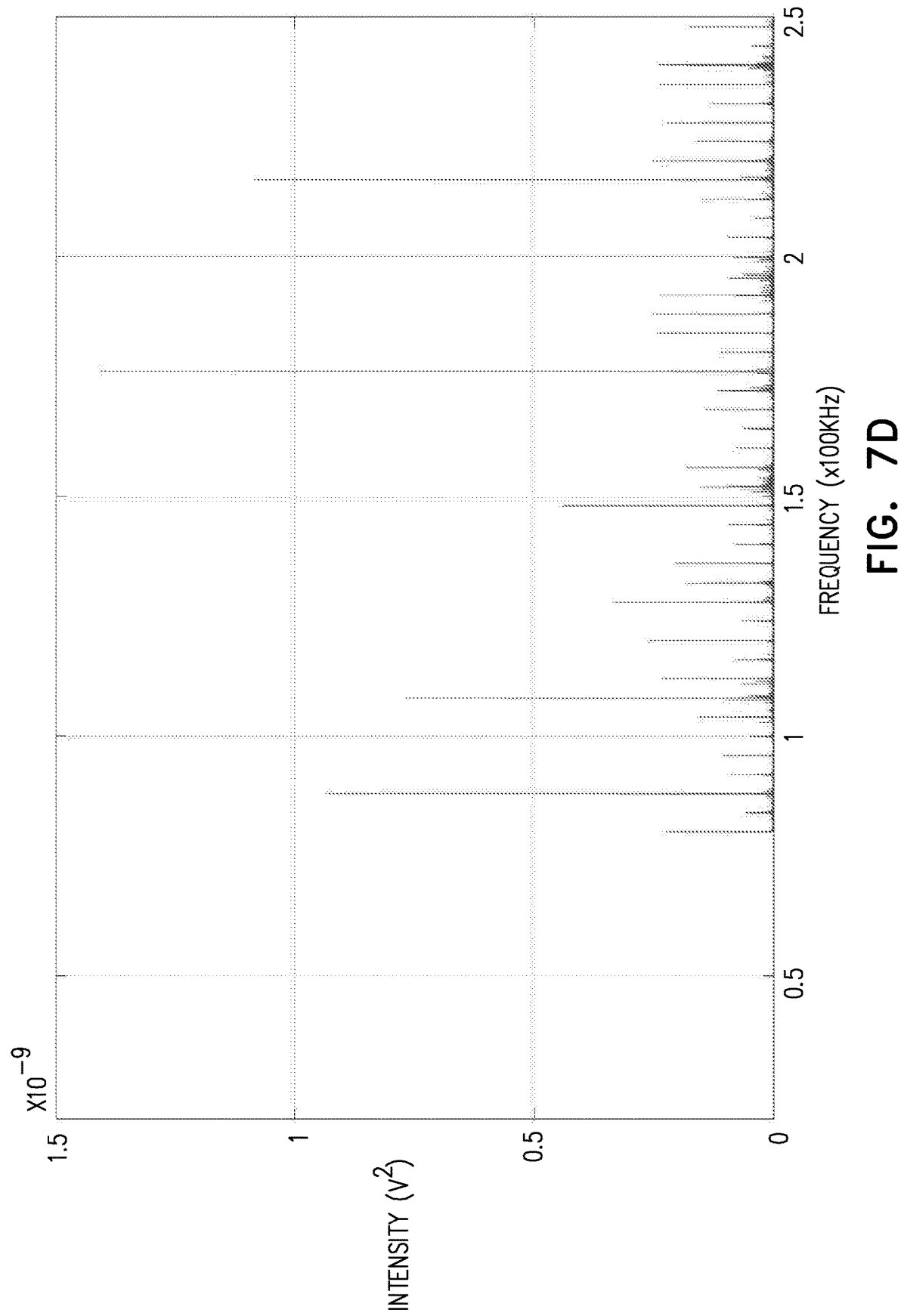
Figure 7E:
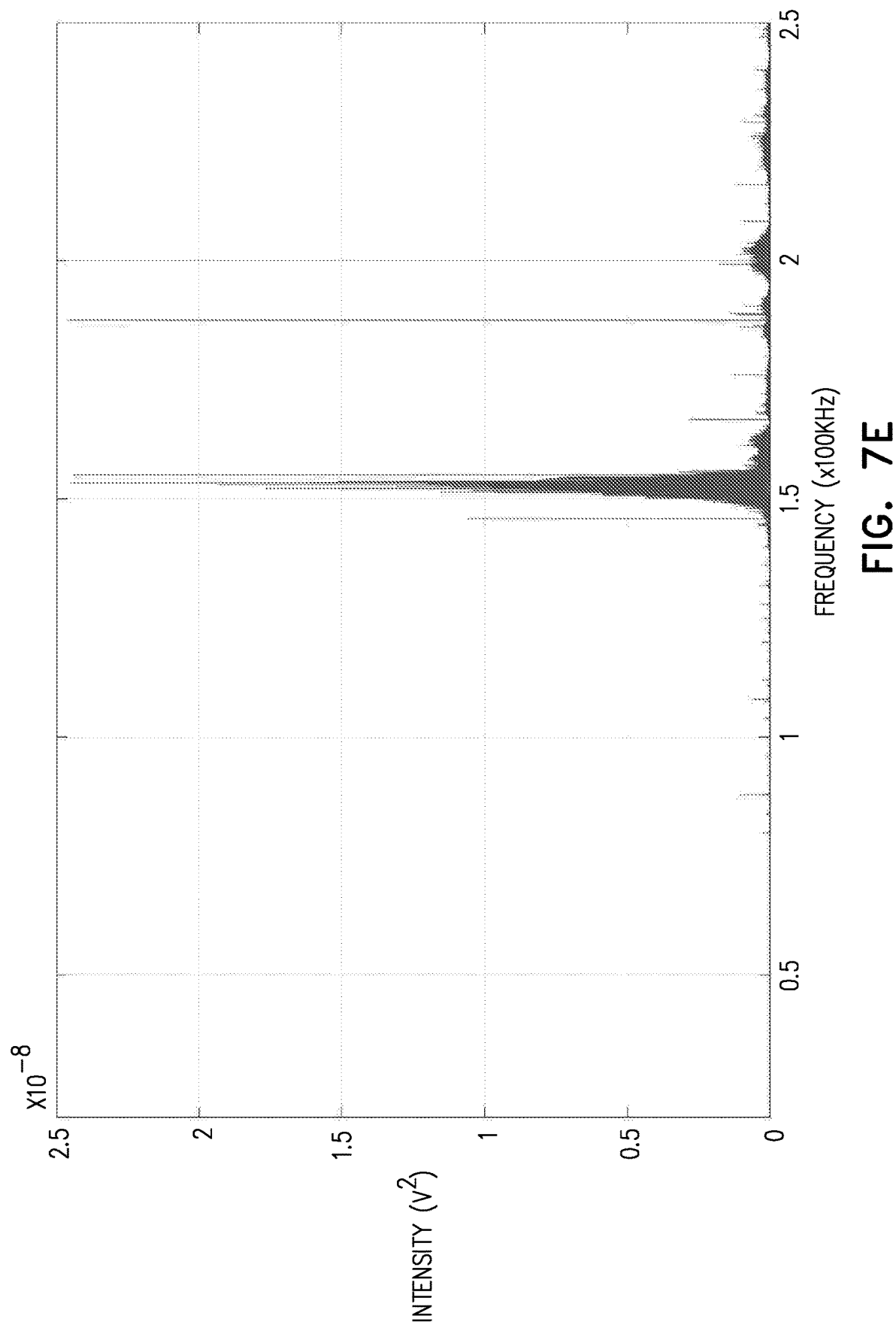
Figure 7F:
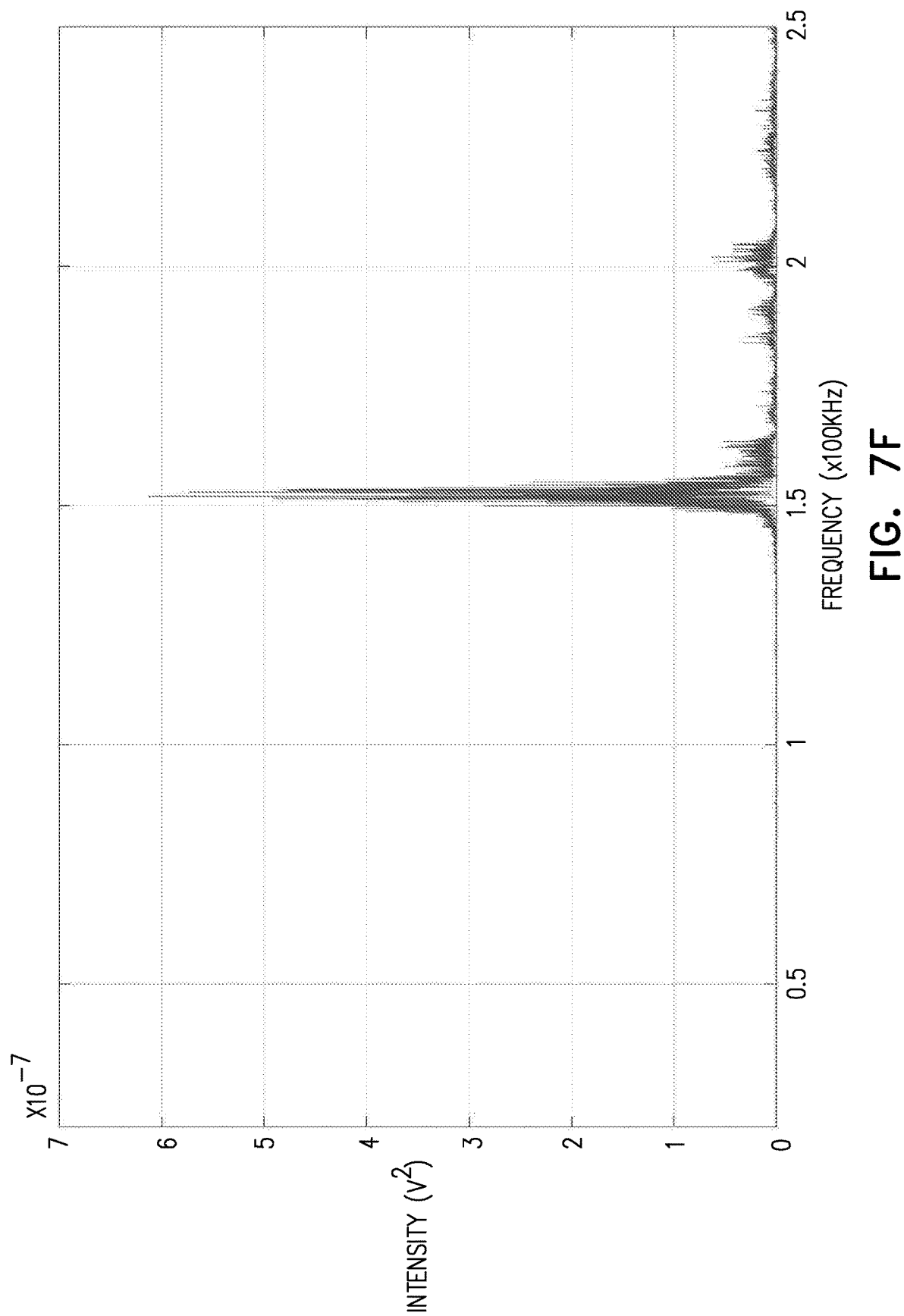

The frequency domain acoustic emission intensity spectra generated by the CPU as measured by first physically contacting acoustic emission sensor 502 are displayed in FIGS. 7D, 7E and 7F, respectively displaying the power spectra for the flash memory in an idle, actively operating and wakeup state. The data displayed corresponds to the raw data in the frequency domain following application of a 50 kHz high pass filter.

As clear from consideration of FIGS. 7D-7F, a significantly higher acoustic emission power was measured in the wakeup and operative states, in comparison to the idle state, with the wakeup and operative states having acoustic emission intensity of the order of $10^{-8}$ and $10^{-7}$ $V^2$ in contrast to the idle state having acoustic emission intensity of the order of $10^{-9}$ $V^2$. Furthermore, the acoustic emission intensity spectra in the wakeup and operative states exhibit mutually difference acoustic emission features and signatures, allowing the acoustic emission spectra corresponding to the various operating states of the DUT to be readily identified and classified. Additionally, with respect to the wakeup state intensity spectrum displayed in FIG. 7F, a power peak is seen at approximately 166 KHz, corresponding to the dominant frequency of 166 kHz visible in FIG. 7C. The dominant frequency associated with the wakeup state of the CPU is an additional feature of the acoustic emission that may be used in order to identify the CPU operating state and detect anomalies thereof.

The frequency domain acoustic emission power spectra generated by the CPU as measured by second non-physically contacting microphone 506 are displayed in FIGS. 7G, 7H and 7I, respectively displaying the power spectra for the CPU in a wakeup, actively operating and idle state. The data displayed corresponds to the raw data in the frequency domain following application of a 50 kHz high pass filter.

As clear from consideration of FIGS. 7G-7I, a significantly higher acoustic emission intensity was measured by microphone 506 in the wakeup and operative states, in comparison to the idle state. Furthermore, the acoustic emission intensity spectra in the wakeup and operative states exhibit mutually difference acoustic emission features and signatures, allowing the acoustic emission spectra corresponding to the various operating states of the DUT to be readily identified and classified. Additionally, with respect to the wakeup state spectrum displayed in FIG. 7G, a power peak is seen at approximately 166 KHz, corresponding to the dominant frequency of 166 kHz visible in FIG. 7C. The dominant frequency associated with the wakeup state of the CPU is an additional feature of the acoustic emission that may be used in order to identify the CPU operating state and detect anomalies thereof.

As appreciated from a comparison of FIGS. 7D- 7F to FIGS. 7G-7I, the acoustic emission intensity as measured by physically contacting sensor 502 is greater than and different to that measured by non-physically contacting microphone 506. This is attributable to attenuation of the signal over the distance between the microphone 506 and the CPU, the acoustic transfer function that is orientation dependent with respect to the microphone and possible blocking of the acoustic emission by the sensor 502 due to sensor 502 resting on the surface of the CPU.

Statistical features of the acoustic emission generated by the CPU in various operating states thereof, as measured by the acoustic emission sensor 502 and non-contacting microphone 506, are tabulated in Tables 3 and 4 respectively.

TABLE 3

Statistical features of acoustic emission generated by
CPU in various operating states thereof, as measured by
physically contacting acoustic emission sensor 502

| Feature | Idle state | Wake-up state | Active operating state |
|---|---|---|---|
| Rms | $3.5 \times 10^{-4}$ | 0.0041 | 0.0034 |
| Std | $3.5 \times 10^{-4}$ | 0.0041 | 0.0034 |
| Skewness | $-3.5 \times 10^{-12}$ | $3 \times 10^{-9}$ | $4.8 \times 10^{-11}$ |
| Kurtosis | $1.1 \times 10^{-13}$ | $3.6 \times 10^{-9}$ | $3.5 \times 10^{-10}$ |

TABLE 4

Statistical features of acoustic emission generated by
CPU in various operating states thereof, as measured by
non-physically contacting microphone 506

| Feature | Idle state | Wake-up state | Active operating state |
|---|---|---|---|
| Rms | 0.015 | 0.015 | 0.015 |
| Std | 0.015 | 0.015 | 0.015 |
| Skewness | $-7.5 \times 10^{-10}$ | $-8.4 \times 10^{-10}$ | $-1.2 \times 10^{-11}$ |
| Kurtosis | $1.59 \times 10^{-11}$ | $1.4 \times 10^{-11}$ | $1.62 \times 10^{-11}$ |

As appreciated from consideration of the values presented in Tables 3 and 4, large variations are seen in some statistical features of acoustic emission generated by the CPU in various operating states thereof, as measured by both physically and non-physically contacting acoustic emission sensors. These large variations in statistical features associated with acoustic emission in the various operating states of the device, allow the use of statistical analysis and machine-learning algorithms for automatically classifying an operating state of the device as well as identifying possible anomalies in the acoustic emission features arising from faulty or malicious device operation.

As seen in Tables 3 and 4, the rms and standard deviation values in each case are generally equal, since the mean value of the measured acoustic emission is approximately zero.

Figure 7K:
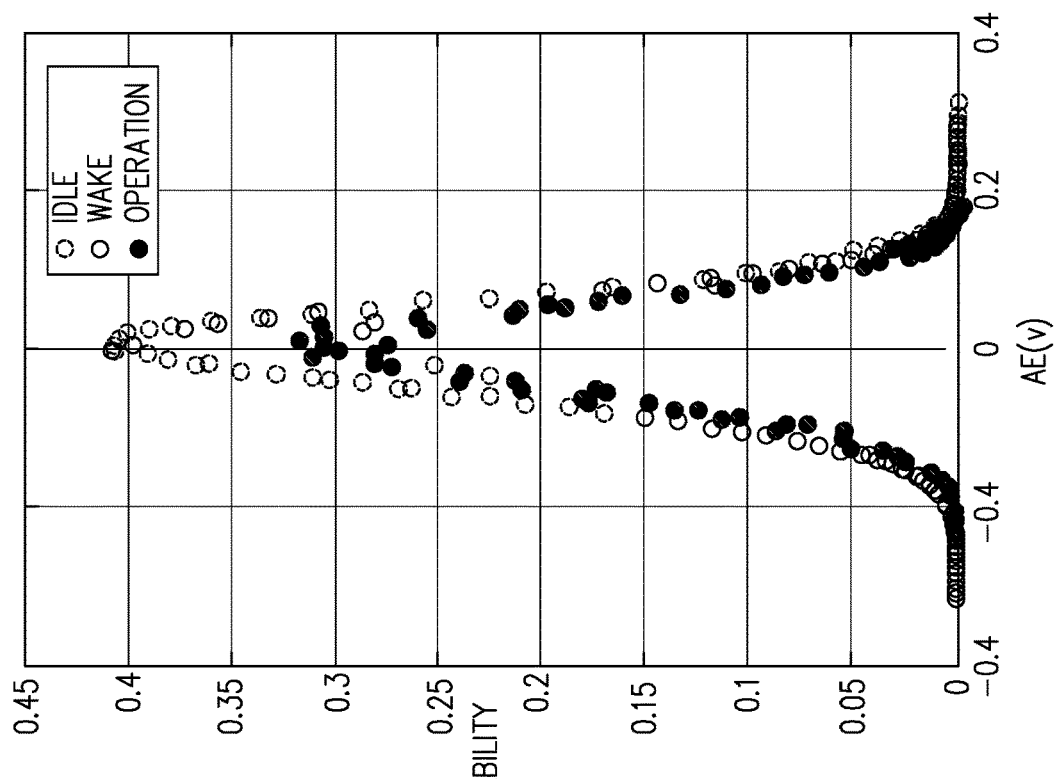
FIGS. 7J and 7K are graphical representations of statistical features of the data displayed in FIGS. 7A-7E.
Figure 7J:
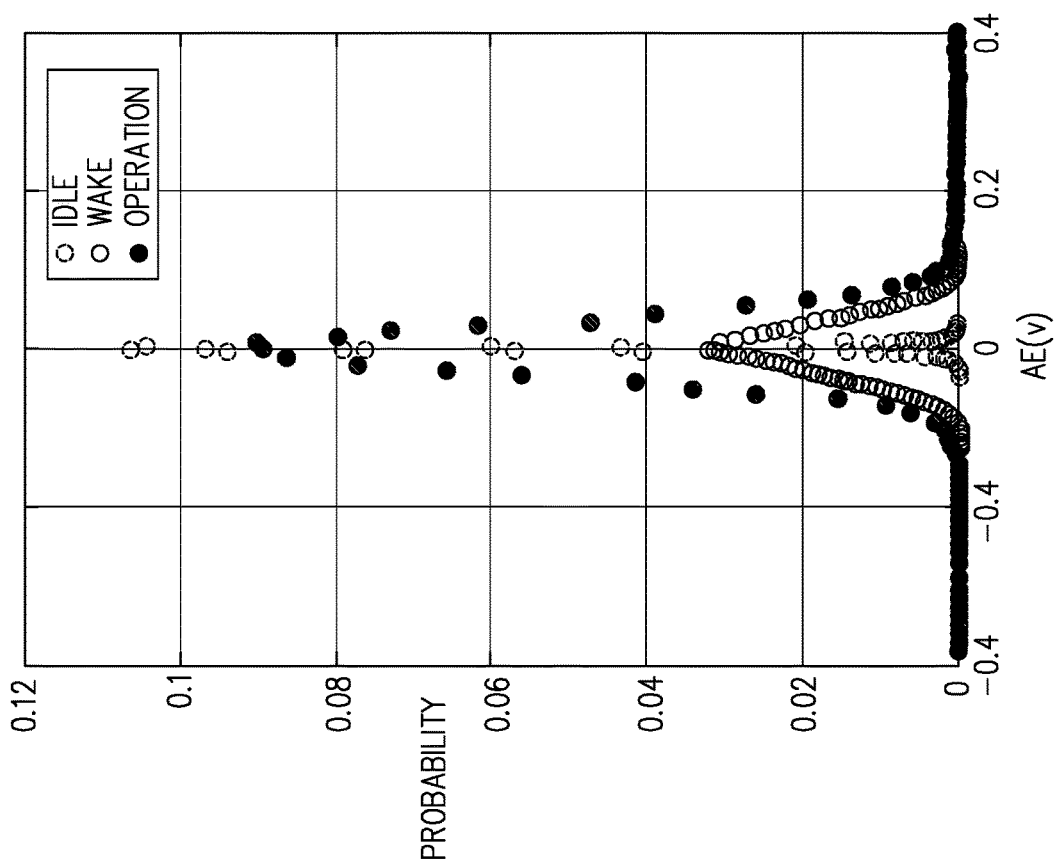

Probability distribution functions reflecting the statistical features of the various operating states of the CPU, as measured by the sensor 502 and microphone 506, are displayed in FIGS. 7J and 7K respectively. The probability distribution functions illustrate variations in statistical features of the spectra associated with the various operating states, allowing the use of higher order statistical moments as well as cumulants and other statistical measures for differentiating between and identifying various operating states of the device under test and detecting faulty operation and incipient failure thereof.

1.3 Acoustic Emission Monitoring of a CPU in Various States, on an Additional PCB.

An experimental set-up generally resembling teat shown FIG. 5, but including only physically contacting sensor 502 connected to a preamplifier and spectrum analyzer, was used to monitor acoustic emission generated by a CPU mounted on a PCB Odroid board.

Figure 8:
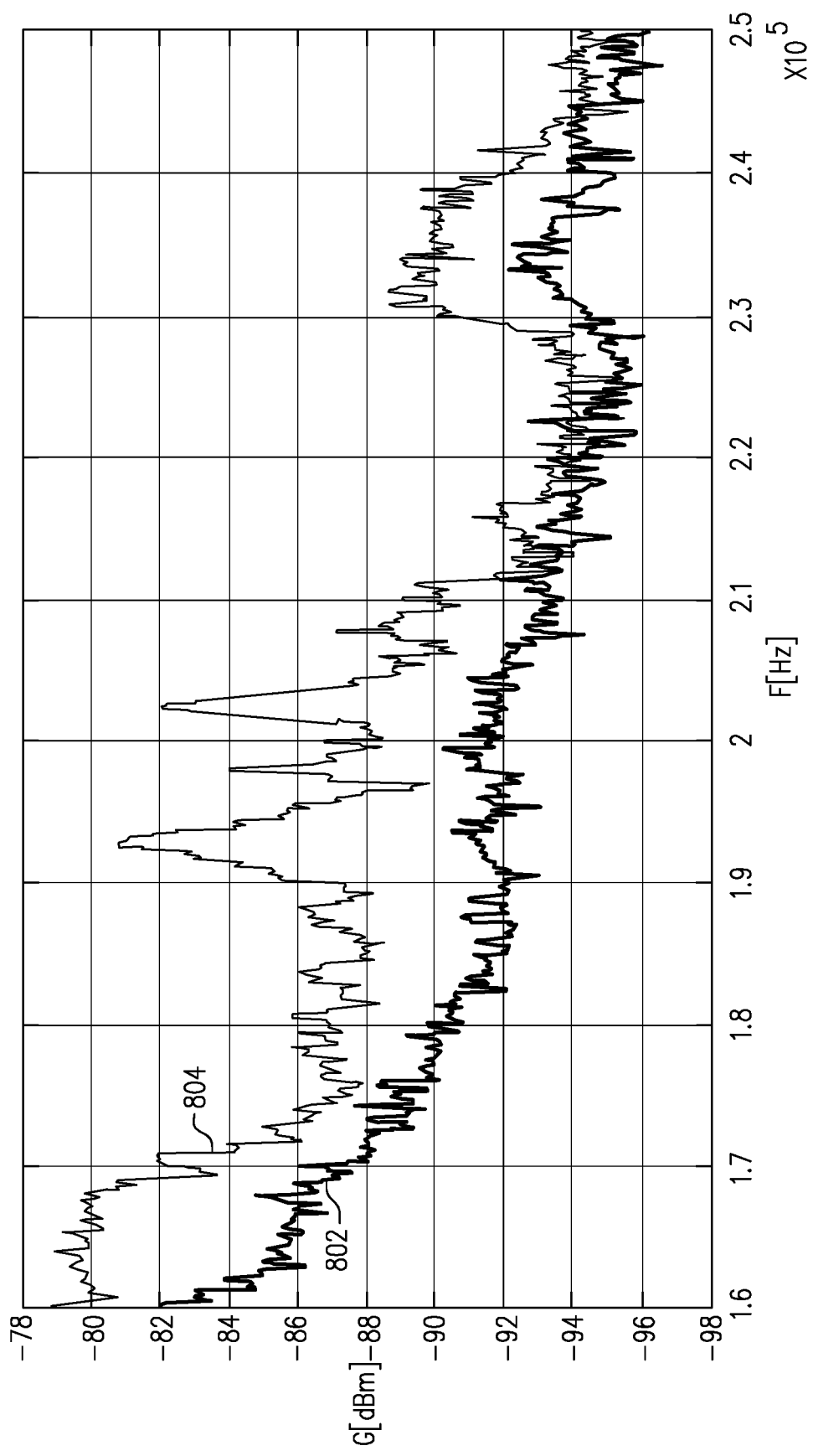
FIG. 8 is a graph displaying frequency domain acoustic emission signals arising from a central processing unit on a printed circuit board, as measured by a physically contacting acoustic emission sensor in a system of a type similar to that illustrated in FIG. 5.

Acoustic emission energy as a function of frequency as measured by sensor 502 when the CPU was in an on state and an off state is presented in FIG. 8. As seen in FIG. 8, the acoustic emission energy during the off state of the CPU is represented by a first trace 802 and the acoustic emission energy during the on state of the CPU is represented by a second trace 804. As appreciated from a comparison of traces 802 and 804, the acoustic emission energy is seen to increase significantly during operation of the CPU in comparison to when the CPU is off. This indicates that acoustic emission monitoring of low power devices such as a CPU on a commercial PCB may be useful for identifying operating states of the device and detecting development or presence of faults in the device based on deviations from predetermined or machine-learned features associated with the acoustic emission generated during various states of the device operation.

2. Experimental Data Relating to Measurable Acoustic Emission Generated by Electronic Components on a PCB, as Measured From the PCB Reference is now made to FIG. 9, which is a simplified block-diagram illustration showing an acoustic emission monitoring system, constructed and operative in accordance with another preferred embodiment of the present invention and used by the present inventors for measuring acoustic emission generated by one or more electronic components on a PCB, based on measurements made from the PCB itself.

Figure 9:
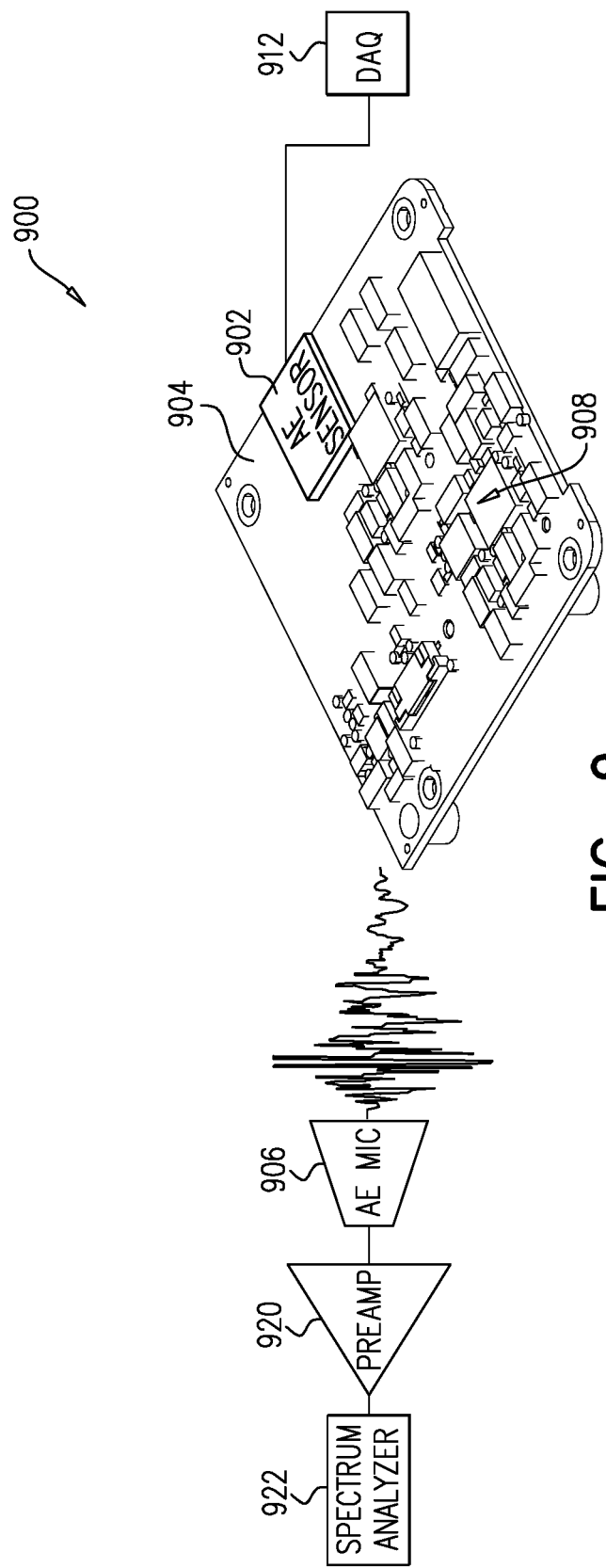
FIG. 9 is a simplified block-diagram illustration showing an acoustic emission monitoring system, constructed and operative in accordance with another preferred embodiment of the present invention.

As seen in FIG. 9, there is provided an acoustic emission monitoring system 900 preferably including at least one acoustic emission sensor, here embodied, by way of example, as a first acoustic emission sensor 902 preferably in physical contact with a DUT 904 and a second acoustic emission sensor 906, preferably not in physical contact with the DUT 904. In the experiments reported hereinbelow, first acoustic emission sensor 902 was a 150 kHz R15a ultrasonic sensor manufactured by MISTRAS of NJ, USA and second acoustic emission sensor 906 was an airborne ultrasonic microphone SPU410LR5H-QB manufactured by Knowles of IL, USA. First and second acoustic emission sensors 902 and 906 were each enclosed in a Faraday cage in order to shield them from EM radiation.

Here, DUT 904 is shown to be embodied as a PCB with at least one electronic component 908 mounted thereon, first acoustic emission sensor 902 preferably being in physical contact with surface of the PCB itself, rather than directly with the electronic component 908. It is appreciated, however, that sensor 902 may additionally or alternatively be in direct physical contact with at least one of electronic components 908, in addition to with the PCB board 904 itself.

First acoustic emission sensor 902 is preferably connected to a data acquisition unit 912. Second acoustic emission sensor 906 is preferably connected to a preamplifier 920, which preamplifier 920 is preferably connected to a spectrum analyzer 922. In the experiments reported hereinbelow, data acquisition unit 912 was an NI-6351 data acquisition unit, manufactured by National Instruments of Texas, USA. Spectrum analyzer 922 was an E4402B spectrum analyzer, manufactured by Keysight of California, USA having a 1 kHz resolution bandwidth.

Preamplifier 920 was set to a gain of approximately 30-40 dB. The sampling frequency of DAQ 912 was set to 117 kHz. A low pass filter was connected upstream of preamplifier 920 for signal integrity testing.

2.1 Acoustic Emission Measurements of a Microcontroller on a PCB in Two Operating States, Using Physically Contacting Acoustic Emission Sensor An experimental set-up generally resembling that shown in FIG. 9 was used to monitor acoustic emission generated by a PCB-mounted microcontroller with an operating voltage of 3.3 V. Acoustic emission sensor 902 was located directly on top of the microcontroller, so as to be in direct physical contact therewith.

Figure 10A:
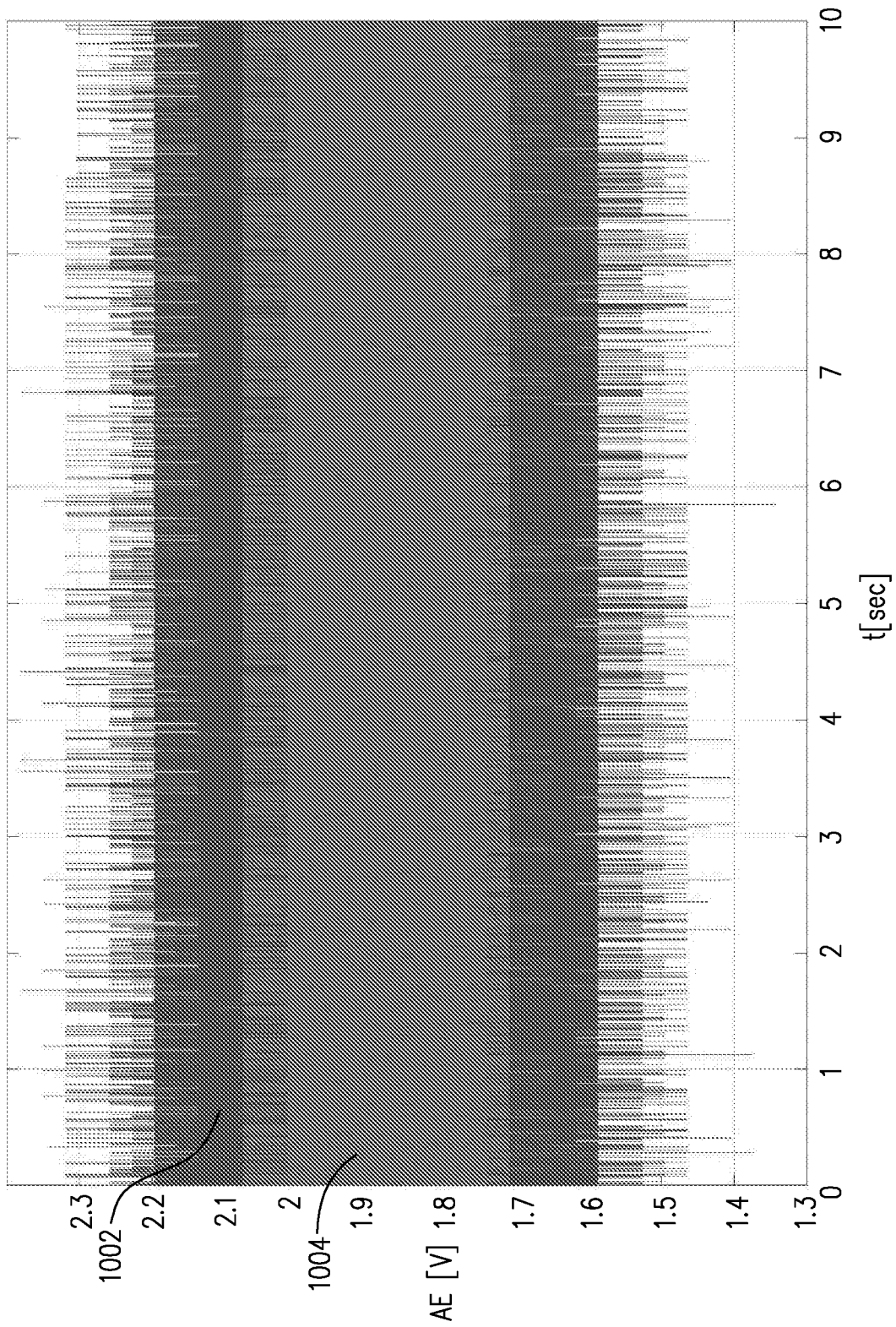
FIGS. 10A and 10B are graphs respectively displaying time and frequency domain acoustic emission signals arising from a microcontroller on a printed circuit board, as measured by physically contacting acoustic emission sensor in a system of the type illustrated in FIG. 9.
Figure 10B:
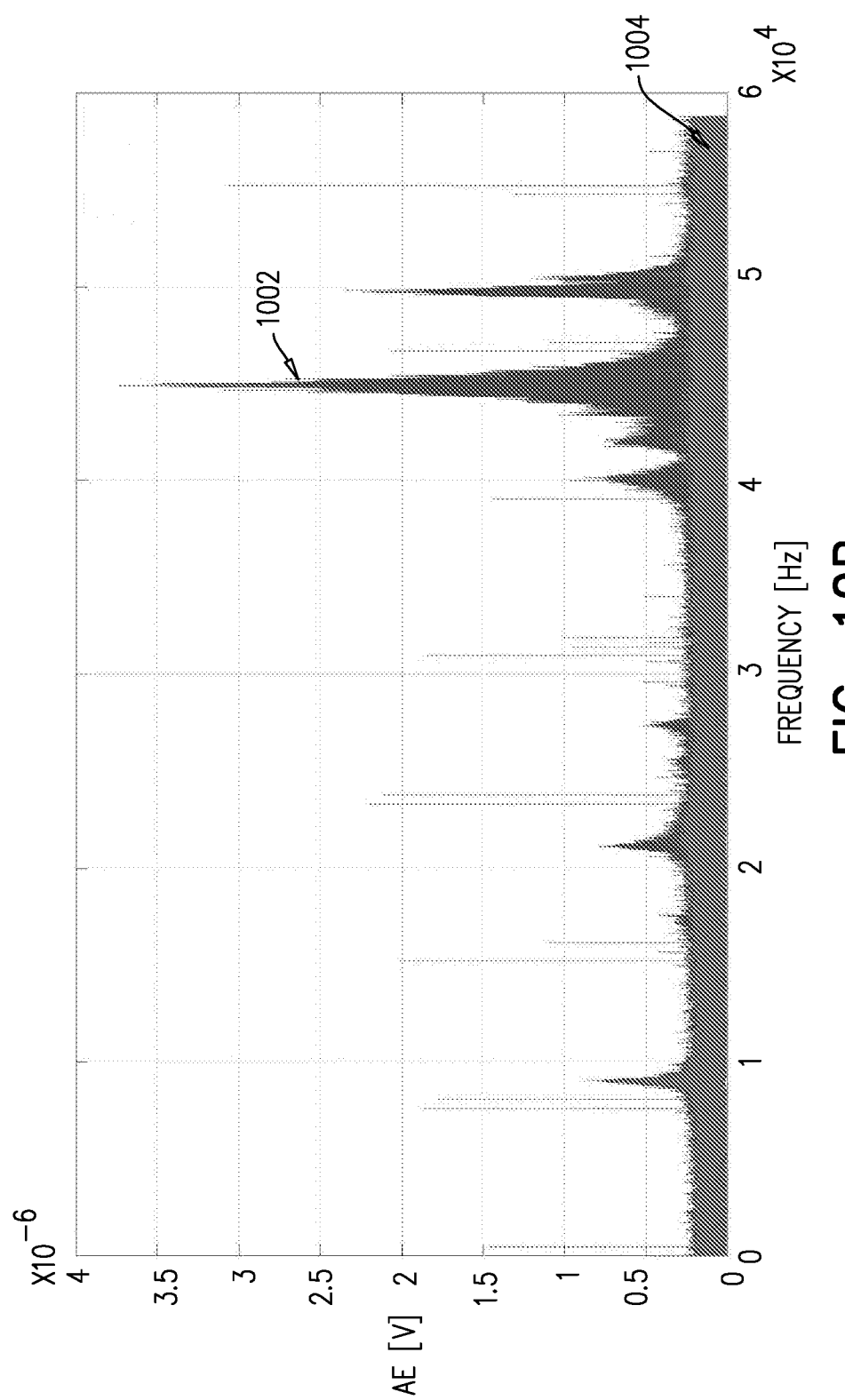

Acoustic emission generated by the microcontroller was monitored during two operational states: a powered 'on' state and a non-powered 'off' state. Acoustic emission intensity as a function of time and frequency is displayed in FIGS. 10A and 10B respectively, as measured by physically contacting sensor 902. As seen both in the time domain (FIG. 10A) and frequency domain (FIG. 10B), measured acoustic emission in an 'on' state, as represented by reference numeral 1002 is significantly enhanced in comparison to measured acoustic emission in an 'off' state, as represented by reference numeral 1004.

Figure 11:
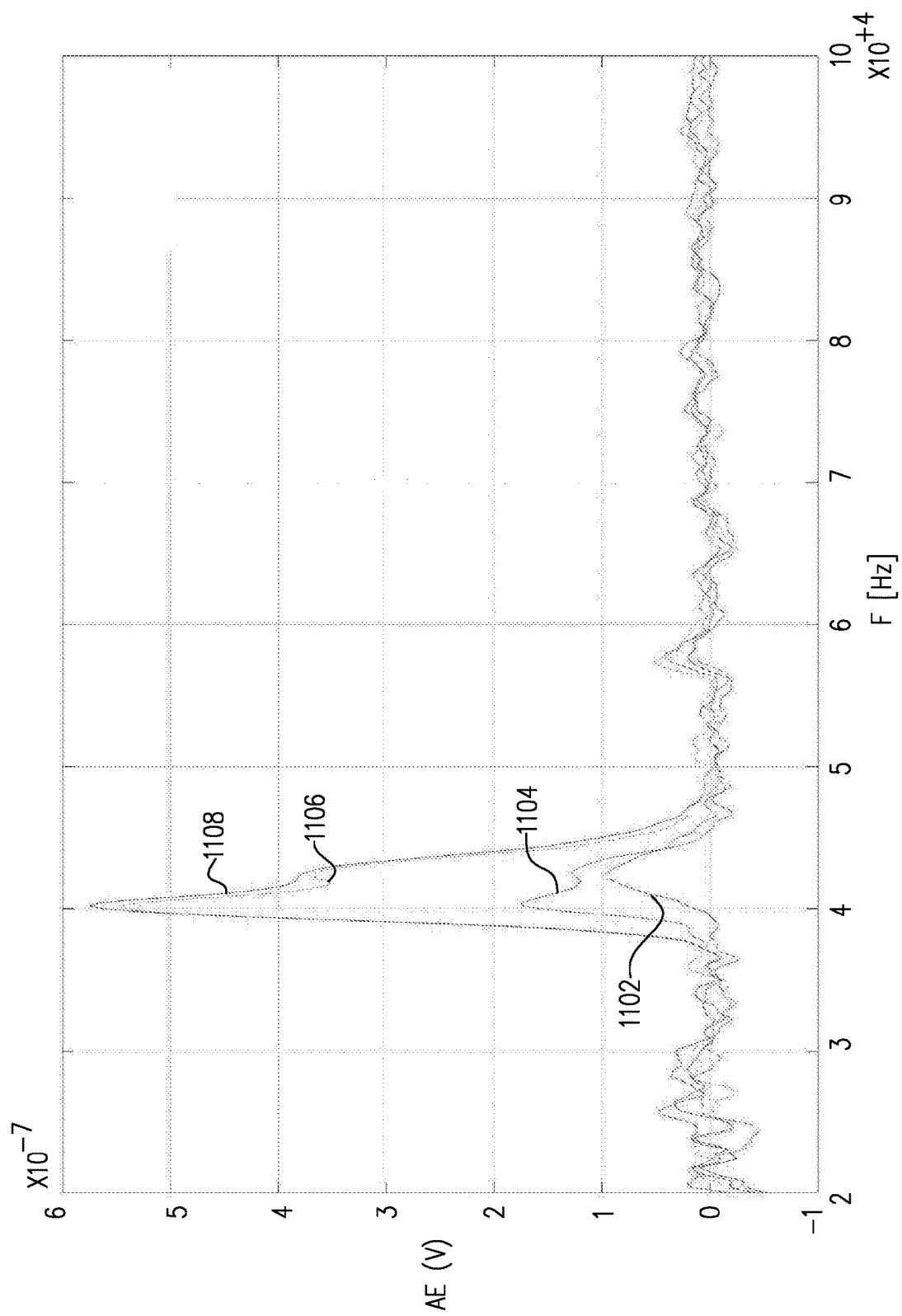
FIG. 11 is a graph displaying frequency domain acoustic emission signals arising from a microcontroller on a printed circuit board, as measured by a non-physically contacting acoustic emission sensor in a system of the type illustrated in FIG. 9.

Acoustic emission as a function of frequency is displayed in FIG. 11, as measured by microphone 906. The acoustic emission sensor within the microphone was approximately 1 cm distant from the microcontroller. Acoustic emission generated by the microcontroller was monitored during four operational states of the microcontroller: a non-powered 'off' state, a 'sleep' mode, an 'idle' mode and an active 'sampling' mode.

As seen in FIG. 11, acoustic emission when the device is in an off mode is represented by a first trace 1102, acoustic emission when the device is in a sleep mode is represented by a second trace 1104, acoustic emission when the device is in an idle mode is represented by a third trace 1106 and acoustic emission when the device is in an active sampling mode is represented by a forth trace 1108.

As appreciated from a comparison of traces 1102-1008, acoustic emission when the microcontroller is in a powered state is significantly enhanced in comparison to acoustic emission when the device is in an off or sleep mode. Furthermore, acoustic emission energies are seen to differ between the idle and sleep modes, with the microcontroller generating significantly less acoustic emission in the sleep mode in comparison to the idle mode. These results indicate that measurable differences in acoustic emission may be detected and thus used to distinguish between different operational states of a microcontroller mounted on a PCB in the case of the acoustic emission being measured by a non-physically contacting acoustic emission sensor.

These results indicate that measurable differences in acoustic emission may be detected and thus used to distinguish between on and off operational states of a microcontroller device mounted on a PCB. It is understood that the measured acoustic emission originates with the microcontroller device in both the on and off states thereof. The microcontroller is thus itself the source of the acoustic emission and is not simply a reflecting a portion of an acoustic signal received from an external source.

2.2 Acoustic Emission Measurements of a PCB Hosting Various Electronic Components in Two Operating States, Using Physically Contacting Acoustic Emission Sensor An experimental set-up generally resembling that shown in FIG. 9 was used to monitor a PCB hosting a 3.3V micro-controller in addition to a variety of low-power electrical components including lumped components, an amplifier and analogue-to-digital converter. Sensor 902 was located atop of the underside of the PCB, so as to be in direct physical contact therewith. The electrical circuit included in the PCB was designed to transfer acquired signal from the ultrasound sensor to a mobile phone. The sampling frequency of the data acquisition unit was set to 300 KHz.

Acoustic emission by the PCB was monitored during a powered operating state and a non-powered 'off state', as well as during intermediate 'wakeup', sleep' and 'shutdown' states.

Figure 12A:
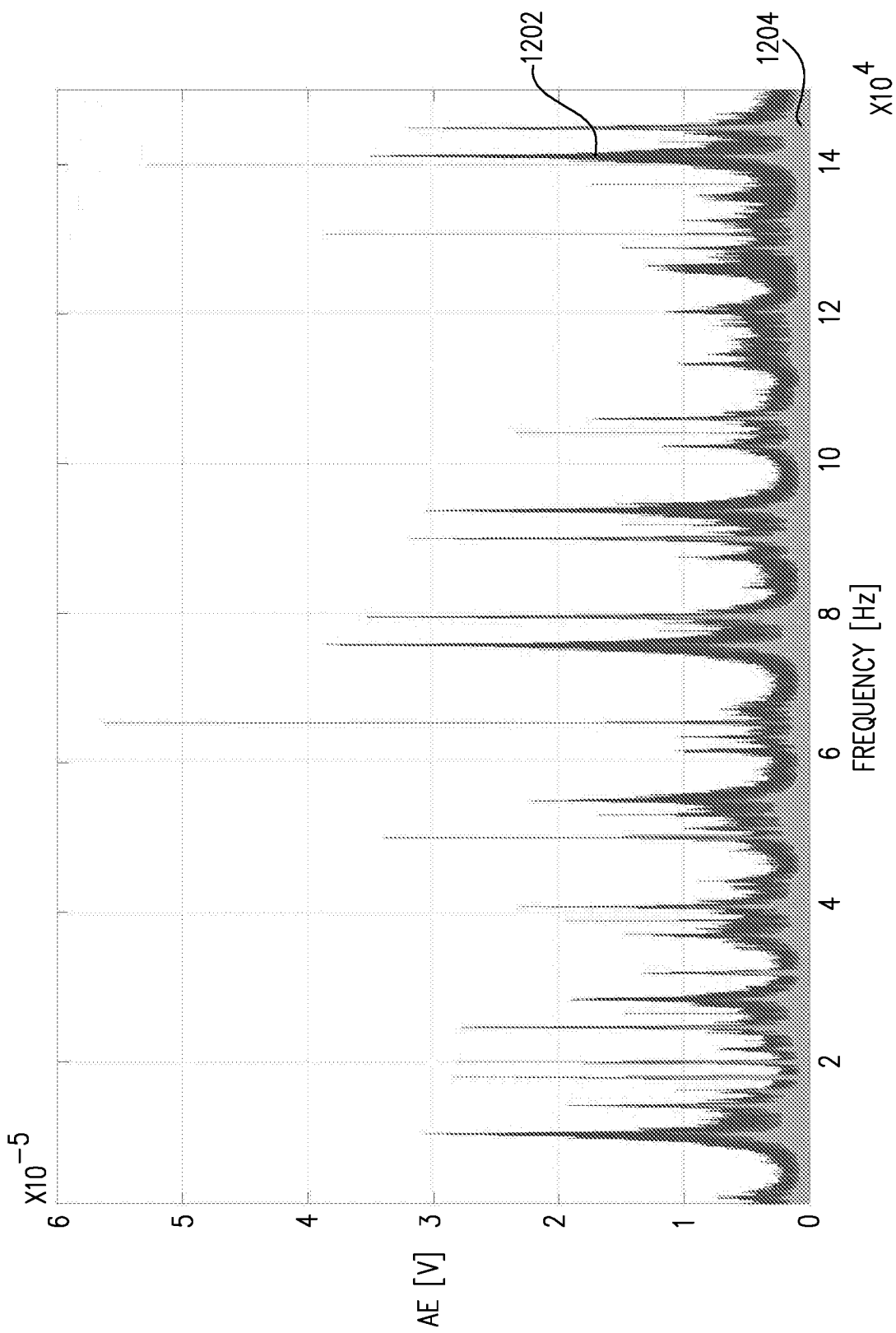
FIGS. 12A and 12B are graphs respectively displaying frequency and time domain acoustic emission signals arising from a printed circuit board hosting various electronic components, as measured by a physically contacting acoustic emission sensor in a system of the type illustrated in FIG. 9.
Figure 12B:
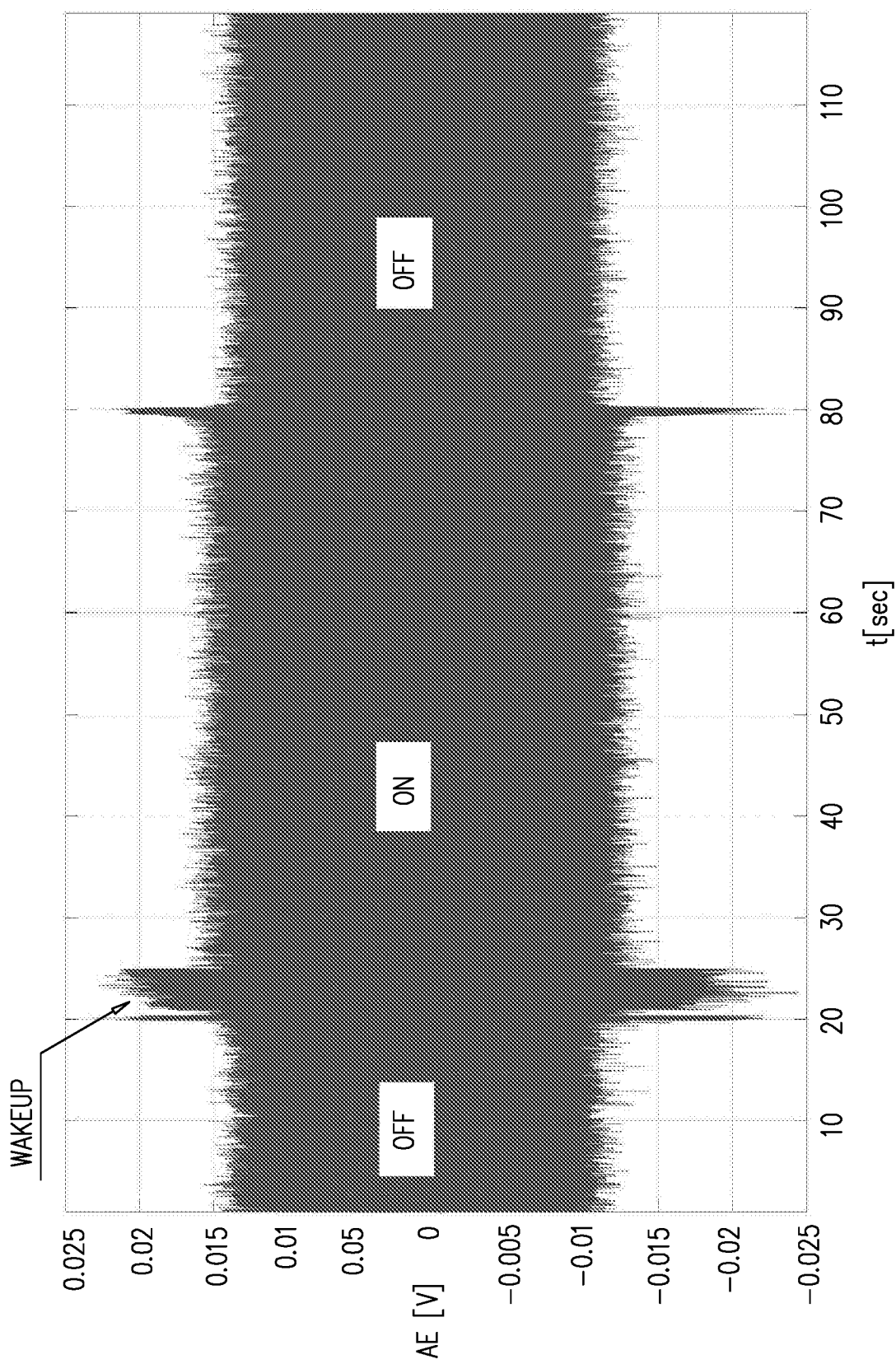

Measured acoustic emission intensity as a function of frequency and time is displayed in FIGS. 12A and 12B respectively. As seen both in the frequency domain (FIG. 12A) and time domain (FIG. 12B), measured acoustic emission during operation 1202 of the PCB is significantly enhanced in comparison to measured acoustic emission when the PCB is off 1204. An increase of 11% was found between the rms of the PCB 'on' state in comparison to that of the PCB 'of' state. Furthermore, an increase of 55% was found between the rms of the PCB 'wakeup', 'sleep' and 'shutdown' states in comparison to that of the PCB 'off' state. The statistical moments of the signal were also found to differ between the various states.

The significant increase in AE emission during wakeup indicates that changes in AE emission may reflect electrical instability in a monitored device or PCB. It is particularly noteworthy that measurable differences between AE emission in the various operational states were found, despite ultrasonic damping and smearing effects expected to be caused by the PCB itself. These results indicate that measurable differences in acoustic emission may be detected and thus used to distinguish between different operational states of semiconductor components on a PCB.

2.3 Acoustic Emission Measurements of a PCB Hosting Various Electronic Components in Heated and Non-Heated States, Using Physically Contacting Acoustic Emission Sensor An experimental set-up generally resembling that shown in FIG. 9 was used to monitor a PCB hosting a 3.3V micro-controller in addition to a variety of low-power electrical components including lumped components, an amplifier and. analogue-to-digital converter. Sensor 902 was located atop of the underside of the PCB, so as to be in direct physical contact therewith. The electrical circuit included in the PCB was designed to transfer acquired signal from the ultrasound sensor to a mobile phone. The sampling frequency of the data acquisition unit was set to 600 KHz. A 200 Ohm resistor was connected to a power source and to the PCB ground.

Acoustic emission by the PCB was monitored during two operational states: a first operating state in which the resistor was non-powered and a second operating state in which the resistor was powered and thereby heated, thus exerting thermal stress on the PCB.

Figure 13:
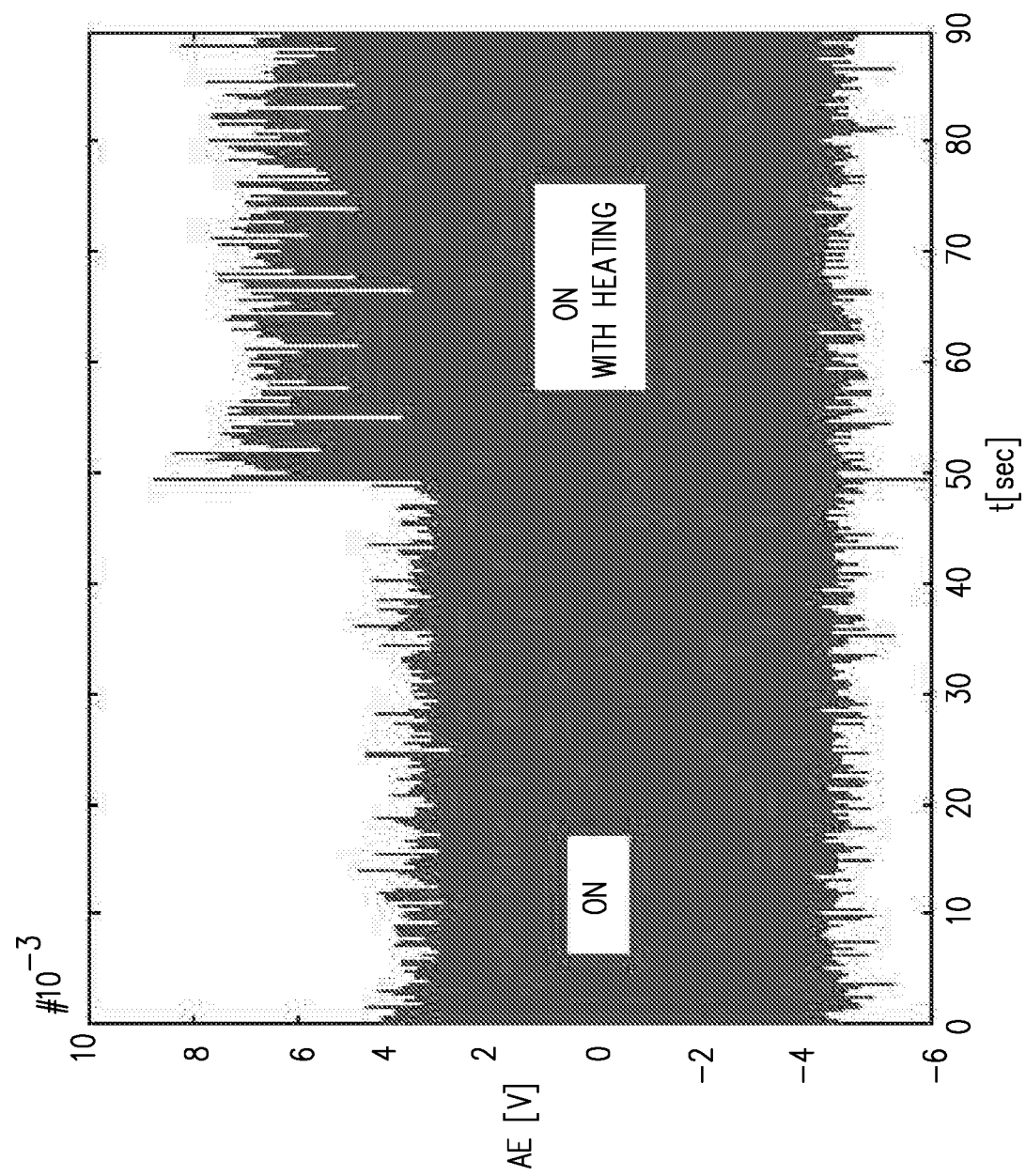
FIG. 13 is a graph displaying time domain acoustic emission signals arising from a printed circuit board hosting various electronic components and under thermal stress, as measured by a physically contacting acoustic emission sensor in a system of the type illustrated in FIG. 9.

Measured acoustic emission intensity as a function of time is displayed in FIG. 13. Spikes in measured acoustic emission are seen in the time domain as well as changes in the statistical moments of the measured signal. These spikes may be attributable to temperature fluctuations or to voltage fluctuations caused by instability in the PCB grounding. The presence of these spikes support the hypothesis that electrical instability influences AE spectral energy, and thus changes in AE spectral energy and statistical features thereof may be used to detect or predict electrical failure.

2.4 Acoustic Emission Measurements of a PCB Hosting Various Electronic Components in Mechanically Stressed and Non-Mechanically Stressed States Using Physically Contacting Acoustic Emission Sensor An experimental set-up generally resembling that shown in FIG. 9 was used to monitor a PCB hosting a 3.3V micro-controller in addition to a variety of low-power electrical components including lumped components, an amplifier and analogue-to-digital converter. Sensor 902 was located atop of the underside of the PCB, so as to be in direct physical contact therewith. The electrical circuit included in the PCB was designed to transfer acquired signal from the ultrasound sensor to a mobile phone. The sampling frequency of the data acquisition unit was set to 600 KHz.

Acoustic emission by the PCB was monitored during two operational states: a first regular operating state and a second operating state in which mechanical stress was applied to the PCB by way of clamping. In the second operating state, the lateral surface of the PCB was embedded between clamps and a mechanical stress in the range of several Newtons applied to the PCB, resulting in the bending of the PCB. Acoustic emission measurements were taken at a steady state for which the applied force was constant.

Figure 14:
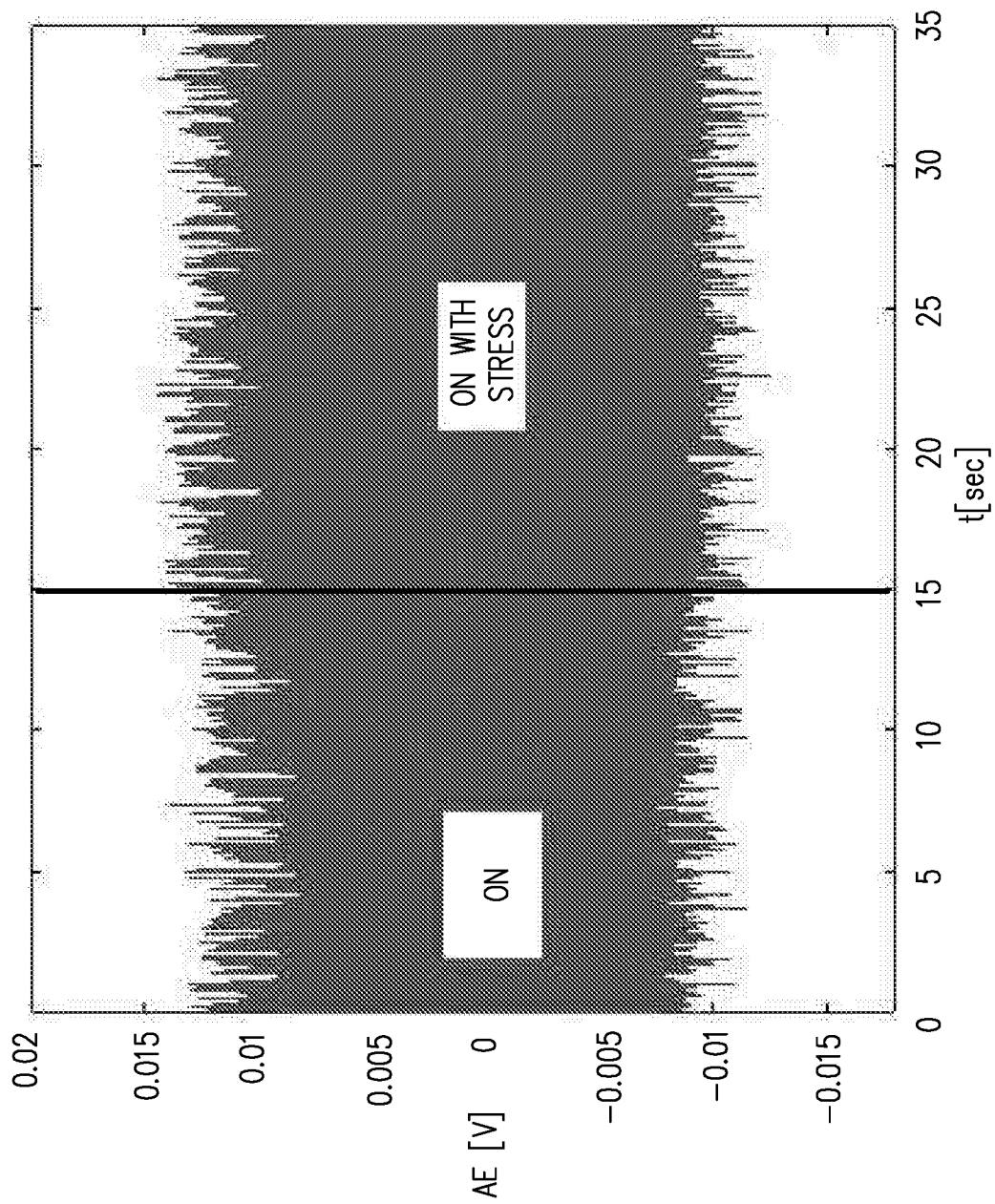
FIG. 14 is a graph displaying time domain acoustic emission signals arising from a printed circuit board hosting various electronic components and under mechanical stress, as measured by a physically contacting acoustic emission sensor in a system of the type illustrated in FIG. 9.

Measured acoustic emission intensity as a function of time is displayed in FIG. 14. As seen most clearly in the dine domain in FIG. 14, measured acoustic emission during operation of the PCB under mechanical stress is enhanced in comparison to measured acoustic emission when mechanical stress is not applied. An increase of 10% was found between the rms of the PCB mechanically-stressed state in comparison to that of the PCB regular, non-stressed state. Furthermore, significant statistical differences were found between the signal distributions in the two states, including a difference in skewness of 38%.

These results indicate that the exertion of mechanical stress on a PCB hosting low-power semiconductor devices leads to measurable changes in acoustic emission generated thereby. Changes in acoustic emission, including changes in the statistical distribution of acoustic emission, may therefore be used to detect mechanical stress and predict possible consequent electrical failure.

3. Experimental Data Relating to Measurable Acoustic Emission Generated by Bare Electronic Components, Not Mounted on a PCB Reference is now made to FIG. 15, which is a simplified block-diagram illustration showing an acoustic emission monitoring system, constructed and operative in accordance with a preferred embodiment of the present invention and used by the present inventors for measuring acoustic emission generated by one or more bare electronic components, not mounted on a PCB.

Figure 15:
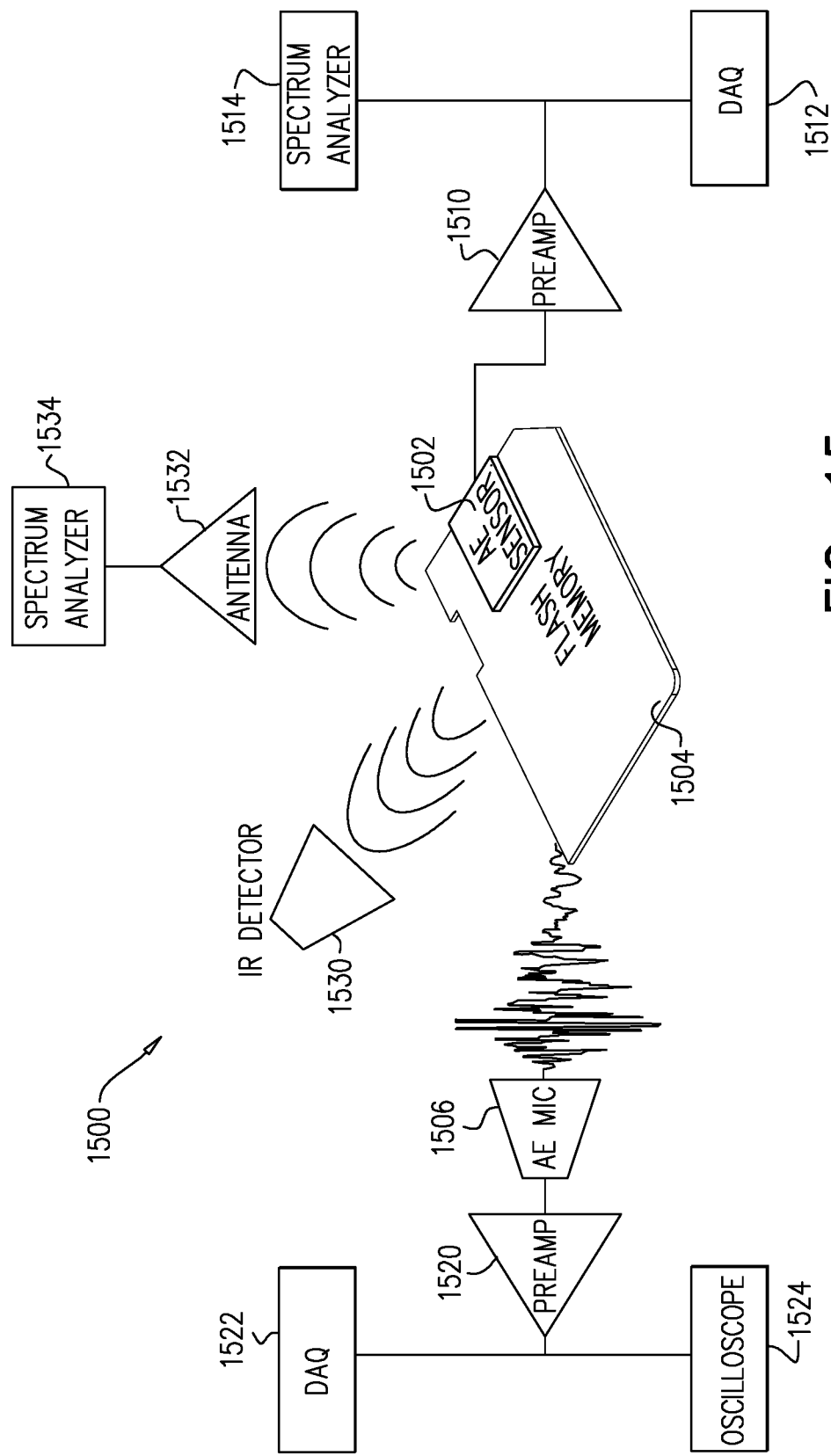
FIG. 15 is a simplified block-diagram illustration showing an acoustic emission monitoring system, constructed and operative in accordance with yet another preferred embodiment of the present invention.

As seen in FIG. 15, there is provided an acoustic emission monitoring system 1500 preferably including at least one acoustic emission sensor, here embodied, by way of example, as a first acoustic emission sensor 1502 preferably in physical contact with a DUT 1504 and a second acoustic emission sensor 1506, preferably not in physical contact with the DUT 1504. In the experiments reported hereinbelow, first acoustic emission sensor 1502 was a R15a ultrasonic sensor manufactured by MISTRAS of NJ, USA and second acoustic emission sensor 1506 was an airborne ultrasonic microphone manufactured by Knowles of IL, USA. First and second acoustic emission sensors 1502 and 1506 were each provided enclosed in a Faraday cage in order to shield them from EM radiation.

Here, DUT 1504 is shown to be embodied as a semiconductor device such as a bare flash memory. First acoustic emission sensor 1502 is preferably connected to a first preamplifier 1510, which first preamplifier 1510 is preferably connected to a first data acquisition unit 1512 and a spectrum analyzer 1514. Second acoustic emission sensor 1506 is preferably connected to a second preamplifier 1520, which second preamplifier 1520 is preferably connected to a second data acquisition unit 1522 and an oscilloscope 1524. In the experiments reported hereinbelow, first and second data acquisition units 1512 and 1522 were NI-6351 data acquisition units, manufactured by National Instruments of Texas, USA. Spectrum analyzer 1514 was an E4402B spectrum analyzer, manufactured by Keysight of California, USA. Oscilloscope 1524 was a mso-x-2014a oscilloscope, manufactured by Agilent, of California, USA.

First and second preamplifiers 1510 and 1520 were each set to a gain of approximately 30-40 dB. The sampling frequency of first and second DAQs 1512 and 1522 was set to 500 kHz. Low pass filters were connected upstream of first and second preamplifiers 1510 and 1520 for signal integrity testing.

Acoustic emission monitoring system 1500 may optionally additionally include an infra-red sensor 1530 for measuring the temperature of DUT 1504 and one or more antennas, here illustrated as a single antenna 1532, for measuring electromagnetic radiation generated by DUT 1504 and/or electronic components thereon. One or more antennas 1532 are preferably connected to a spectrum analyzer module 1534.

It is appreciated that the particular configuration of system 1500 is illustrative only and may readily be modified by one skilled in the art to include a greater or fewer number of components, as exemplified hereinbelow. Furthermore, system 1500 may include alternative components replacing the functionality of the illustrated components. For example, a single acoustic emission sensor rather than two acoustic emission sensors may be included in system 1500, first and second preamplifiers 1510, 1520 may be obviated, the data acquisition units may be replaced by alternative sampling units, oscilloscope 1524 may be replaced by a spectrum analyzer, spectrum analyzer 1514 may be replaced by an oscilloscope having a fast fourier transform function, additional or alternative frequency filters may be included and so forth.

Additionally, although the acoustic emission sensors described as being employed in system 1500 were ultrasound sensors, the monitored acoustic emission may additionally or alternatively be at frequencies lower than ultrasonic frequencies depending on the particular DUT, and appropriate acoustic emission sensors employed accordingly.

It is understood that an acoustic emission monitoring system such as system 1500 may be incorporated within system 100, system 316 or system 416 described hereinabove. Particularly, system 1500 may form a part of a preferred embodiment of at least one acoustic sensor 1506 and signal processing unit 1508 in system 100 of FIG. 1 or of acoustic emission sensing modules 310 and 410 of FIGS. 3 and 4 respectively.

3.1 Acoustic Emission Monitoring of a Bare Flash Memory in Various States, Not Mounted on a PCB.

An experimental set-up generally resembling that shown in FIG. 15 was used to monitor acoustic emission generated by a bare flash memory. The flash memory was connected to a microprocessor mounted on an external PCB. The flash memory under test comprised floating gate MOSFET transistors. It is appreciated that acoustic emission sensor 502 thus directly measured acoustic emission from the flash memory, which acoustic emission is generated by the flash memory itself.

Figure 16A:
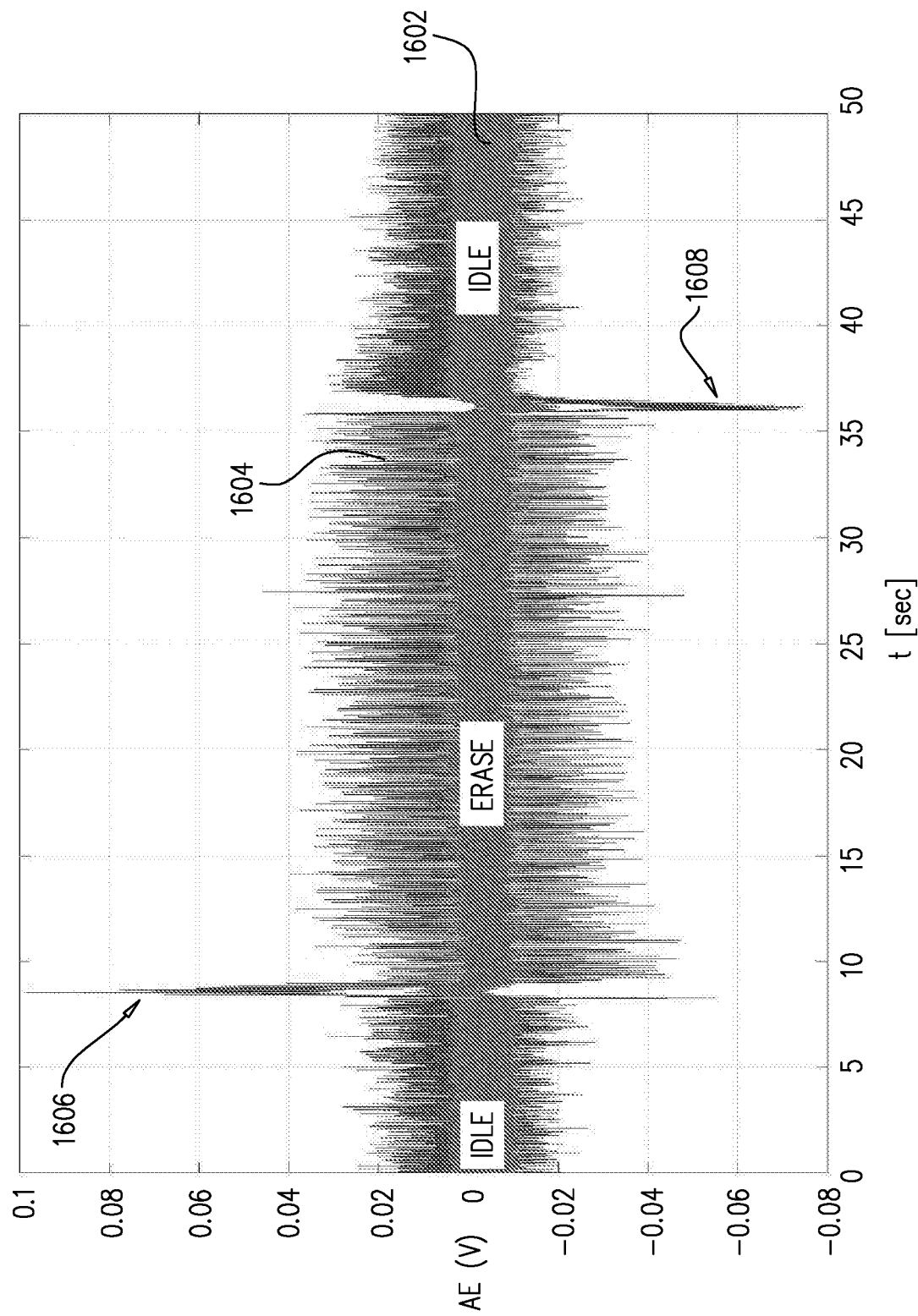
FIGS. 16A and 16B are graphs displaying acoustic emission spectra in the time and frequency domain respectively, arising from a bare flash memory during erase operations, as measured by one physically contacting and one non-physically contacting acoustic emission sensor in a system of the type illustrated in FIG. 15.

Acoustic emission generated by the flash memory during an idle state and an erase state is presented in FIG. 16A, for acoustic emission measurements by both physically contacting sensor 1502 and microphone 1506. At the start of the experiment (t=0) the flash memory was in an idle state. The flash memory was put into an erase state at approximately t=10 and returned to an idle state at approximately t=37, as indicated in FIG. 16A.

In the case of acoustic emission measurements by both of sensors 1502 and 1506, an increase in acoustic emission is seen in the erase state in comparison to the idle state. The increase in acoustic emission during the erase state is believed by the present inventors to be associated with the field tunneling process, involving charge-lattice interactions responsible for the generation of acoustic emission. Furthermore, the duration of the increased emission corresponding to the flash erase state is in accordance with the erase duration provided in the flash specification. Additionally, high acoustic emission variation is seen at regions 1606 and 1608, at times of switching between states, which high variation is believed to be due to voltage settling at these times.

Figure 16B:
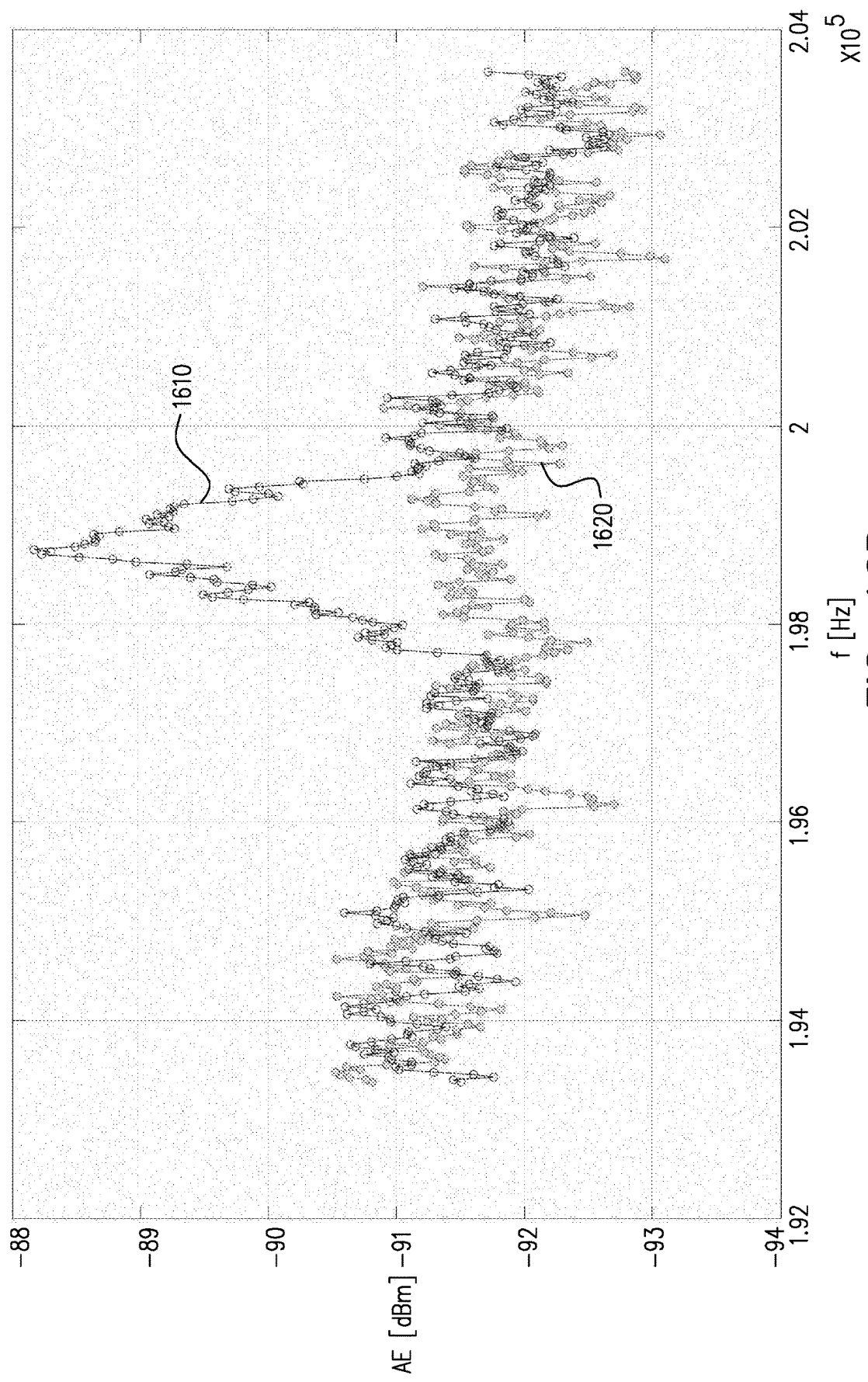

The signal from the spectrum analyzer corresponding to the acoustic emission measured by acoustic emission sensor 1502 is displayed in FIG. 16B. The resolution bandwidth of the spectrum analyzer was 1 kHz. As seen in FIG. 16B, enhance acoustic emission is visible for the active erase state, indicated by a first trace 1610, in comparison the acoustic emission in the idle state, indicated by a second trace 1620.

Figure 16C:
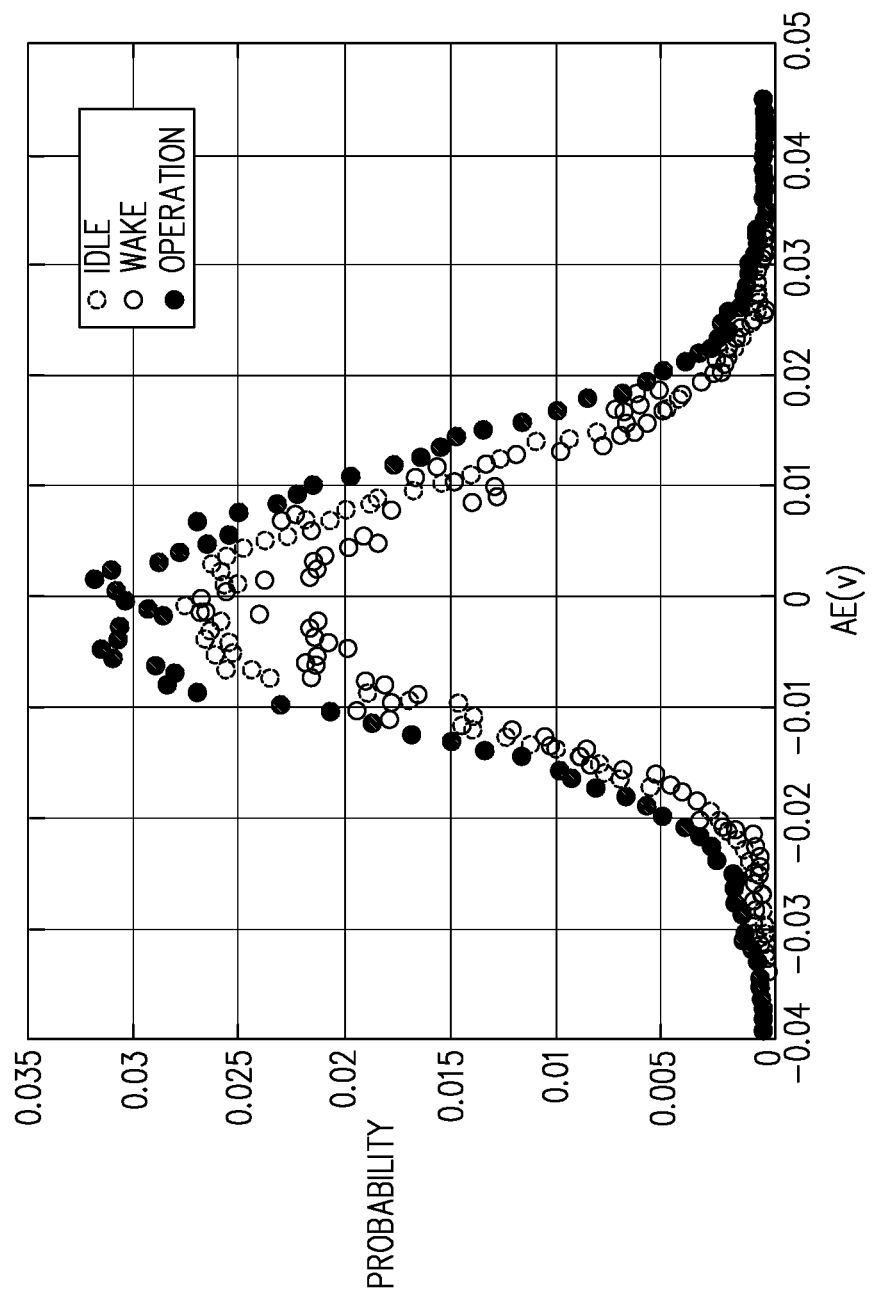
FIG. 16C is a graph displaying statistical features of the data illustrated in FIGS. 16A and 16B.

A probability distribution function reflecting the statistical features of the various operating states of the flash, as measured by the sensor is displayed in FIG. 16C. The probability distribution function illustrates variations in statistical features of the spectra associated with the various operating states, allowing the use of higher order statistical moments as well as cumulants and other statistical measures for differentiating between and identifying various operating states of the device under test and detecting faulty operation and incipient failure thereof.

Figure 16D:
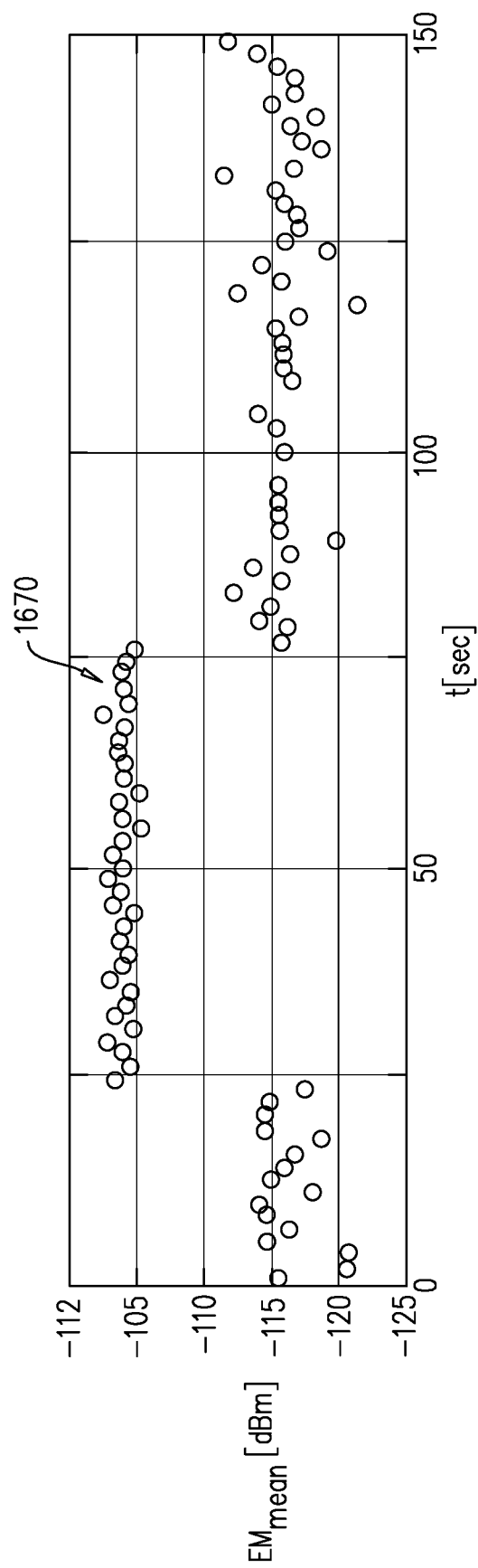
FIGS. 16D and 16E are graphs displaying electromagnetic signals corresponding to the acoustic emission signals displayed in FIGS. 16A and 16B.
Figure 16E:
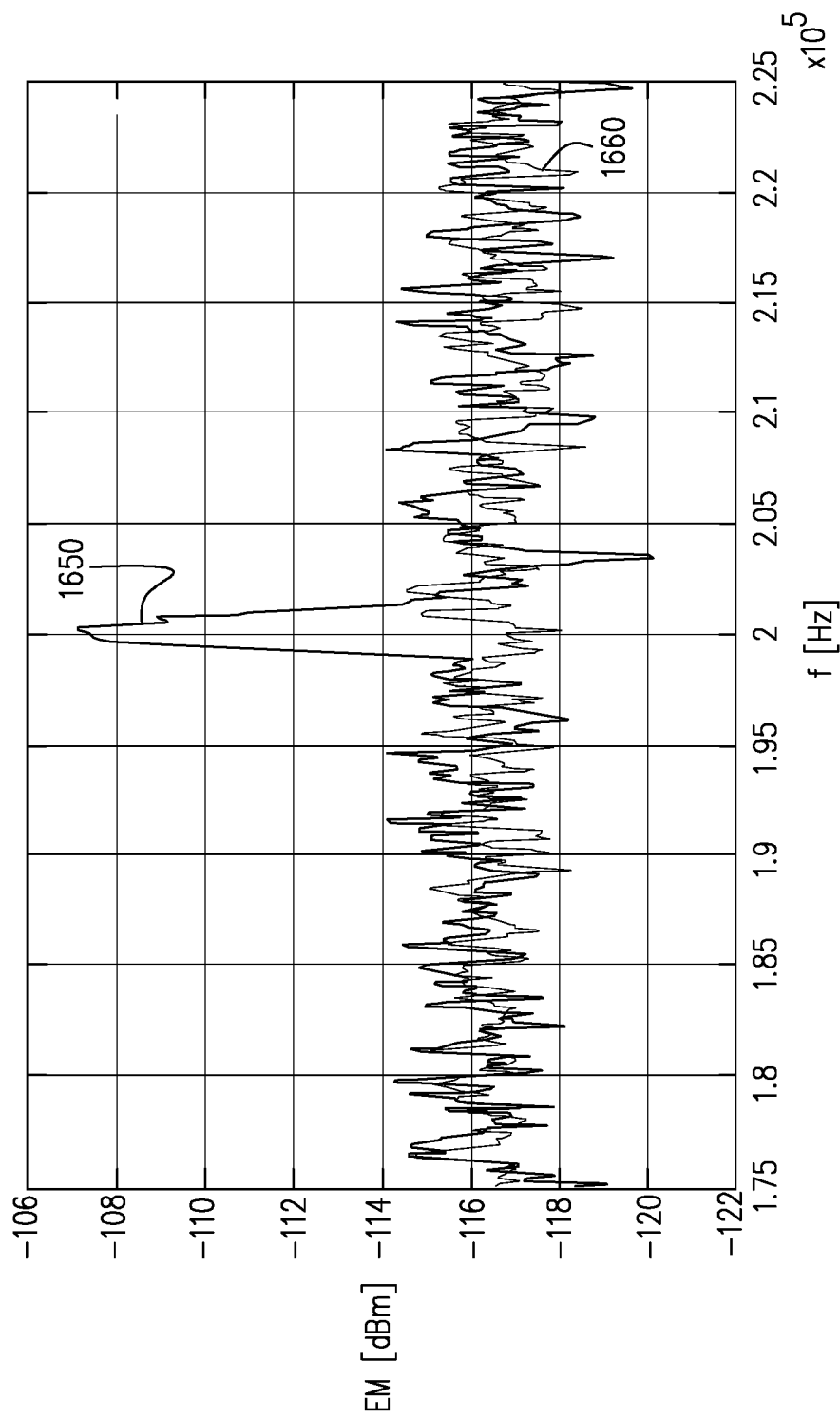

The electromagnetic power generating during various operating states of the flash memory, as measured by passive antenna 1532, is displayed in FIGS. 16D and 16E, showing power in the time and frequency domain respectively. As seen in FIG. 16E, the electromagnetic power generated by the flash memory in an active erase state, as represented by a first trace 1650, is significantly higher than the electromagnetic power generated by the flash memory in an idle state, as represented by a second trace 1660. An increase in electromagnetic power of approximately 8 dBm is seen at a frequency range of about 200 kHz. This frequency range is consistent with the dominant frequency seen in the acoustic emission signature displayed in FIG. 16B, indicating a correlation between features of the electromagnetic emission and the acoustic emission. Furthermore, as seen in a region 1670 of FIG. 16D, which region 1670 corresponds to the active erase state of the flash memory, the electromagnetic power in the time domain is seen to be significantly enhanced during active operation in comparison to the idle state.

The enhancement in electromagnetic radiation in the erase state of the flash memory is believed to be due to electron tunneling within the device, which tunneling generates electromagnetic radiation, in addition to the interaction of electrons with the host lattice producing both electromagnetic and acoustic emission. The correlation between acoustic emission and electromagnetic radiation generated by the flash memory during operation thereof may be used to identify operating states of the flash memory as well as to detect developing faults or failure of the flash memory based on features of both the acoustic and electromagnetic emission.

Acoustic emission measured by sensor 1502 during write operation by the flash is displayed in FIG. 16F and acoustic emission measured by sensor 1502 during read operation by the flash is displayed in FIG. 16G. As seen in FIGS. 16F and 16G at regions 1680 therein, the read and write state switching is accompanied by large fluctuations in acoustic emission. However, the two states may be differentiated by the longer duration of the write state as well as by the higher energy switching of the write state in comparison to the read state.

The unstable signal seen during the read and write states may be attributable to the large drain--source current in these states. Since this current is oriented perpendicular to the direction of measurement, instabilities may be seen in the acoustic emission arising from the current.

Figure 16H:
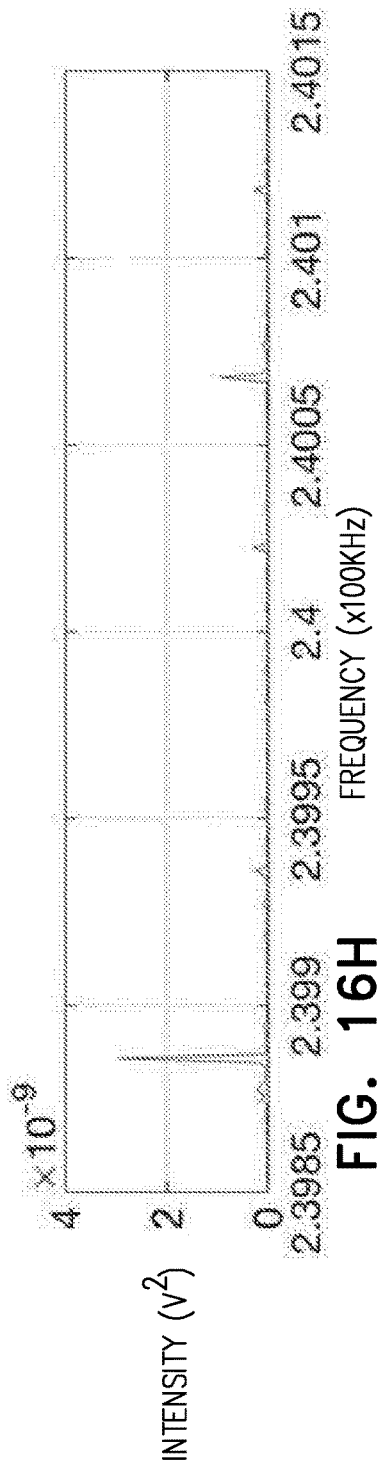
Figure 16I:
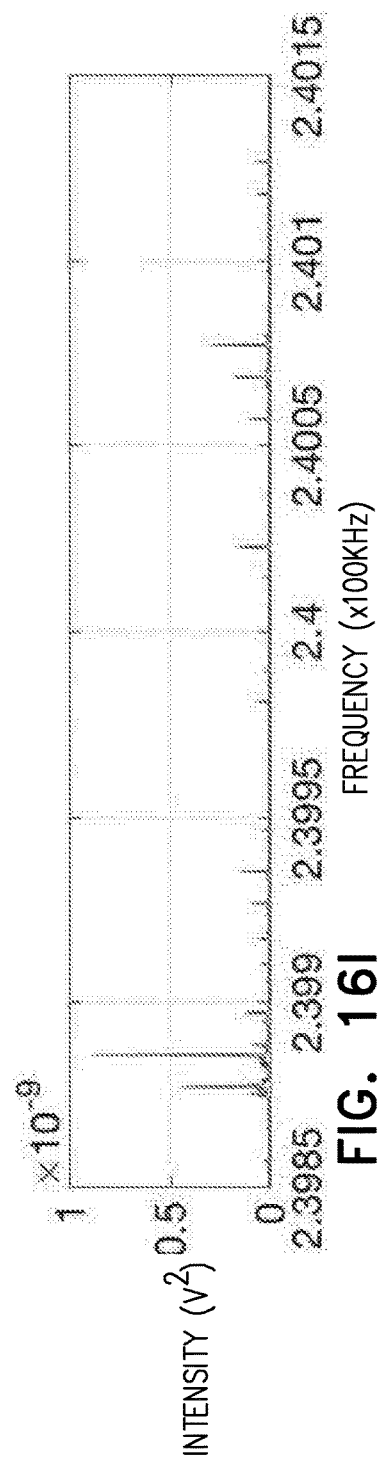
Figure 16J:
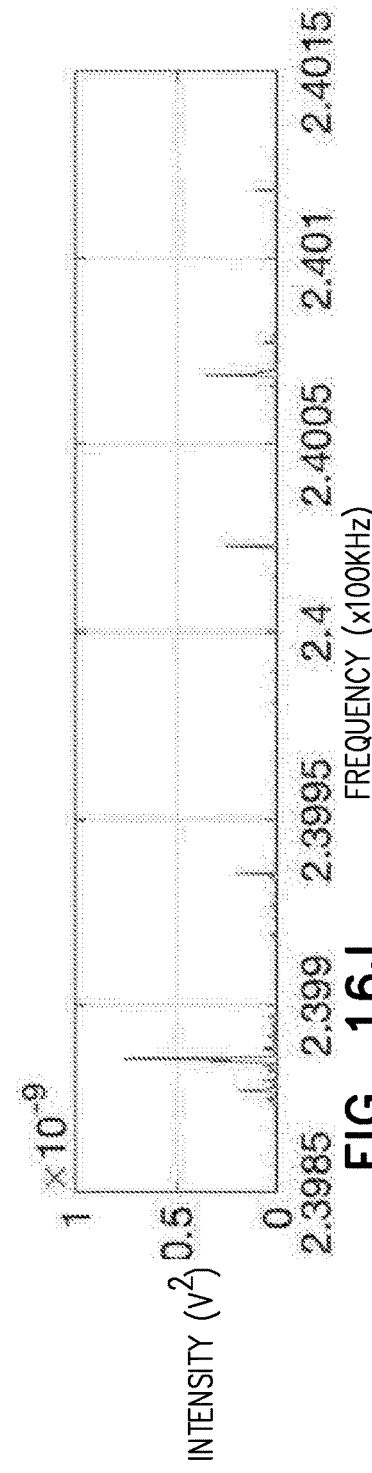
Figure 16K:
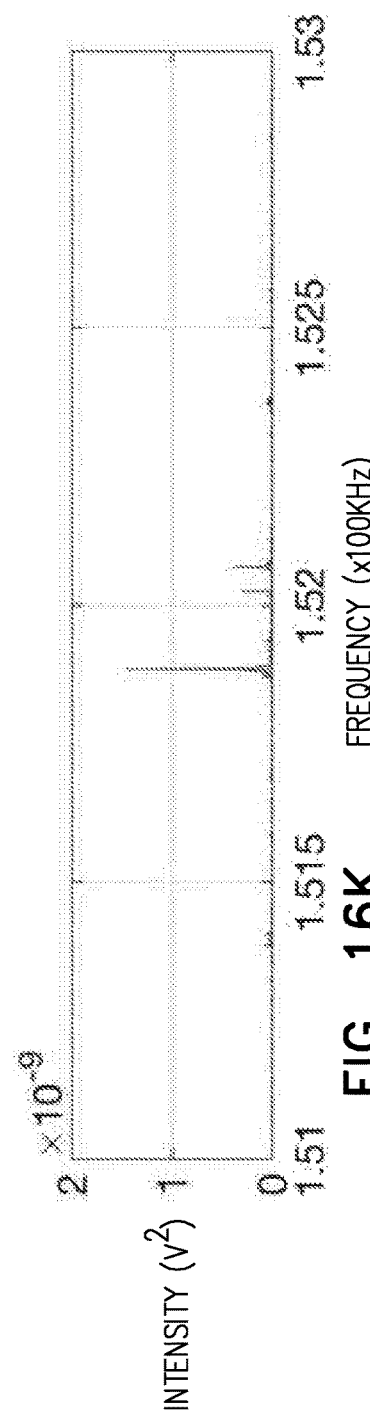
Figure 16L:
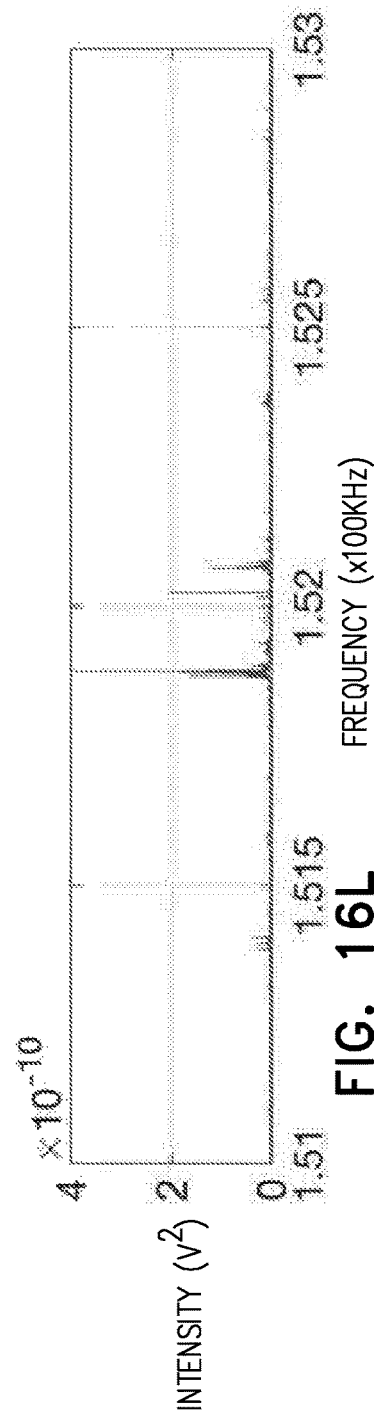
Figure 16M:
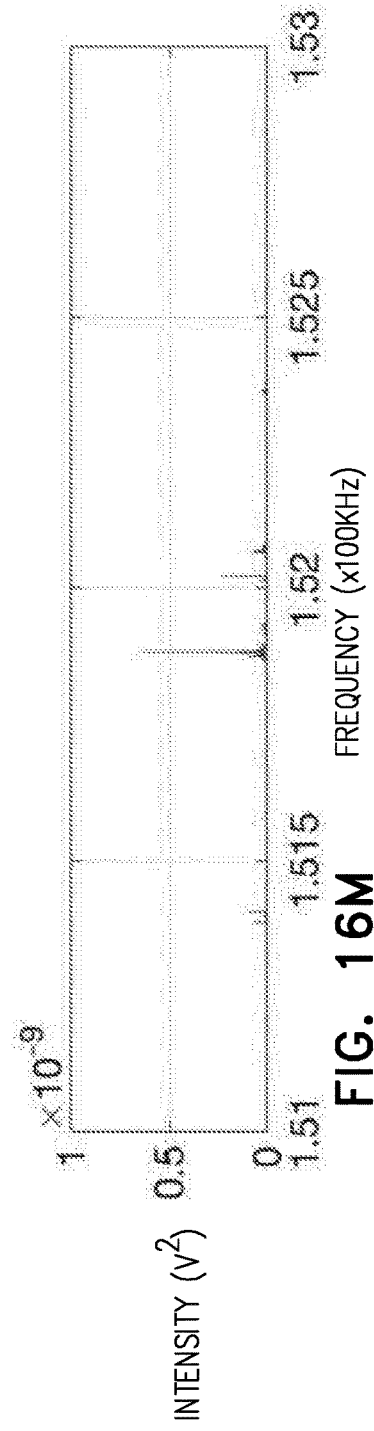

The frequency domain acoustic emission intensity spectra generated by the flash as measured by physically contacting sensor 1502 are displayed in FIGS. 16H, 16I and 16J, respectively displaying the intensity spectra for the flash memory in wakeup, write and idle states. The frequency domain acoustic emission intensity spectra generated by the flash as measured by physically contacting sensor 1502 are displayed in FIGS. 16K, 16L and 16M, respectively displaying the intensity spectra for the flash memory in wakeup, read and idle states. As clear from consideration of FIGS. 16H-16M, the various operating states are distinguished by different acoustic emission signatures having different statistical moments. In particular, the acoustic emission in the write mode is of higher amplitude than the acoustic emission in the read mode. This supports the hypothesis that the acoustic emission arises from the drain-source current, since the drain source current is lower in the read mode than in the write mode.

Figure 16N:
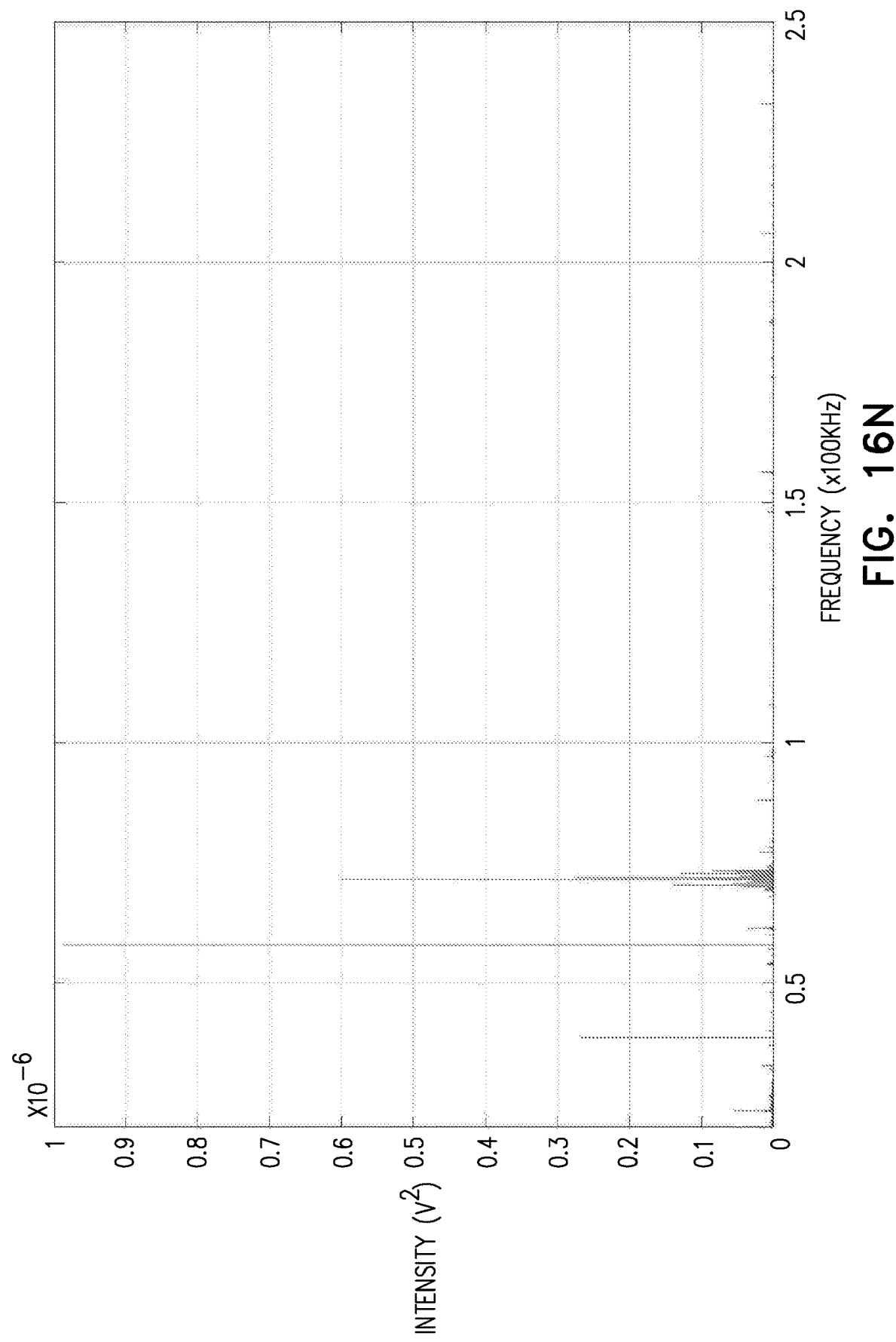
Figure 16O:
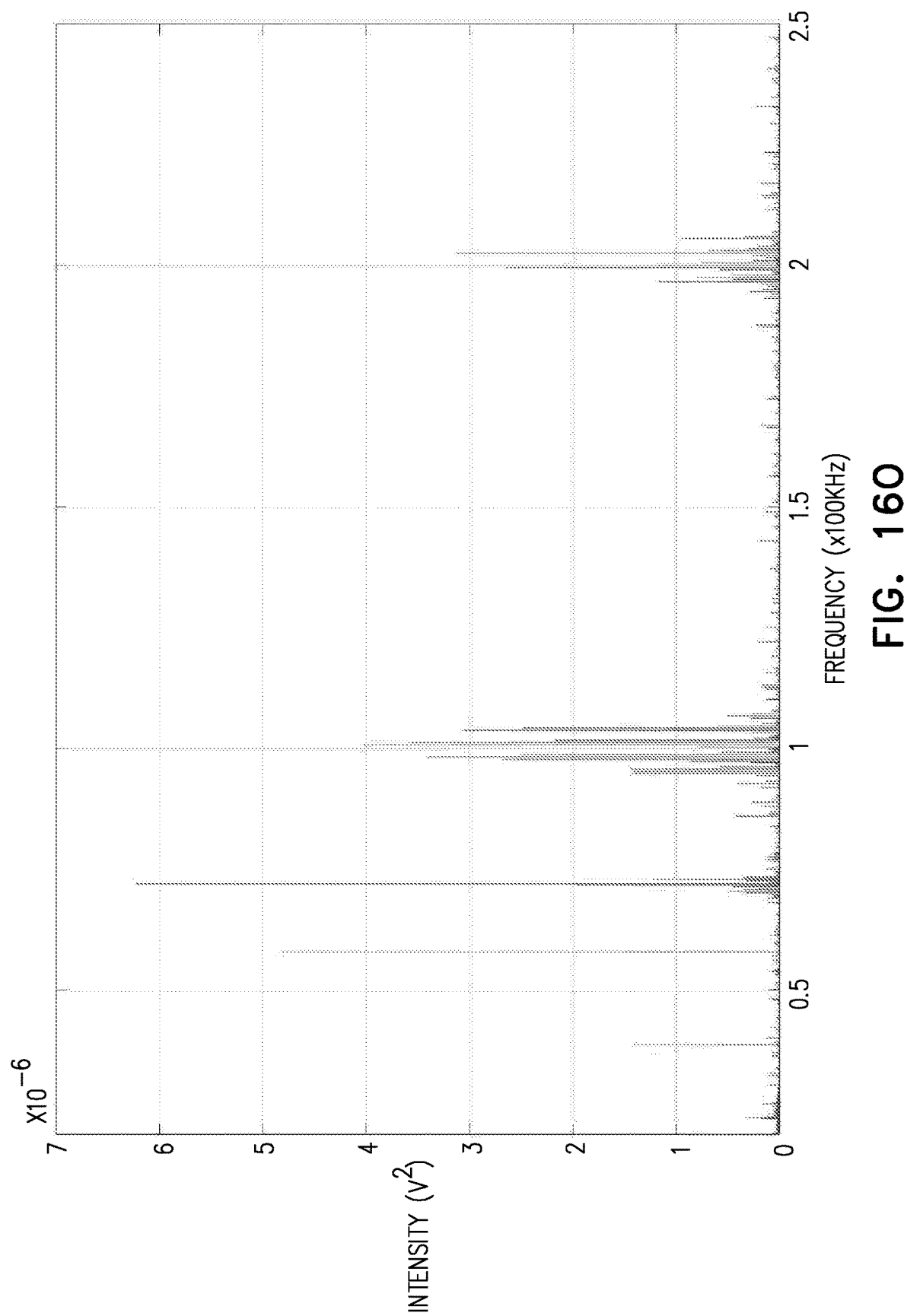
Figure 16P:
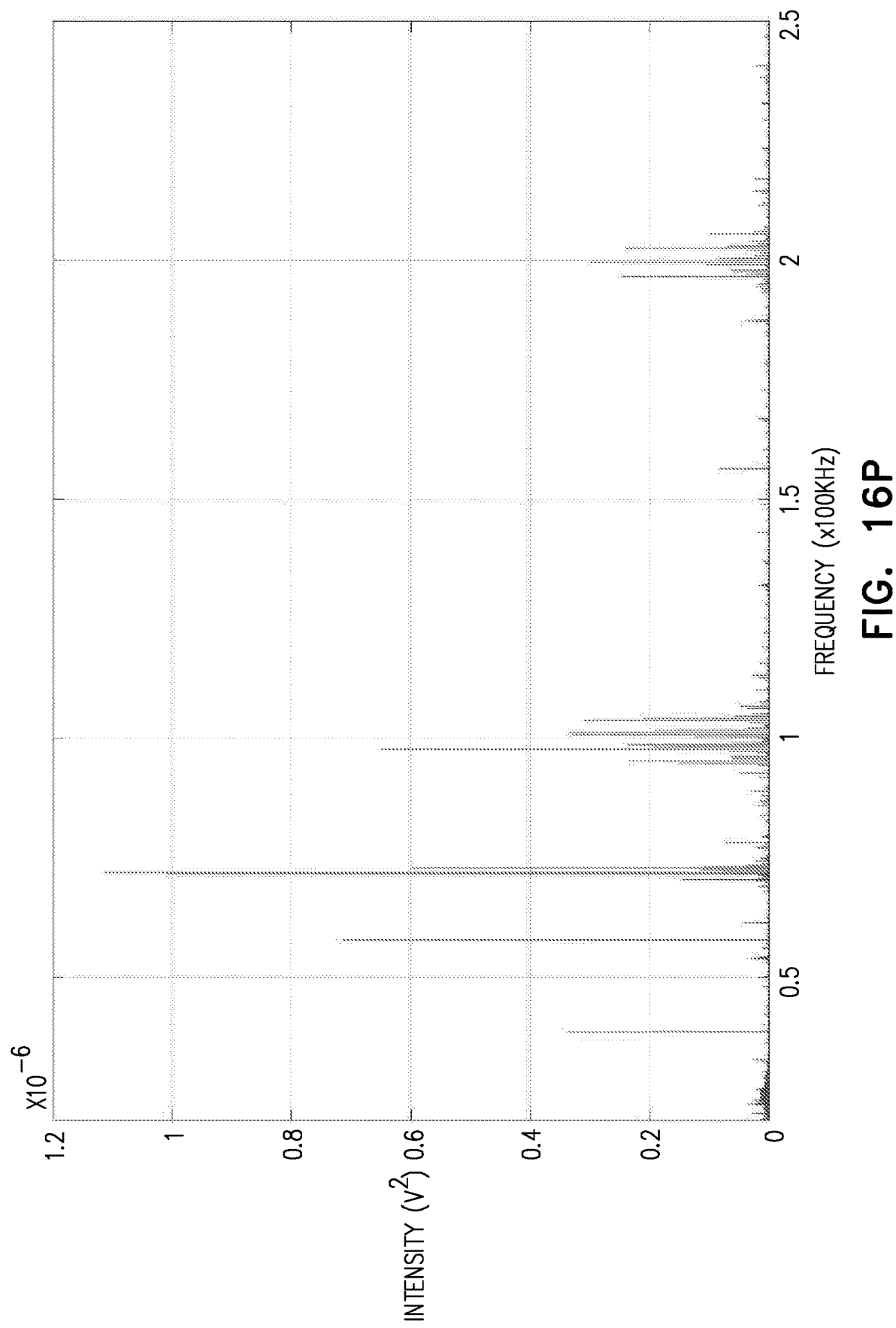

FIGS. 16N, 16O and 16P illustrate acoustic emission intensity in the frequency domain, generated by the flash memory and measured by microphone 1506 for the idle, operative write and wakeup states. As clearly seen in FIGS. 16N-16P, the acoustic emission intensity spectra in the wakeup and operative write states exhibit mutually difference acoustic emission features and signatures, allowing the acoustic emission spectra corresponding to the various operating states of the flash to be readily identified and classified. The high acoustic energy at approximately 100 kHz and 200 kHz seen in FIG. 16O is associated with a line-bit write of approximately 5 microseconds, in accordance with values provided in the flash specification. The 100 kHz and 200 kHz peaks thus may be understood as attributable to drain source current in the flash during the write operation. Side bands at approximately 4 kHz are seen on either side of the 100 kHz and 200 kHz peaks, indicative of page write periods and associated with a page write time of approximately 250 microseconds, which duration is in keeping with values provided in the flash specification. It is noteworthy that a corresponding 200 kHz intensity peak was also found to be present in the acoustic emission sensor 1502 signal for the write operative state, although this is not seen in FIGS. 16H-16J due to the limited bandwidth displayed therein.

Figure 16Q:
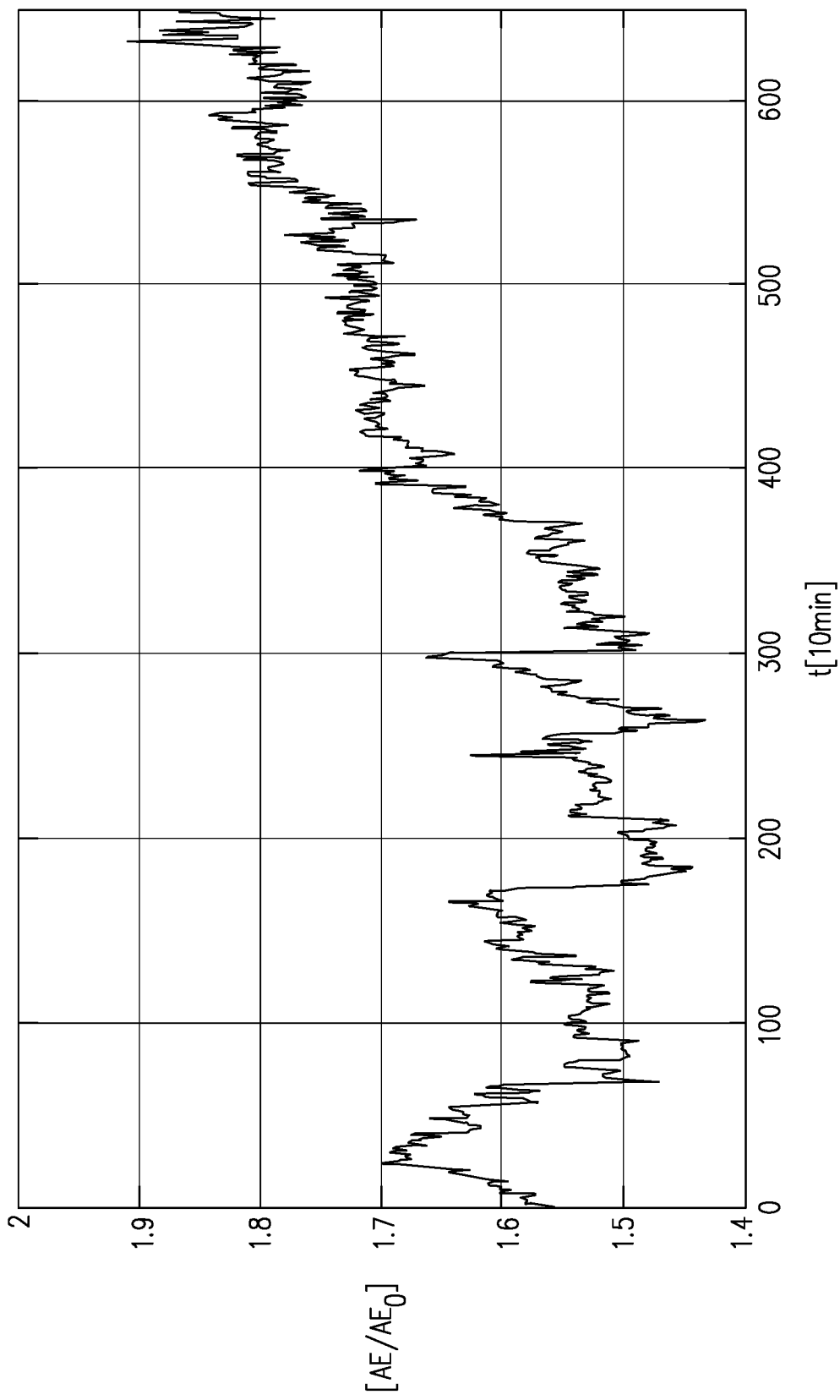
FIG. 16Q is a graph displaying acoustic emission spectra arising from a bare flash memory under electrical stress, as measured by one physically contacting and one non-physically contacting acoustic emission sensor in a system of the type illustrated in FIG. 15.

FIG. 16Q illustrates acoustic emission arising from the flash memory in the case that the flash memory was programmed to work over an infinite loop of write/erase for a specific sector. In this case, measured acoustic emission was passed to a spectrum analyzer, where the spectrum analyzer was configured to measure at a central frequency of 200 kHz, with 10 kHz span and resolution bandwidth of 1 kHz. The measured signal was averaged over the span. It would be expected that the repetitive erase process would create oxide breakdown zones.

The breakdown of oxide zones is a typical defect in flash memories and is responsible for data leakage. As seen in FIG. 16N, acoustic emission is seen to steadily increase over time. The increased acoustic emission may be due to breakdown of oxide zones resulting in reduced junction resistance and hence increased current and acoustic emission. These results indicate that changes to acoustic emission generated by the flash memory or other low-power semiconductor components may be monitored and use to detect electrical stress and electrical faults arising therefrom.

It will be appreciated by persons skilled in the art that the present invention is not limited by what has been particularly claimed hereinbelow. Rather, the scope of the invention includes various combinations and subcombinations of the features described hereinabove as well as modifications and variations thereof as would occur to persons skilled in the art upon reading the forgoing description with reference to the drawings and which are not in the prior art.

The invention claimed is:

1. A system for monitoring and identifying states of a semiconductor device, the system comprising:
    at least one acoustic sensor for sensing acoustic emission emitted by at least one semiconductor device operating at a voltage of less than or equal to 220 V, said acoustic emission being originally generated by said semiconductor device due to internal processes therein and varying in accordance with operating states thereof corresponding to said internal processes, said at least one acoustic sensor generating at least one output signal based on said sensed acoustic emission; and
    a signal processing unit for receiving said at least one signal from said at least one acoustic sensor and for analyzing said at least one output signal, said analyzing comprising analyzing said acoustic emission originally generated by said semiconductor device due to internal processes therein and varying in accordance with operating states thereof corresponding to said internal processes,
    said signal processing unit providing an output based on said analyzing, said output being indicative at least of whether said at least one semiconductor device is in an abnormal operating state with respect to a normal operating state of said semiconductor device, said output further differentiating between different ones of said internal processes within said normal operating state and identifying said abnormal operating state as being a result of malicious interference in said at least one semiconductor device.

2. A system according to claim 1, wherein said normal operating state comprises a healthy state and said abnormal operating state comprises a defective state.

3. A system according to claim 1, wherein said analyzing at least comprises comparing said output signal to at least one predetermined output signal based on acoustic emission.

4. A system according to claim 3, wherein said analyzing at least comprises comparing said output signal to at least one predetermined output signal threshold.

5. A system according to claim 3, wherein said at least one predetermined output signal comprises at least one historical output signal based on historical acoustic emission and corresponding to at least one historical operating state of said semiconductor device.

6. A system according to claim 5, wherein said analyzing comprises machine learning functionality.

7. A system according to claim 6, wherein said machine learning functionality is operative at least to extract features from a training set of historical output signals based on historical acoustic emission sensed from at least one additional electronic device having at least one shared electrical characteristic with said semiconductor device, said features extracted from said training set being associated with corresponding operational states of said at least one additional electronic device, and to identify said operating state of said semiconductor device based on correlations between said features extracted from said training set and features of said output signal.

8. A system according to claim 7, wherein said training set of historical output signals does not include historical output signals from said semiconductor device.

9. A system according to claim 3, wherein said at least one predetermined output signal comprises a collection of historical output signals based on historical acoustic emission sensed from a plurality of electronic devices having at least one shared electrical characteristic with said semiconductor device, said collection of historical output signals corresponding to a collection of historical operating states of said plurality of electronic devices.

10. A system according to claim 1 and also comprising at least one additional sensor measuring at least one additional parameter associated with said at least one semiconductor device, said analyzing comprising comparing said at least one additional parameter to said output signal.

11. A system according to claim 1, wherein said at least one semiconductor device comprises a field effect transistor.

12. A system according to claim 1, wherein said output differentiating between different ones of said internal processes within said normal operating state, comprises said output differentiating between at least one of:
    an active operating state and an interrupt of said semiconductor device; and
    read and write operations of said semiconductor device.

13. A method for monitoring and identifying states of a semiconductor device, the method comprising:
    sensing acoustic emission emitted by at least one semiconductor device operating at a voltage of less than or equal to 220 V, said acoustic emission being originally generated by said semiconductor device due to internal processes therein and varying in accordance with operating states thereof corresponding to said internal processes;
    analyzing said acoustic emission; and
    providing an output based on said analyzing, said output being indicative at least of whether said at least one semiconductor device is in an abnormal operating state with respect to a normal operating state of said semiconductor device, said output further differentiating between different ones of said internal processes within said normal operating state and identifying said abnormal operating state as being a result of malicious interference in said at least one semiconductor device.

14. A method according to claim 13, wherein said normal operating state comprises a healthy state and said abnormal operating state comprises a defective state.

15. A method according to claim 13, wherein said analyzing at least comprises comparing said acoustic emission to at least one predetermined acoustic emission signal.

16. A method according to claim 15, wherein said analyzing at least comprises comparing said acoustic emission to at least one predetermined acoustic emission threshold.

17. A method according to claim 15, wherein said at least one predetermined acoustic emission signal comprises at least one historical acoustic emission signal corresponding to at least one operating state of said semiconductor device.

18. A method according to claim 15, wherein said at least one predetermined acoustic emission signal comprises a collection of historical acoustic emission signals from a plurality of electronic devices having at least one shared electrical characteristic with said semiconductor device, said collection of historical acoustic emission signals corresponding to a collection of historical operating states of said plurality of electronic devices.

19. A method according to claim 13 and also comprising measuring at least one additional parameter associated with said at least one semiconductor device, said analyzing comprising comparing measurements of said at least one additional parameter to said acoustic emission.

20. A method according to claim 13, wherein said output differentiating between different ones of said internal processes within said normal operating state, comprises said output differentiating between at least one of:
   an active operating state and an interrupt of said semiconductor device; and
   read and write operations of said semiconductor device.

21. A system for monitoring and identifying states of a semiconductor device, the system comprising:
   at least one acoustic sensor for sensing acoustic emission emitted by at least one semiconductor device operating at a voltage of less than or equal to 220 V, said acoustic emission being originally generated by said semiconductor device due to internal processes therein and varying in accordance with operating states thereof corresponding to said internal processes, said at least one acoustic sensor generating at least one output signal based on said sensed acoustic emission; and
   a signal processing unit for receiving said at least one signal from said at least one acoustic sensor and for analyzing said at least one output signal, said analyzing comprising analyzing said acoustic emission originally generated by said semiconductor device due to internal processes therein and varying in accordance with operating states thereof corresponding to said internal processes,
   said signal processing unit providing an output based on said analyzing, said output being indicative at least of whether said at least one semiconductor device is in an abnormal operating state with respect to a normal operating state of said semiconductor device, said output further differentiating between different ones of said internal processes within said normal operating state and differentiating between read and write operations of said semiconductor device.

22. A system according to claim 21, wherein said normal operating state comprises a healthy state and said abnormal operating state comprises a defective state.

23. A method for monitoring and identifying states of a semiconductor device, the method comprising:
   sensing acoustic emission emitted by at least one semiconductor device operating at a voltage of less than or equal to 220 V, said acoustic emission being originally generated by said semiconductor device due to internal processes therein and varying in accordance with operating states thereof corresponding to said internal processes;
   analyzing said acoustic emission; and
   providing an output based on said analyzing, said output being indicative at least of whether said at least one semiconductor device is in an abnormal operating state with respect to a normal operating state of said semiconductor device, said output further differentiating between different ones of said internal processes within said normal operating state and differentiating between read and write operations of said semiconductor device.

24. A method according to claim 23, wherein said normal operating state comprises a healthy state and said abnormal operating state comprises a defective state.

* * * * *